(12) United States Patent
Sugi et al.

(10) Patent No.: US 7,109,551 B2
(45) Date of Patent: Sep. 19, 2006

(54) SEMICONDUCTOR DEVICE

(75) Inventors: Akio Sugi, Nagano (JP); Naoto Fujishima, Nagano (JP)

(73) Assignee: Fuji Electric Holdings Co., Ltd., Kawasaki (JP)

(*) Notice: Subject to any disclaimer, the term of this patent is extended or adjusted under 35 U.S.C. 154(b) by 53 days.

(21) Appl. No.: 10/927,434

(22) Filed: Aug. 27, 2004

(65) Prior Publication Data
US 2005/0062101 A1    Mar. 24, 2005

(30) Foreign Application Priority Data
Aug. 29, 2003   (JP)   ............................ 2003-209751

(51) Int. Cl.
*H01L 29/739*   (2006.01)
*H01L 29/78*    (2006.01)

(52) U.S. Cl. .................. 257/330; 257/162; 257/343; 257/370; 257/507; 257/510

(58) Field of Classification Search ............... 257/122, 257/141, 162, 329, 330, 331, 343, 368, 369, 257/370, 372, 507, 510, 514, 515, 517, 571, 257/575
See application file for complete search history.

(56) References Cited

U.S. PATENT DOCUMENTS

| | | | | |
|---|---|---|---|---|
| 5,572,055 A | * | 11/1996 | Sumida | 257/343 |
| 5,796,146 A | * | 8/1998 | Ludikhuize | 257/343 |
| 6,316,807 B1 | * | 11/2001 | Fujishima et al. | 257/333 |
| 6,800,904 B1 | * | 10/2004 | Fujishima et al. | 257/343 |
| 6,858,500 B1 | * | 2/2005 | Sugi et al. | 438/270 |

\* cited by examiner

*Primary Examiner*—T. N. Quach
(74) *Attorney, Agent, or Firm*—Rabin & Berdo P.C.

(57) ABSTRACT

A semiconductor structure with device trench and a semiconductor device in the device trench, that enables realization of high integration, lowered on-resistance, reduction in switching losses and a high operation speed in a semiconductor device provided with a lateral IGBT, and that prevents malfunctions such as latchup when IGBTs or an IGBT and CMOS devices are integrated together. The structure includes an SOI substrate having a supporting substrate, an oxide film and a p⁻-semiconductor layer. An island-like element-forming region is isolated by a trench isolation region from surroundings. The trench isolation region includes an isolation trench with an insulation film on its inner wall. The device trench is formed in the element-forming region. A gate electrode is formed with a gate insulator film in the device trench. A collector region and an emitter region outside are provided respectively on the bottom and the outside of the device trench.

20 Claims, 38 Drawing Sheets

SEMICONDUCTOR DEVICE

BACKGROUND OF THE INVENTION

1. Field of Invention

The invention relates to a semiconductor device. More particularly, the invention relates to an insulated gate semiconductor device with low on-resistance, used for a high breakdown voltage IC to control a large current, such as an IC for a switching power source. The invention also relates to an IC for driving an automotive power system and to an IC for a plasma display panel driver.

2. Prior Art

In recent years, with the rapid spread of portable information appliances and the development of information technology, power ICs containing power MOSFETs are becoming more important. As for a power IC with a lateral power MOSFET and a control circuit thereof being integrated together, expectations are placed on downsizing, lowered power consumption, increased reliability and reduced cost. This is in contrast to a previous arrangement of a combination of a discrete power MOSFET with control and driving circuits. Thus, on the basis of CMOS processes, efforts are being actively carried out to develop high performance lateral power MOSFETs.

Recently, development activity has occurred regarding a trench lateral power MOSFET (hereinafter referred to as "TLPM"), because of its possibilities of further lowering on-resistance and of further increasing a packing density when being integrated into a power IC. Such improvements would be in comparison to on-resistance and packing densities in previous planar type lateral power MOSFETs. The TLPM may be classified into a type that provides a drain contact at a bottom of a trench (hereinafter referred to as "TLPM/D") and a type that provides a source contact at the bottom of the trench (hereinafter referred to as "TLPM/S") (see the Japanese patent publication JP-A-2002-353447, A. Sugi et al., "A 30V Class Extremely Low On-resistance Meshed Trench Lateral Power MOSFET," IEEE IEDM, (US), 2002, Technical Digest, pp. 297–300, and N. Fujishima and 5 others, "A Low On-resistance Trench Lateral Power MOSFET in a 0.6 µm Smart Power Technology for 20–30V Applications," IEEE IEDM, (US), 2002, Technical Digest, pp. 455–458).

Explanations will be made of a previous TLPM/D and a previous TLPM/S. FIG. 36 is a cross-sectional view showing an arrangement of the previous TLPM/D. As shown in FIG. 36, in a p⁻-semiconductor substrate 1, a trench 2 is formed. The trench 2 is filled with a gate insulator film 3, a gate electrode 4, an interlayer insulator film 5 and a buried electrode 6, which are provided from the sidewall of the trench 2 toward the center thereof in the order stated. In the lower half section of the trench 2, an insulator film 7 that is thicker than the gate insulator film 3 is provided for ensuring a withstand voltage.

The lower half section of the trench 2 is surrounded by an n⁻-extended drain region 8. Under the bottom of the trench 2 in the n⁻-extended drain region 8, an n⁺-drain region 9 is provided. The buried electrode 6 is electrically connected to the n⁺-drain region 9 at the bottom of the trench 2. Outside of the upper half section of the trench 2 is a p-base region 10.

Close outside the trench 2, in the upper section of the p-base region 10, an n⁺-source region 11 is provided. In the upper section of the p-base region 10, a p⁺-plug region 12 is provided. To the top end of the buried electrode 6, a drain electrode 13 is electrically connected. A source electrode 14 penetrates through an interlayer insulator film 15 so as to electrically connect to both the n⁺-source region 11 and the p⁺-plug region 12 on the surface of the substrate 1.

FIG. 37 is a cross-sectional view showing an arrangement of the previous TLPM/S. As shown in FIG. 37, a trench 2, formed in a p⁻semiconductor substrate 1, is filled with a gate insulator film 3, a gate electrode 4, an interlayer insulator film 5 and a buried electrode 6, which are provided from the sidewall of the trench 2 toward the center thereof in the order stated. Close outside the upper half section of the trench 2, an insulator film 7 that is thicker than the gate insulator film 3 is provided for ensuring a withstand voltage.

The lower half section of the trench 2 is surrounded by a p-base region 10. Under the bottom of the trench 2 in the p-base region 10, an n⁺-source region 11 is provided. The buried electrode 6 is electrically connected to the n⁺-source region 11 at the bottom of the trench 2. Outside the upper half section of the trench 2 is an n⁻-extended drain region 8.

In the n⁻-extended drain region 8, an n⁺-drain region 9 is provided. A drain electrode 13, penetrating through an interlayer insulator film 15 and an interlayer insulator film 16 on the film 15, is electrically connected to the n⁺-drain region 9 on the surface of the substrate 1. A source electrode 14, penetrating through the interlayer insulator film 16, is electrically connected to the top end of the buried electrode 6.

In a MOSFET, lower on-resistance per unit area generally is desirable. A channel width per unit area (hereinafter referred to as a channel density) is an important parameter for determining the on-resistance per unit area and is inversely proportional to the device pitch of the MOSFET. In either of the TLPM's shown in FIGS. 36 and 37, a transistor is formed on the sidewall of the trench 2, which brings the device pitch to on the order of half that of a previous planar power MOSFET. Therefore, in the TLPM, the channel density becomes about twice as great as that of the previous planar power MOSFET, thereby to reduce the on-resistance by half.

A MOSFET, however, is a monopolar device that is operated by majority carriers. A current flows only on the surface of the device. Therefore, reduction in the on-resistance per unit area still has possibilities for improvement. Moreover, when the MOSFETs are mounted in a power IC, the elements are to be isolated from one another by the junction isolation technique. Therefore, integration of the TLPM and a CMOS device for controlling the TLPM has a possibility of causing latchup due to interaction between transistors.

Therefore, an arrangement is proposed in which an insulated gate bipolar transistor (hereinafter referred to as an IGBT) is used instead of the MOSFET to isolate the elements from one another by a dielectric isolation technique. An IGBT, being a bipolar device, has an advantage of allowing on-resistance to be lowered by applying conduction modulation. The applicant has previously filed an application for a patent concerning a planar lateral IGBT to which SOI (Silicon-on-insulator) technology is applied (see Japanese patent publication JP-A-6-151576, for example).

FIG. 38 is a cross-sectional view showing an arrangement of a previous planar lateral IGBT. As shown in FIG. 38, an n-single-crystal silicon semiconductor layer 21 is layered on an oxide film 23 provided on the surface of a supporting substrate 22. In the silicon semiconductor layer 21, an element-forming region 24 is formed like an island while being isolated by a trench isolation region 25. The trench isolation region 25 is formed by an isolation trench 26 penetrating through the silicon semiconductor layer 21 to reach the oxide film 23, a dielectric film 27 provided on the inside face of the isolation trench 26 and polysilicon 28 filling the inside of the dielectric film 27.

In the element-forming region 24, on the surface layer of the silicon semiconductor 21, an n⁻-drift region 29 is provided. In the n⁻-drift region 29, a p⁺-collector region 30 is provided. Moreover, in the element-forming region 24, on the surface layer of the silicon semiconductor 21, a p-base region 31 is provided apart from the n⁺-drift region 29. In the p-base region 31, an n⁺-emitter region 32 and a p⁺-base region 33 are provided.

On the surface of the silicon semiconductor layer 21 between the n⁺-emitter region 32 and the n⁻-drift region 29, a gate electrode 35 is provided, with a gate insulator film 34 thereunder. To the p⁺-collector region 30, a collector electrode 36 is electrically connected. To both of the n⁺-emitter region 32 and the p⁺-base region 33, an emitter electrode 37 is electrically connected.

The on-resistance of the planar lateral IGBT shown in FIG. 38, being brought to one fourth that of a planar lateral MOSFET of the same device size, is to be reduced to a half the on-resistance of the TLPM shown in FIG. 36 or FIG. 37. Moreover, an SOI (silicon on insulator) structure, by which the supporting substrate 22 and elements are isolated, can prevent a substrate current. This makes it possible to reduce switching losses and to enhance an operation speed. Furthermore, the introduction of the dielectric isolation technique can eliminate interaction between the IGBT and transistors when IGBTs, or an IGBT and a CMOS, are integrated with each other. This makes it possible to eliminate latchup due to a parasitic thyristor.

In the previous planar lateral IGBT, however, the drift region, being formed laterally, namely, in the direction perpendicular to that of the device thickness, must be extended laterally for enhancing the breakdown voltage. This prevents the IGBT from being highly integrated. Moreover, there also arises a problem that the laterally extended drift region causes an increase in the device pitch, which in turn results in an increase in on-resistance.

Objects and Summary of the Invention

The invention was made in view of the above problems with an object of providing a semiconductor device provided with a trench lateral IGBT (hereinafter referred to as a TL-IGBT) having a small device pitch by which the IGBT can be highly integrated. Moreover, it is also an object of the invention to eliminate the substrate current of the TL-IGBT in a semiconductor device provided with the TL-IGBT, to enable realization of a reduction in switching losses and a high operation speed.

A further object of the invention to reduce on-resistance in the semiconductor device provided with the TL-IGBT to be less than those in a TLPM and a planar lateral IGBT. In addition, it is an object of the invention to prevent latchup in a semiconductor device in which the TL-IGBTs are integrated together, or to prevent malfunctions due to interaction between transistors in a semiconductor device in which the TL-IGBT and elements such as CMOS devices are integrated together.

In order to achieve the above objectives, a semiconductor device according to a first embodiment of the invention includes a collector region of a first conductivity type provided on the underside of a bottom of a trench formed in a semiconductor layer. An emitter region of a second conductivity type is provided on the outside of the trench in a surface layer of the semiconductor layer. A base region of the first conductivity type is provided between the emitter region and the collector region. A drift region of the second conductivity type is provided between the base region and the collector region. A gate insulator film is provided on the inside of the trench. A gate electrode is provided on the inside of the gate insulator film. An interlayer insulator film is provided on the inside of the gate electrode. A buried electrode is provided on the inside of the interlayer insulator film and electrically connected to the collector region at the bottom of the trench. A collector electrode is electrically connected to the buried electrode. An emitter electrode is electrically connected to both of the emitter region and the base region.

In the this embodiment, the semiconductor device may have an arrangement further including an insulator film thicker than the gate insulator film in a lower half section of the trench. Alternatively, it may have an arrangement that including a buffer region of the second conductivity type surrounding the collector region. The semiconductor device may be formed in an element-forming region isolated from surroundings by a trench isolation region in which a conductive material fills an isolation trench with an insulator film provided at the trench boundary, the isolation trench penetrating through the semiconductor layer. The semiconductor layer may be made of a silicon semiconductor layered on an insulation layer.

The semiconductor device according to the first embodiment is provided with a TL-IGBT having a gate electrode in the trench formed in the semiconductor substrate, and having a current path near the sidewall or the bottom of the trench. Further, in the semiconductor device according to this embodiment, the TL-IGBT is formed on an SOI substrate.

Also to achieve the above objectives, a semiconductor device according to a second embodiment includes an emitter region of a second conductivity type provided on the underside of a bottom of a trench formed in a semiconductor layer. A collector region of a first conductivity type is provided on the outside of the trench in a surface layer of the semiconductor layer. A base region of the first conductivity type is provided between the emitter region and the collector region. A drift region of the second conductivity type is provided between the base region and the collector region. A gate insulator film is provided on the inside of the trench. A gate electrode is provided on the inside of the gate insulator film. An interlayer insulator film is provided on the inside of the gate electrode. A buried electrode, provided on the inside of the interlayer insulator film, is electrically connected to the emitter region at the bottom of the trench. An emitter electrode is electrically connected to the buried electrode. A collector electrode is electrically connected to the collector region.

In the second embodiment, the semiconductor device may have an arrangement that also includes an insulator film thicker than the gate insulator film in an upper half section of the trench, and/or it may have an arrangement that includes a buffer region of the second conductivity type surrounding the collector region. Moreover, the semiconductor device may be formed in an element-forming region isolated from its surroundings by a trench isolation region in which a conductive material fills an isolation trench with an insulator film provided between the conductive material and the surroundings. The isolation trench penetrates through the semiconductor layer. The semiconductor layer may be made of a silicon semiconductor layered on an insulation layer.

More specifically according to the second embodiment, a semiconductor device is obtained which is provided with the TL-IGBT having the gate electrode in the trench formed in the semiconductor substrate, and having a current path near the sidewall or the bottom of the trench. Further, a semiconductor device is obtained in which the TL-IGBT is formed on an SOI substrate.

Moreover, in order to achieve the above objectives, the semiconductor device according to a third embodiment has a silicon semiconductor layer layered on an insulation layer, with the silicon layer being divided into a plurality of element-forming regions. The element-forming regions are isolated from each other by dielectric isolation with a trench isolation region in which a conductive material fills an isolation trench with an insulator film. The isolation trench penetrates through the semiconductor layer. In a first of the element-forming regions, the semiconductor device according to the first embodiment is formed. In a second of the element-forming regions, the semiconductor device according to the first embodiment with a conductivity type different from that of the semiconductor device formed in the first element-forming region is formed. Alternatively, a semiconductor device according to the first embodiment and a semiconductor device according to the second embodiment may be formed, respectively, in the first element-forming region and the second element-forming region, which are isolated from each other by dielectric isolation. As another alternative, the respective semiconductor devices formed in the first element-forming region and the second element-forming region may be the semiconductor devices according to the second embodiment, with conductivity types being different from each other.

More specifically according to the third embodiment, a semiconductor device is obtained with an arrangement in which the TL-IGBTs are integrated together, with each being isolated from others by a dielectric isolation technique.

Furthermore, in order to achieve the above objectives, according to the semiconductor device of a fourth embodiment, a silicon semiconductor layer layered on an insulation layer is divided into a plurality of element-forming regions isolated from each other by dielectric isolation with a trench isolation region in which a conductive material fills an isolation trench, with an insulator film provided at the trench boundary, the isolation trench penetrating through the semiconductor layer. In a first of a plurality of the element-forming regions, the semiconductor device according to the first or the second embodiment is formed, and in a second of the element-forming regions, one or both of a planar p-channel MOSFET and a planar n-channel MOSFET are formed for controlling the semiconductor device formed in the first element-forming region. In the fourth embodiment, the p-channel MOSFET and the n-channel MOSFET may be formed in their respective different element-forming regions, isolated from each other by dielectric isolation. Also, according to the fourth embodiment, a semiconductor device is obtained with an arrangement in which the TL-IGBT and CMOS devices are integrated together with each being isolated from others by dielectric isolation.

DETAIL DESCRIPTION OF THE PREFERRED EMBODIMENTS

In the following, embodiments of the invention will be explained in detail in terms of modes for carrying out the invention, with reference to drawings.

First Mode

Figure 1:
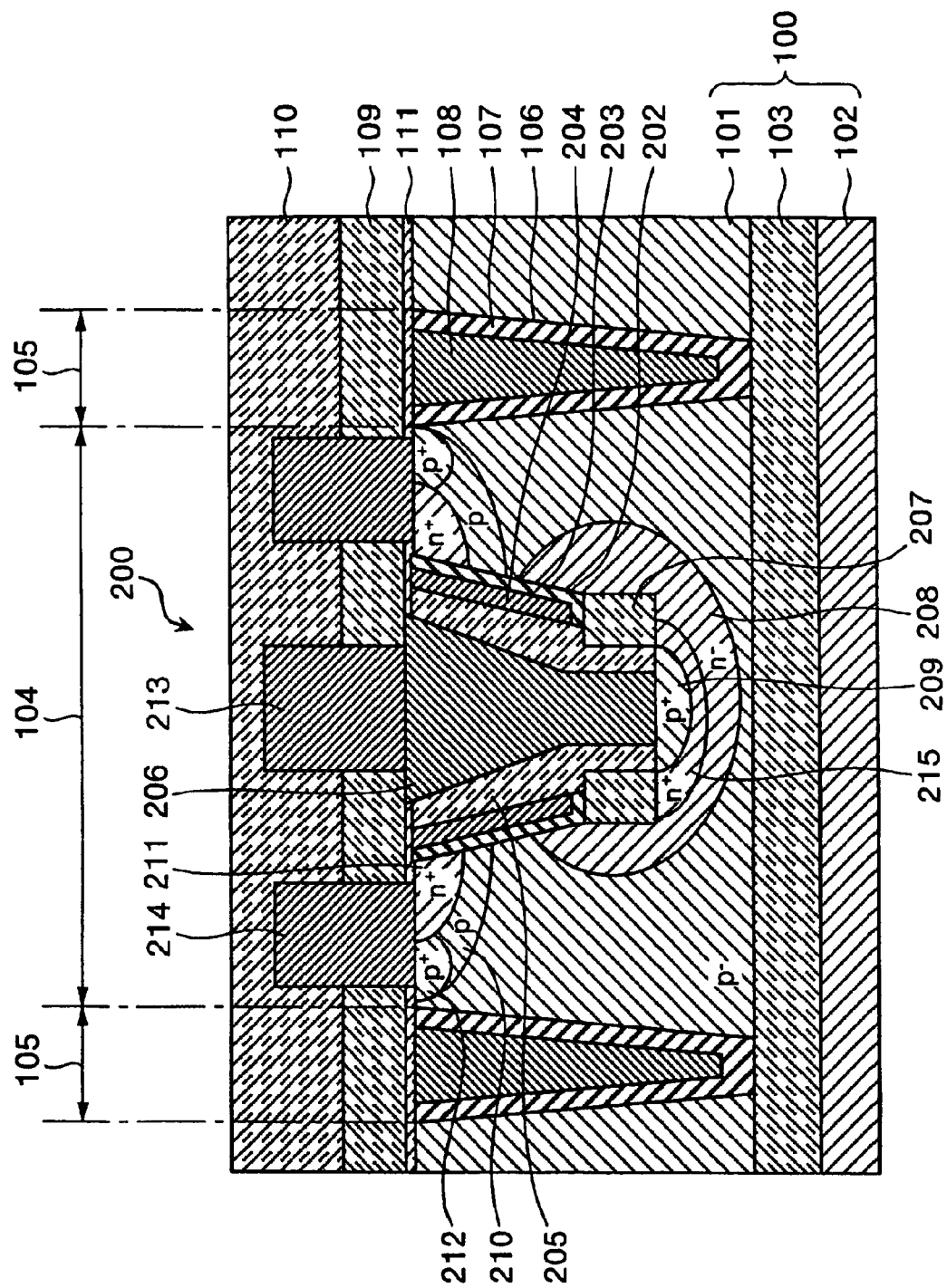
FIG. 1 is a cross-sectional view showing an arrangement of a semiconductor device according to the first mode for carrying out the invention.

FIG. 1 is a cross-sectional view showing an arrangement of a semiconductor device according to a first mode for carrying out the invention. The semiconductor device of the first mode is a TL-IGBT provided with a collector contact at the bottom of a trench (hereinafter referred to as a TL-IGBT/C). As shown in FIG. 1, the TL-IGBT/C 200 is formed on an SOI substrate 100 with a structure in which a $p^-$-single-crystal silicon semiconductor layer (hereinafter referred to as a $p^-$-semiconductor layer) 101 is formed on an oxide film 103 provided as an insulator layer on the surface of a semiconductor supporting substrate (hereinafter referred to as a supporting substrate) 102.

In the $p^-$-semiconductor layer 101, an element-forming region 104 is formed like an island while being isolated by a trench isolation region 105. The trench isolation region 105 is formed by an isolation trench 106 penetrating through the $p^-$-semiconductor layer 101 to reach the oxide film 103, an insulator film 107 provided on the inside face of the isolation trench 106 and polysilicon 108 as a conductor filling the inside of the insulator film 107. Alternatively, the isolation trench 106 may be filled by only insulator film 107. This alternative applies as well to the below-described modes 2–7.

The TL-IGBT/C 200 is formed in the element-forming region 104. The TL-IGBT/C 200 is provided with a gate insulator film 203, a gate electrode 204, a first interlayer insulator film 205, a buried electrode 206, and a second interlayer insulator film 207. The TL-IGBT/C 200 also is provided with an $n^-$-drift region 208, an $n^+$-buffer region 215, a $p^+$-collector region 209, a p-base region 210, an $n^+$-emitter region 211, a $p^+$-plug region 212, a collector electrode 213, an emitter electrode 214, a third interlayer insulator film 109 and a passivation film 110.

In the element-forming region 104, in the $p^-$-semiconductor layer 101, a trench 202 is formed. The gate insulator layer 203 is provided in the upper half section of the sidewall of the trench 202. The gate electrode 204 is provided inside the gate insulator layer 203. In the lower half section of the trench 202, there is provided the second interlayer insulator film 207, which is thicker than the gate insulator film 203 for ensuring a withstand voltage.

Inside the gate electrode 204 and the second interlayer insulator film 207, the first interlayer insulator film 205 is provided. The buried electrode 206 is provided inside the first interlayer insulator film 205. The trench 202 is filled with the gate insulator film 203, the gate electrode 204, the second interlayer insulator film 207, the first interlayer insulator film 205 and the buried electrode 206.

The lower half section of the trench 202 is surrounded by the $n^-$-drift region 208. Under the bottom of the trench 202 in the $n^-$-drift region 208, an $n^+$-buffer region 215 is provided. The $p^+$-collect or region 209 is provided on the bottom of the trench 202 in the $n^+$-buffer region 215. The buried electrode 206 is electrically connected to the $p^+$-collector region 209 at the bottom of the trench 202.

The outside of the upper half section of the trench 202 becomes the p-base region 210. The $n^+$-emitter region 211 is provided close outside the trench 202 in the p-base region 210. Namely, the p-base region 210 is provided between the $n^+$-emitter region 211 and the $n^-$-drift region 208. The $p^+$-plug region 212 is provided outside the $n^+$-emitter region 211 in the p-base region 210.

The collector electrode 213 penetrates through the third interlayer insulator film into electrical connection with the top end of the buried electrode 206. Moreover, the emitter electrode 214 penetrate through the third interlayer insulator film 109 and an oxide film 111 on the surface of the SOI substrate 100, into electrical connection with both the n+-emitter region 211 and the p+-plug region 212. The electrodes 213 and 214 are covered with the passivation film 110.

Figure 2:
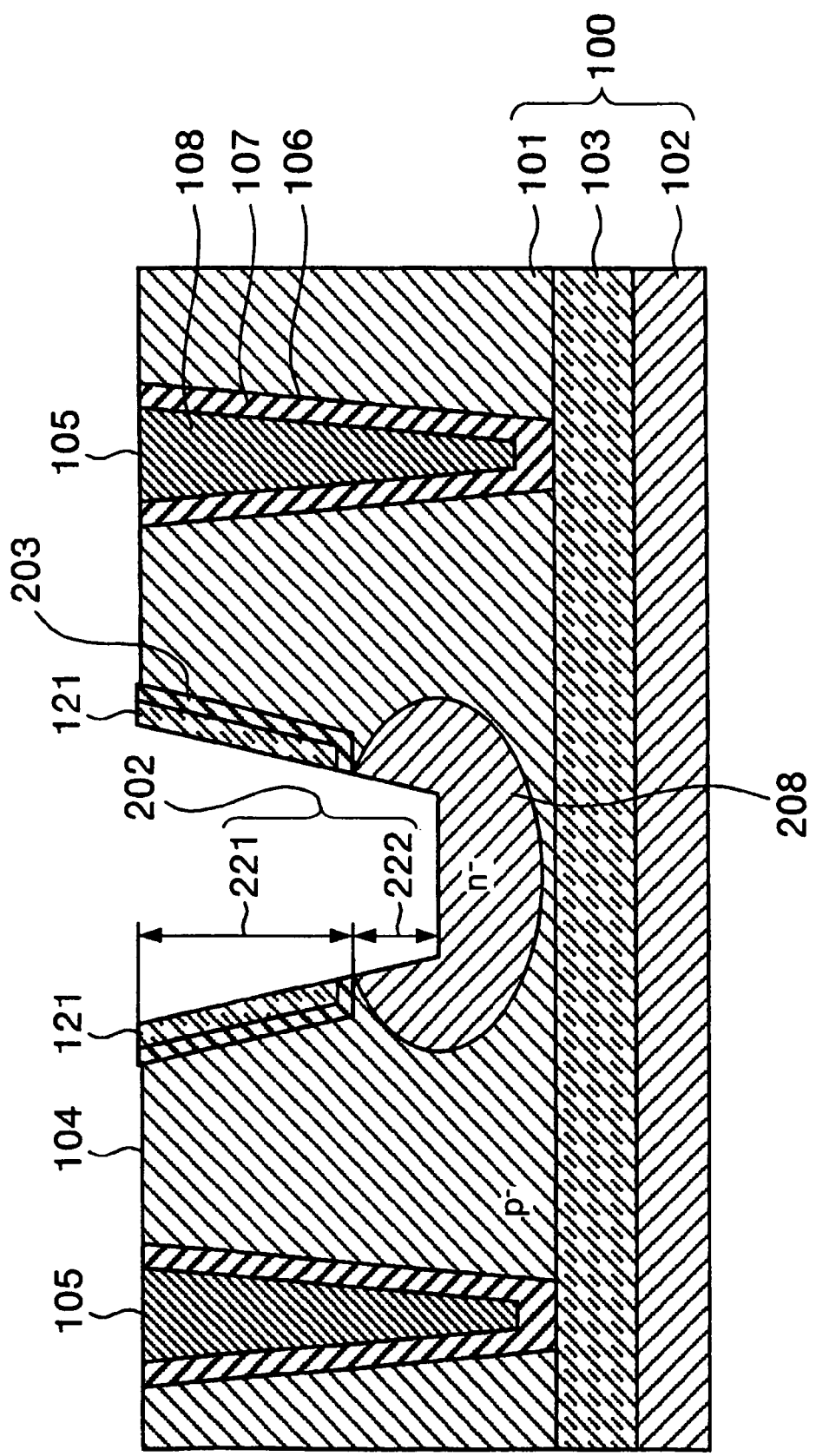
FIG. 2 is a cross-sectional view showing a state of the semiconductor device according to the first mode for carrying out the invention in a process step in the course of manufacturing.
Figure 3:
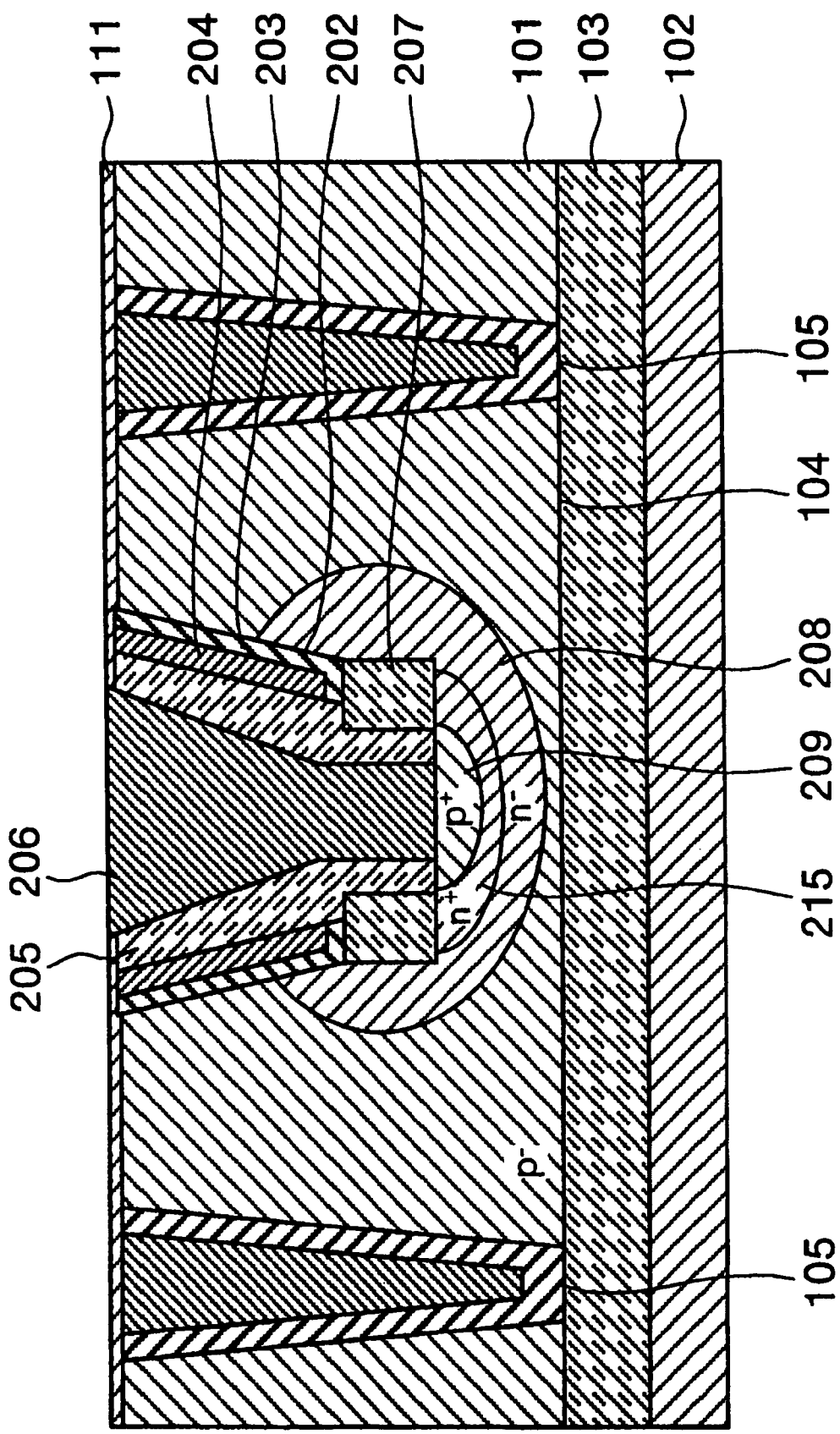
FIG. 3 is a cross-sectional view showing a state of the semiconductor device according to the first mode in the process step subsequent to the step of the state shown in FIG. 2 in the course of manufacturing.
Figure 4:
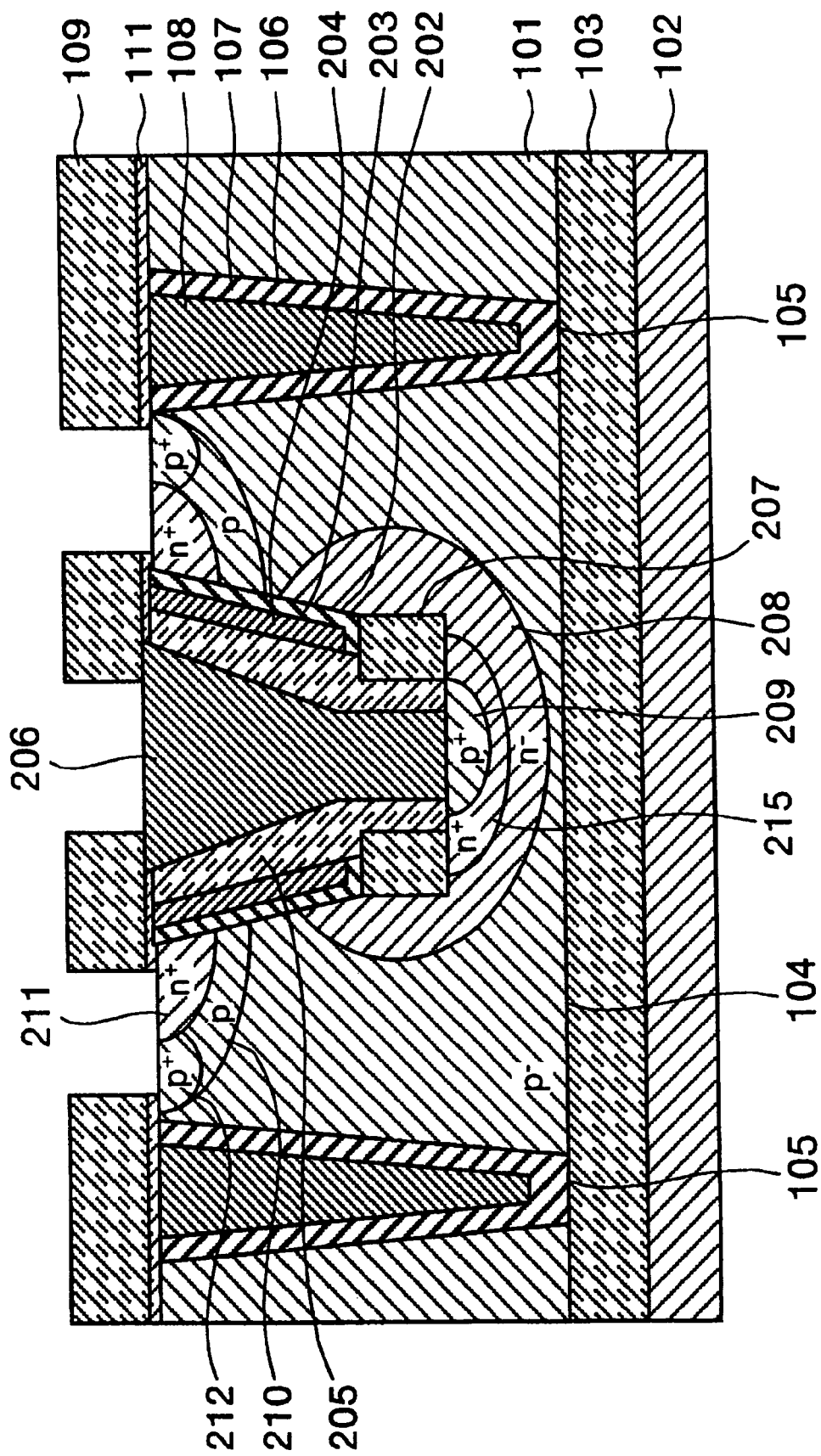
FIG. 4 is a cross-sectional view showing a state of the semiconductor device according to the first mode in the process step subsequent to the step of the state shown in FIG. 3 in the course of manufacturing.

Next, an explanation will be made about the manufacturing process of the TL-IGBT/C 200 with the above-explained arrangement. FIGS. 2 to 4 are cross-sectional views showing states of the TL-IGBT/C 200 in the process steps in the course of manufacturing.

First, as shown in FIG. 2, etching of the SOI substrate 100 is carried out with the oxide film 103 of the SOI substrate 100 used as an etching stopper, by which is formed the isolation trench 106 that penetrates through the p−-semiconductor layer 101 and reaches the oxide film 103. Then, the oxide insulator film 107 is formed on the inside face of the isolation trench 106 and, further inside thereof, the polysilicon 108 is deposited to fill the isolation trench 106. Alternatively, the isolation trench 106 may be filled by only insulator film 107. This alternative applies as well to the below-described modes 2–7. Thereafter, an etch back is carried out to smooth the surface of the SOI substrate 100.

Next, first trench etching is carried out to form a first step trench 221 in the element-forming region 104. Then, the inner wall of the first step trench 221 is oxidized to form the gate insulator film 203 on the inner wall of the first step trench 221. Subsequent to this, a nitride film 121 is deposited, which is then left only on the surface of the gate insulator film 203 on the sidewall portion of the first step trench 221.

With the left nitride film 121 used as a mask, second trench etching is carried out to deepen the bottom of the first step trench 221, by which a second step trench 222 is formed. Subsequent to this, n-type impurities are introduced from the second step trench 222 to form the n−-drift region 208 so as to surround the lower section of the trench 202. Thereafter, an oxide film produced on the inner wall of the second step trench 222 is removed. The structure at this stage is shown in FIG. 2.

Next, as shown in FIG. 3 with reference to FIG. 2, with the nitride film 121 being left on the sidewall of the first step trench 221, the inner wall of the second step trench 222 is oxidized to form the second interlayer insulator film 207 in the lower half section of the trench 202. Then, the nitride film 121 is removed before the polysilicon gate electrode 204 is formed. Thereafter, n-type impurities are introduced from the bottom of the second step trench 222 to form the n+-buffer region 215. Oxide film is deposited over the entire surface of the SOI substrate 100.

Next, the etching deposited oxide film using anisotropic dry etching, an aperture is formed in a bottom face of the second step trench 222, the first interlayer insulation film 205 is formed on a side wall of the second step trench 222 and oxide film 111 is formed on the SOI substrate 100 surface. When oxide film is deposited, oxide film formed on the SOI substrate 100 surface except trench 221, 222 formation region is thicker than oxide film formed in a bottom face of the second step trench 222. Thus, oxide film 111 remains when an aperture is formed in a bottom face of the second step trench 222 by anisotropic dry etching. Then p+-collector region 209 is formed on p type impurity being introduced from the bottom apertures of the second step trench 222.

The order of forming the n+-buffer region 215, the first interlayer insulator film 205 and the p+-collector region 209 can be changed as necessary. For example, after the n+-buffer region 215 is formed, the p+-collector region 209 can be formed before the first interlayer insulator film 205 is formed. In this case, the n+-buffer region 215 can be formed to be shallow. Therefore, even though the concentration of the n+-buffer region 215 is comparably high, high breakdown voltage and low on-resistance characteristics can be obtained without lowering the carrier injection efficiency.

Subsequent to this, the trench 202 is filled with the buried electrode 206 and an etch back is carried out to smooth the surface of the SOI substrate 100. The structure at this stage is shown in FIG. 3. Here, the buried electrode can be formed using a metallic material such as tungsten, or by using polysilicon doped with p-type impurities. When using the doped polysilicon, the p-type impurities diffuse into the n+-buffer region 215 from the polysilicon through the bottom of the second step trench 222. Therefore, the p+-collector region 209 can be formed without carrying out ion implantation with the p-type impurity ions. This simplifies the manufacturing process.

Following this, as shown in FIG. 4, the third interlayer insulator film 109 is deposited, wherein contact holes are opened therein to expose the substrate surface of the outer region of the trench 202 in the element-forming region 104 and the surface of the buried electrode 206. Then, in the outer region of the trench 202, the p-base region 210, the n+-emitter region 211 and the p+-plug region 212 are formed. The structure at this stage is shown in FIG. 4.

Figure 5:
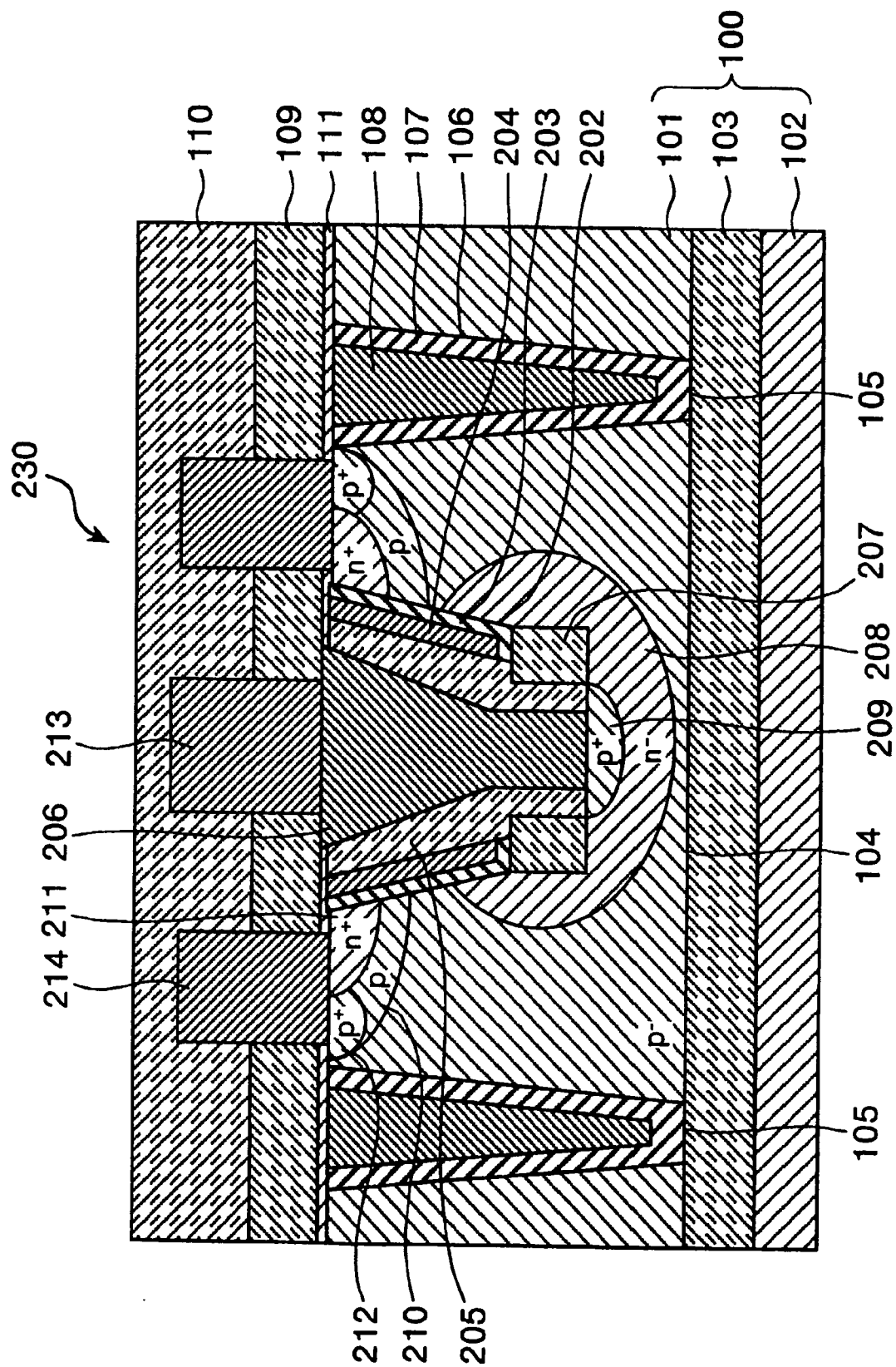
FIG. 5 is a cross-sectional view showing another arrangement of the semiconductor device according to the first mode.

Next, as shown in FIG. 5, the collector electrode 213 and the emitter electrode 214 are formed. Finally, the passivation film 110 is deposited to thereby complete the TL-IGBT/C 200 with the arrangement shown in FIG. 1.

According to the above-explained first mode, the TL-IGBT/C 200 has the gate electrode 204 in the trench 202 to provide a current path on the sidewall or near the bottom of the trench 202. This allows the TL-IGBT/C 200 to be highly integrated and, along with this, to have an on-resistance lower than those of a TLPM and a planar lateral IGBT. For example, with the same scale of integration, the on-resistance can be reduced to one fourth that of the TLPM. Moreover, according to the first mode, since the TL-IGBT/C 200 is formed on the SOI substrate 100, a substrate current is eliminated to enable realization of a reduction in switching losses and a high operation speed.

Furthermore, like a TL-IGBT/C 230 with the cross-sectional view thereof shown in FIG. 5, the process step of forming the n+-buffer region 215 can be omitted to allow the IGBT to have an arrangement in which no n+-buffer region 215 is provided at the bottom of the trench 202. In this case, not only can the manufacturing process be simplified, but also high carrier injection efficiency can be obtained by optimizing the impurity concentration of the n−-drift region 208. Therefore, high breakdown voltage and low on-resistance characteristics can be obtained.

Second Mode

Figure 6:
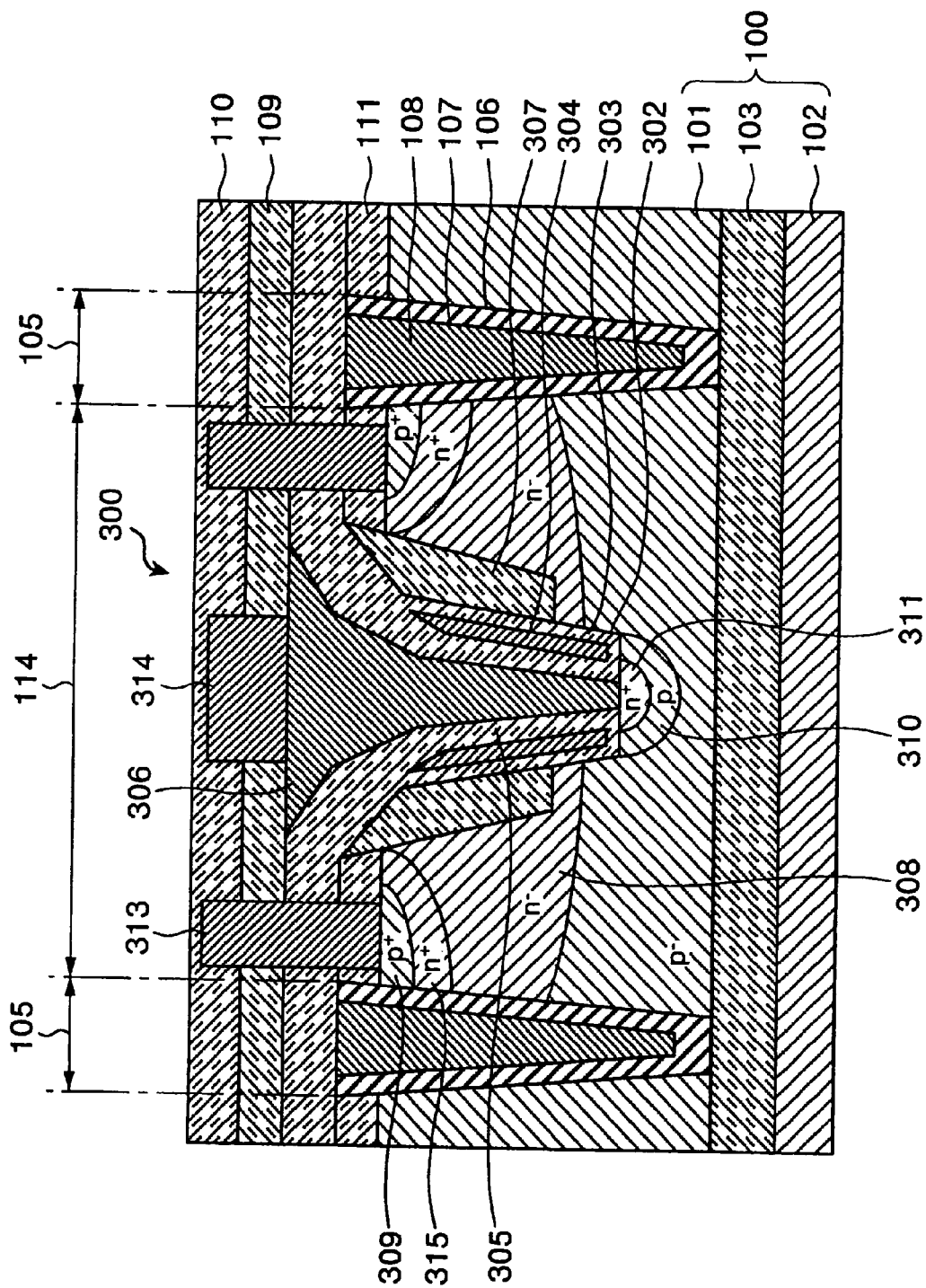
FIG. 6 is a cross-sectional view showing an arrangement of a semiconductor device according to a second mode for carrying out the invention in a first cross section.
Figure 7:
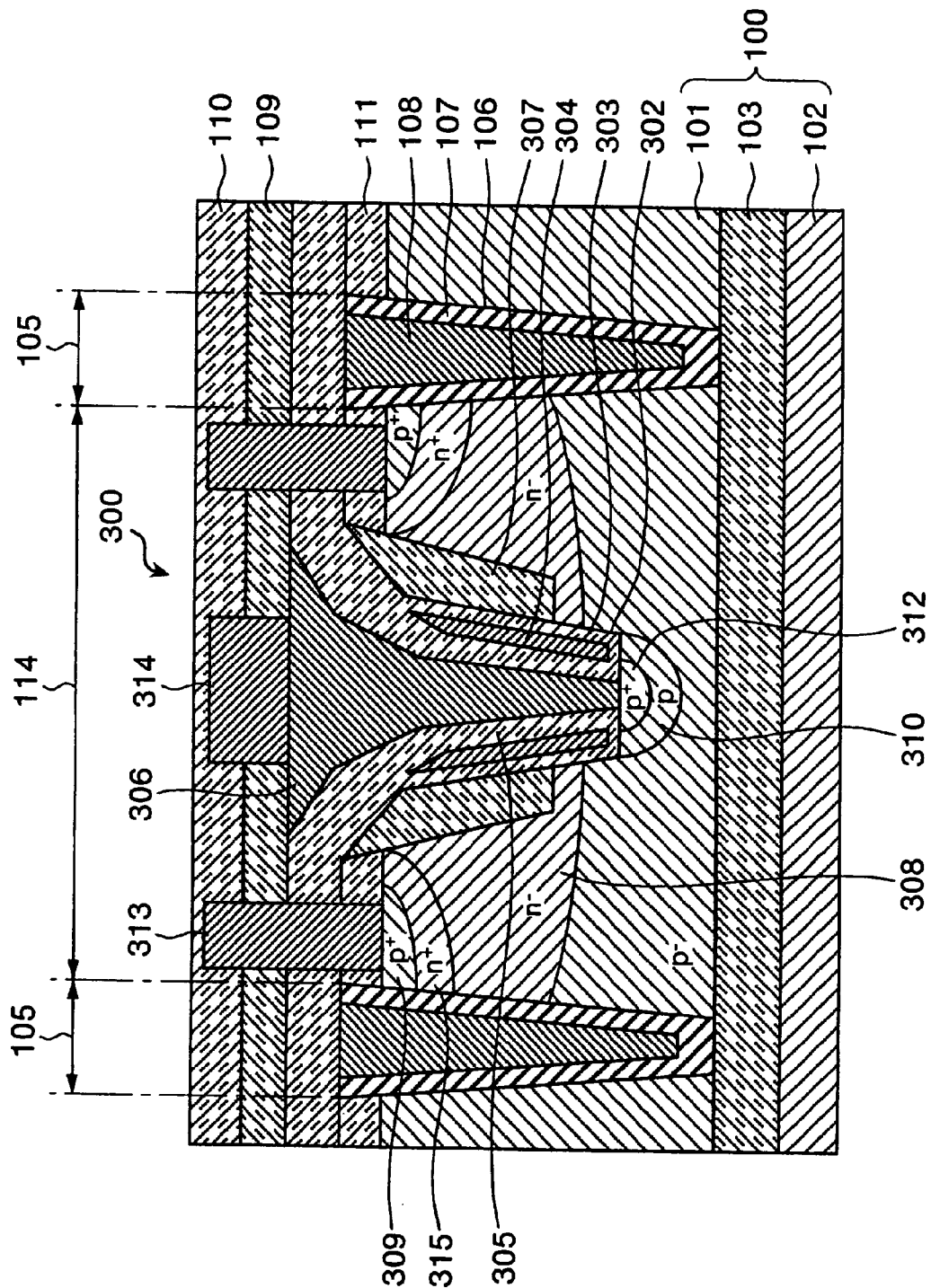
FIG. 7 is a cross-sectional view showing an arrangement of the semiconductor device according to the second mode in a second cross section.

FIGS. 6 and 7 are cross-sectional views showing arrangements of a semiconductor device according to the second mode for carrying out the invention. FIGS. 6 and 7 show arrangements in first and second cross sections, respectively, taken in different longitudinal regions of a trench. The semiconductor device of the second mode is a TL-IGBT provided with an emitter contact at the bottom of the trench (hereinafter referred to as a TL-IGBT/E).

As shown in FIG. 6 and FIG. 7, the TL-IGBT/E 300 is, like the TL-IGBT/C 200 of the first mode, formed in an element-forming region 114 in an SOI substrate 100 including a supporting substrate 102, an oxide film 103 and a p−-semiconductor layer 101. In the p−-semiconductor layer 101, an island-like element-forming region 114 is formed, as in the first mode, by a trench isolation region 105 including an isolation trench 106, an insulator film 107 and polysilicon 108.

The TL-IGBT/E 300 is provided with a gate insulator film 303, a gate electrode 304, a first interlayer insulator film 305, a buried electrode 306, a second interlayer insulator film 307, an $n^-$-drift region 308 and an $n^+$-buffer region 315. Also provided are a $p^+$-collector region 309, a p-base region 310, an $n^+$-emitter region 311, a $p^+$-plug region 312, a collector electrode 313, an emitter electrode 314, a third interlayer insulator film 109 and a passivation film 110.

In the element-forming region 114, a trench 302 is formed in the $p^-$-semiconductor layer 101. The gate insulator layer 303 is provided in the lower half section of the sidewall of the trench 302. In the upper half section of the trench 302, a second interlayer insulator film 307 that is thicker than the gate insulator film 303, is provided for ensuring a withstand voltage. The gate electrode 304 is provided inside the gate insulator layer 303 and the second interlayer insulator film 307.

The first interlayer insulator film 305 is provided inside the gate electrode 304. The first interlayer insulator film 305 extends to the surface of the SOI substrate 100. The buried electrode 306 is provided inside the first interlayer insulator film 305. The trench 302 is filled with the gate insulator film 303, the gate electrode 304, the second interlayer insulator film 307, the first interlayer insulator film 305 and the buried electrode 306.

The p-base region 310 is provided beneath the trench 302 and between the $n^+$-emitter region 311 and the $n^-$-drift region 308, as explained later. In the first cross section shown in FIG. 6, the $n^+$-emitter region 311 is provided on the bottom of the trench 302 in the p-base region 310. In the second cross section, shown in FIG. 7, the $p^+$-plug region 312 is provided on the bottom of the trench 302 in the p-base region 310.

In the first cross section, the buried electrode 306 is electrically connected to the $n^+$-emitter region 311 at the bottom of the trench 302. Moreover, in the second cross section, the buried electrode 306 is electrically connected also to the $p^+$-plug region 312. This is for preventing floating by electrically connecting the buried electrode 306 and the $p^-$-semiconductor layer 101 to ensure a withstand voltage even though the device is a large current element.

The $n^-$-drift region 308 is provided on the outside of the upper half section of the trench 302. The $n^+$-buffer region 315 is provided in the surface region of the $n^-$-drift region 308. The $p^+$-collector region 309 is provided in the surface region of the $n^+$-buffer region 315.

The emitter electrode 314 penetrate through the third interlayer insulator film 109 into electrical connection with the top end of the buried electrode 306. Moreover, the collector electrode 313 penetrates through the third interlayer insulator film 109, the first interlayer insulator film 305 and an oxide film 111 on the surface of the SOI substrate 100, into electrical connection with the $p^+$-collector region 309. The electrodes 313 and 314 are covered by the passivation film 110.

Figure 9:
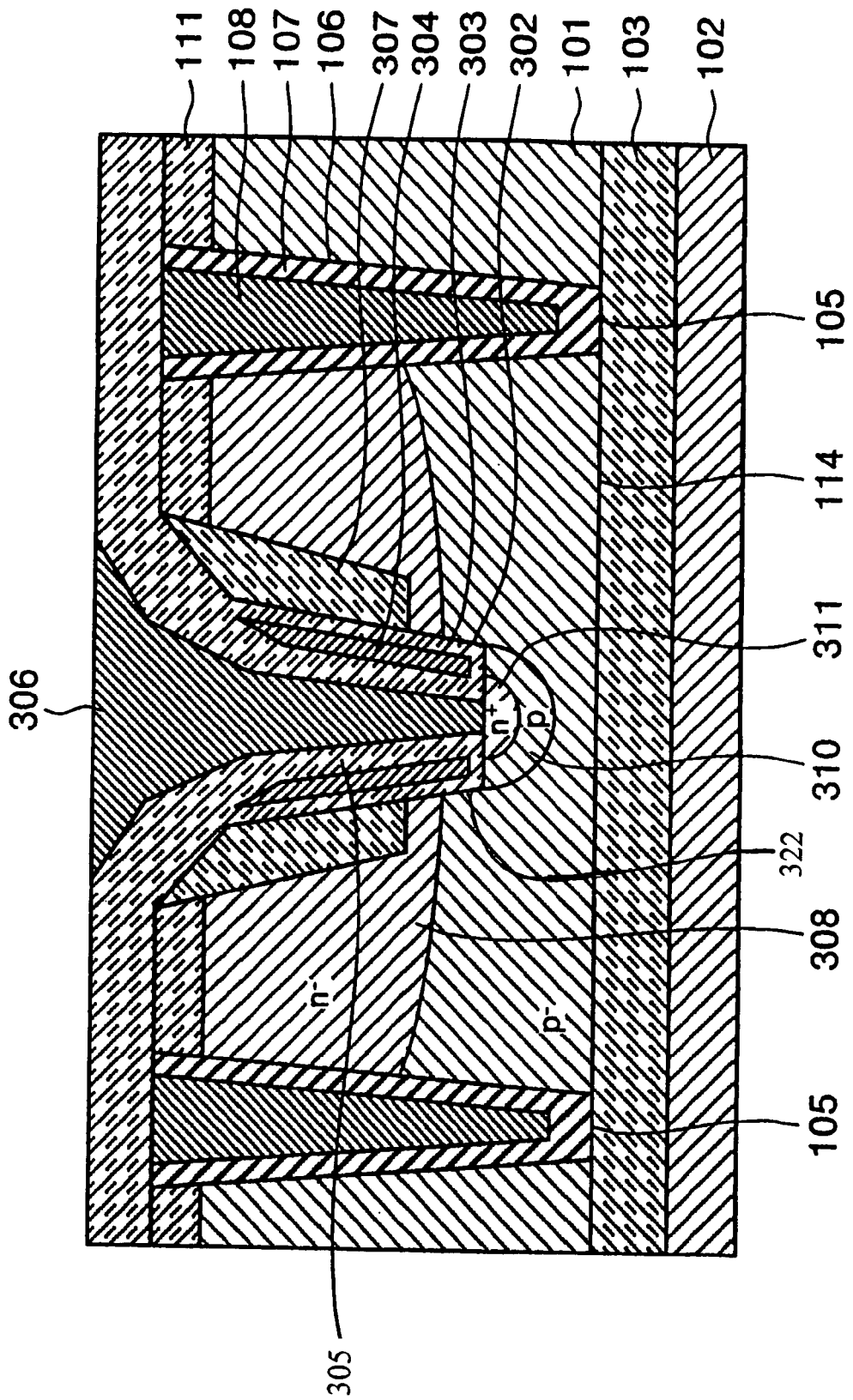
FIG. 9 is a cross-sectional view showing a state of the semiconductor device according to the second mode in the first cross section upon completion of a manufacturing process step subsequent to that shown in FIG. 8.
Figure 10:
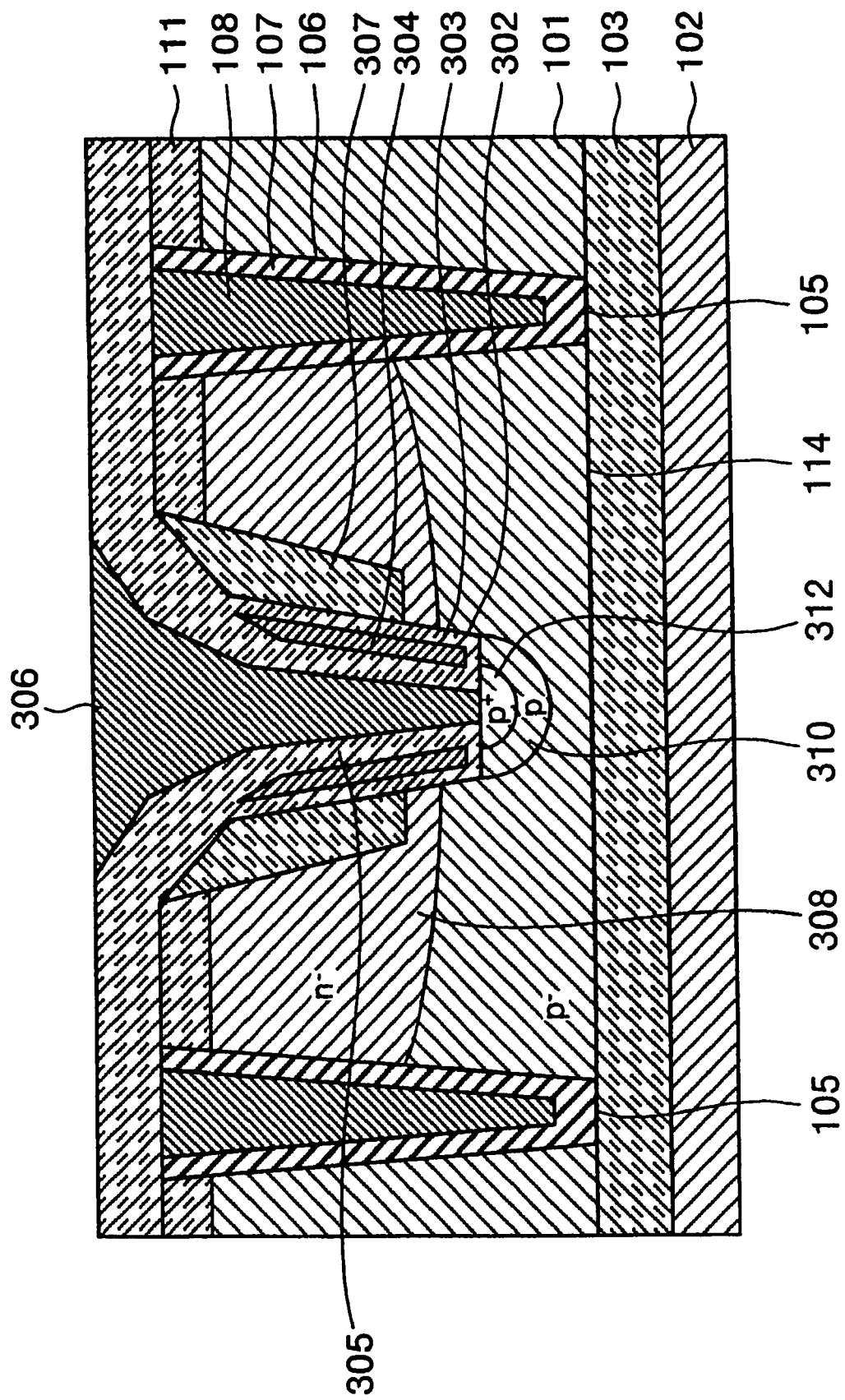
FIG. 10 is a cross-sectional view showing a state of the semiconductor device according to the second mode in the second cross section upon completion of the manufacturing process step subsequent to that shown in FIG. 8.
Figure 11:
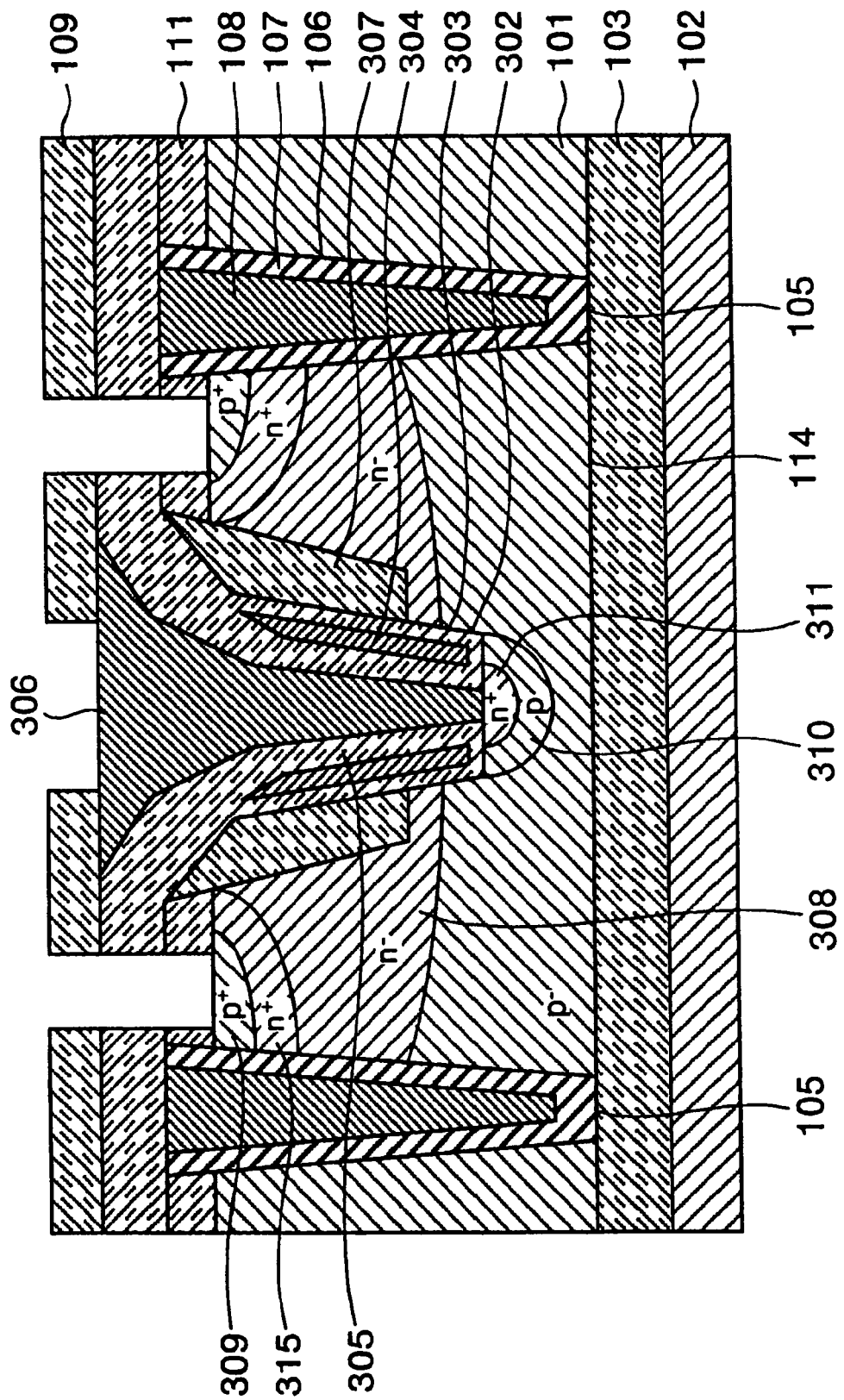
FIG. 11 is a cross-sectional view showing a state of the semiconductor device according to the second mode in the first cross section upon completion of a manufacturing process step subsequent to that shown in FIGS. 9 and 10.
Figure 12:
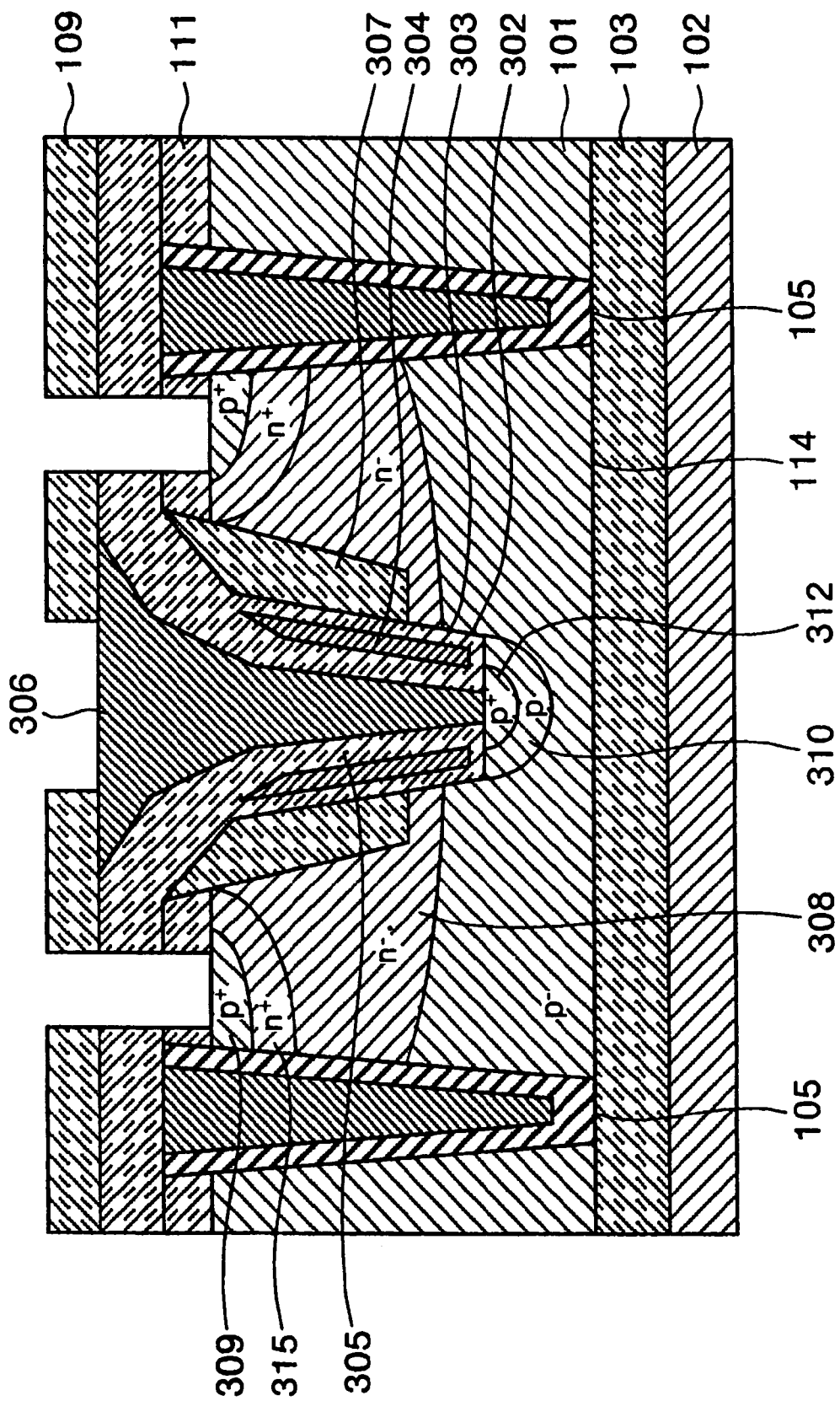
FIG. 12 is a cross-sectional view showing a state of the semiconductor device according to the second mode in the second cross section upon completion of the manufacturing process step subsequent to that shown in FIGS. 9 and 10.

Next, a process of manufacturing the TL-IGBT/E 300 with the above-explained arrangement is explained with reference to FIGS. 8–12. FIGS. 8–12 are cross-sectional views showing the structure of the TL-IGBT/E 300 during the course of its manufacture. Here, in the process step in which the cross-sectional arrangement is in the state shown in FIG. 8, the state of the arrangement is the same in the first and second cross sections. Moreover, FIG. 9 and FIG. 10 show states of cross-sectional arrangements in the same subsequent process step, where FIG. 9 shows the arrangement in the first cross section and FIG. 10 shows the arrangement in the second cross section. The same is true of arrangements shown in FIG. 11 and FIG. 12. FIG. 11 shows the arrangement in the first cross section upon completion of a step following that shown in FIGS. 9 and 10, and FIG. 12 shows the arrangement in the second cross section upon completion of the same step following that shown in FIGS. 9 and 10.

Figure 8:
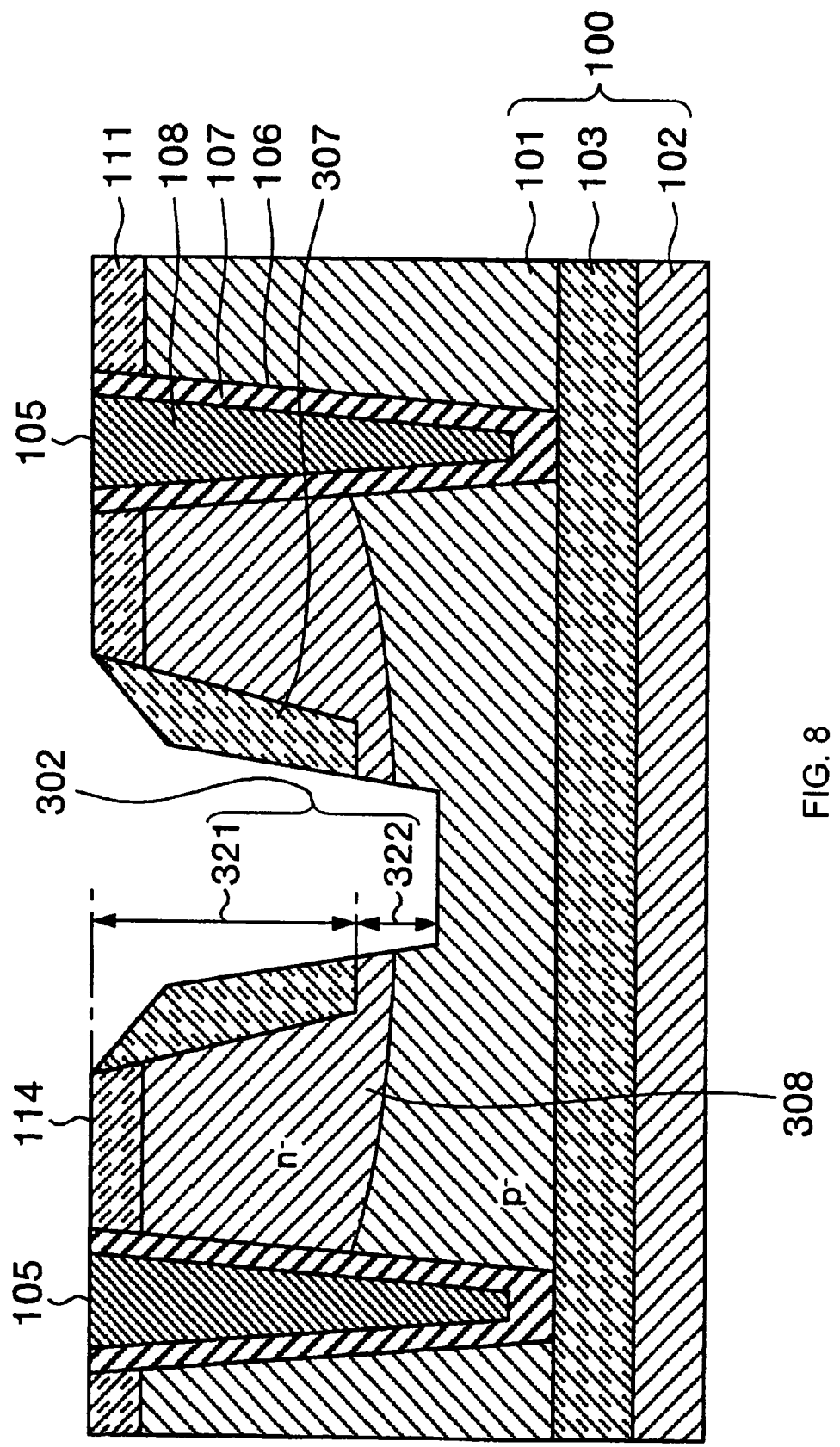
FIG. 8 is a cross-sectional view showing a state of the semiconductor device according to the second mode in each of the first and second cross sections, upon completion of a process step during the course of manufacturing.

First, as shown in FIG. 8, the oxide film (mask oxide film) 111 is formed on the surface of the SOI substrate 100. Then, etching of the SOI substrate 100 is carried out with the oxide film 103 of the SOI substrate 100 used as an etching stopper, by which the isolation trench 106 is formed that penetrates through the $p^-$-semiconductor layer 101 and reaches the oxide film 103. Then, the oxide insulator film 107 is formed on the inside face of the isolation trench 106 and, further inside thereof, the polysilicon 108 is deposited to fill the isolation trench 106. Thereafter, an etch back is carried out to smooth the surface of the SOI substrate 100.

Next, the first trench etching is carried out to form a first step trench 321 in the element-forming region 114. Then, n-type impurities are introduced from the sidewall of the first step trench 321 to form the $n^-$-drift region 308 outside of the trench 302. Thereafter, the sidewall of the first step trench 321 is oxidized to form the second interlayer insulator film 307.

Following this, with the second interlayer insulator film 307 used as a mask, the second trench etching is carried out to deepen the bottom of the first step trench 321, by which a second step trench 322 is formed. Thereafter, an oxide film produced on the inner wall of the second step trench 322 is removed. The state of the device up to this point of its manufacture is shown in FIG. 8.

Next, as shown in FIG. 9 and FIG. 10, the gate insulator film 303 is formed inside the second interlayer insulator film 307 and on the inner wall of the second step trench 322. Further, the gate electrode 304 is formed of polysilicon inside the trench 302. Then, p-type impurities are introduced from the bottom of the second step trench 322 to form the p-base region 310. Moreover, in the region 310 shown in FIG. 9, n-type impurities are introduced to form the $n^+$-emitter region 311 and, in the region 310 shown in FIG. 10, p-type impurities are further introduced to form the $p^+$-plug region 312.

Subsequent to this, the first interlayer insulator film 305 is formed on the inner wall of the trench 302. Thereafter, the trench 302 is filled with the buried electrode 306 and an etch back is carried out to smooth the surface of the SOI substrate 100. The structures of the device up to this point of the process are shown in FIG. 9 and FIG. 10. Following this, as shown in FIG. 11 and FIG. 12, the third interlayer insulator film 109 is deposited, and contact holes are opened therein to expose the substrate surface of the outer part region of the trench 302 in the element-forming region 114 and the surface of the buried electrode 306.

Then, in the outer part region of the trench 302, the $n^+$-buffer region 315 and the $p^+$-collector region 309 are formed in this order. The structure of the device up to this point of its manufacture are shown in FIG. 11 and FIG. 12. Next, the collector electrode 313 and the emitter electrode 314 are formed. Finally, the passivation film 110 is deposited to thereby complete the TL-IGBT/E 300 with the arrangements shown in FIG. 6 and FIG. 7.

According to the above-explained second mode, the TL-IGBT/E 300 has the gate electrode 304 in the trench 302 to provide a current path on the sidewall or near the bottom of the trench 302. This allows the TL-IGBT/E 300 to be highly integrated and, along with this, to have on-resistance lower than those of a TLPM and a planar lateral IGBT. Moreover, according to the second mode, since the TL-IGBT/E 300 is formed on the SOI substrate 100, a substrate current is eliminated to enable realization of a reduction in switching losses and of a high operation speed. Furthermore, according to the second mode, parasitic capacitance between the gate and the collector is smaller than that of the semiconductor device according to the first mode, which allows better switching characteristics to be obtained.

Figure 13:
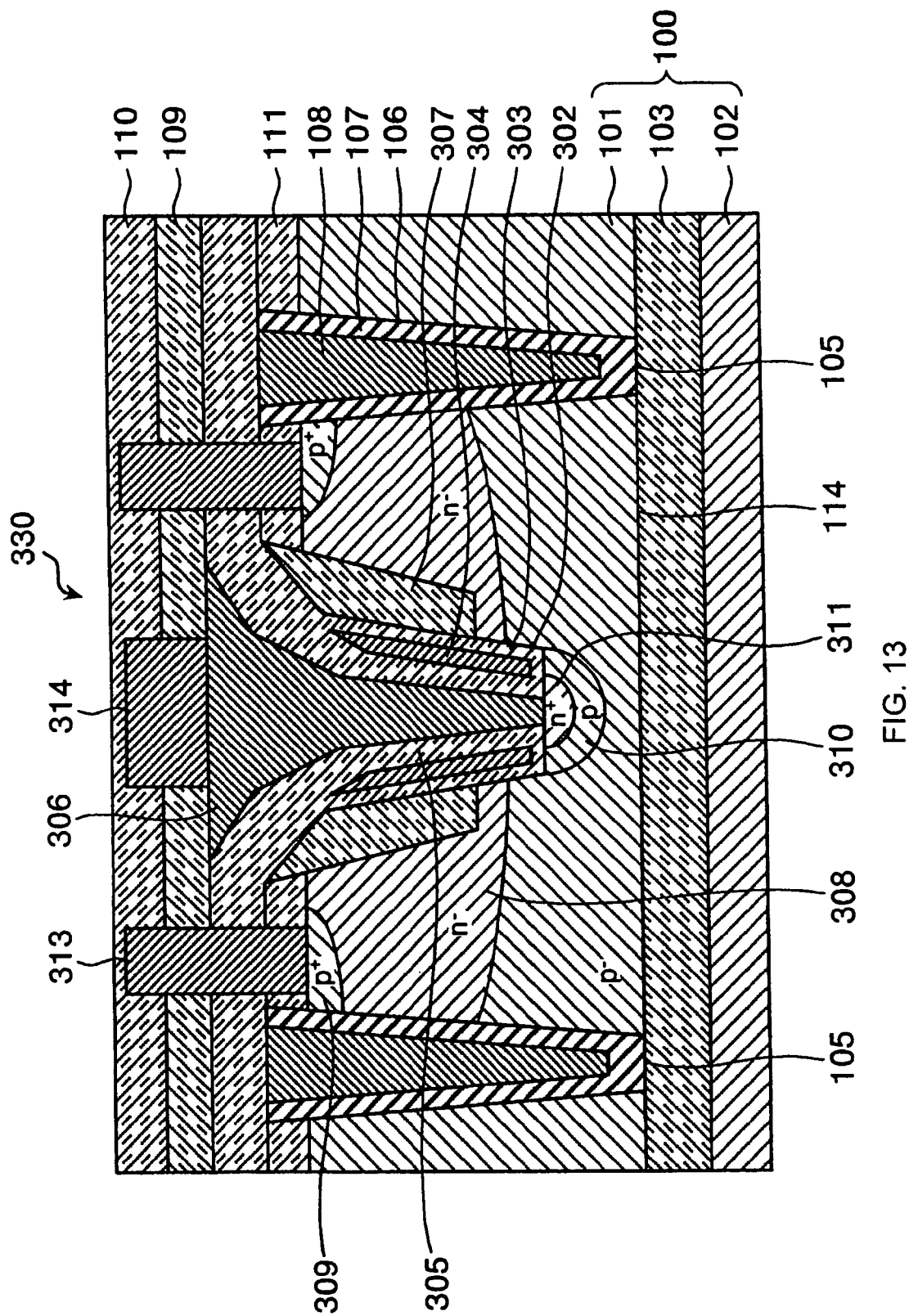
FIG. 13 is a cross-sectional view showing another arrangement of a semiconductor device according to the second mode in a cross section corresponding to the first cross section.
Figure 14:
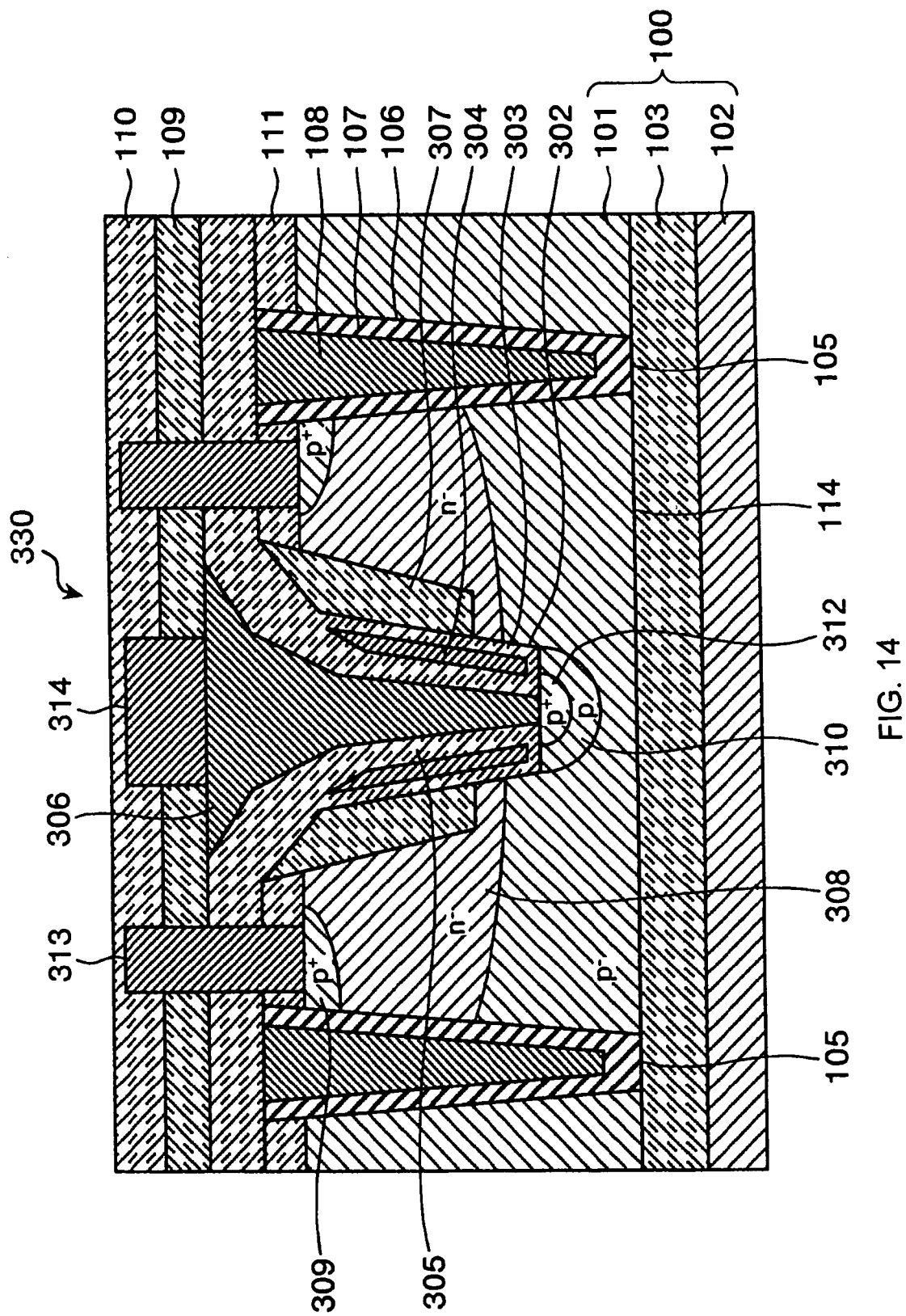
FIG. 14 is a cross-sectional view showing another arrangement of a semiconductor device according to the second mode in a cross section corresponding to the second cross section.

Furthermore, like a TL-IGBT/E 330 with the cross-sectional views thereof shown in FIG. 13 and FIG. 14, which is another semiconductor device according to the second mode, the process step of forming the $n^+$-buffer region 315 can be omitted to allow the IGBT to have an arrangement in which no $n^+$-buffer region 315 is provided in the outer region of the trench 302. In this case, not only can the manufacturing process be simplified, but also a high carrier injection efficiency can be obtained by optimizing the impurity concentration of the $n^-$-drift region 208. Therefore, characteristics of high breakdown voltage and low on-resistance can be obtained. Here, the arrangement shown in FIG. 13 is that in the cross section corresponding to the first cross section of the TL-IGBT/E 300 shown in FIG. 6. Moreover, the arrangement shown in FIG. 14 is that in the cross section corresponding to the second cross section of the TL-IGBT/E 300 shown in FIG. 7.

Third Mode

Figure 15:
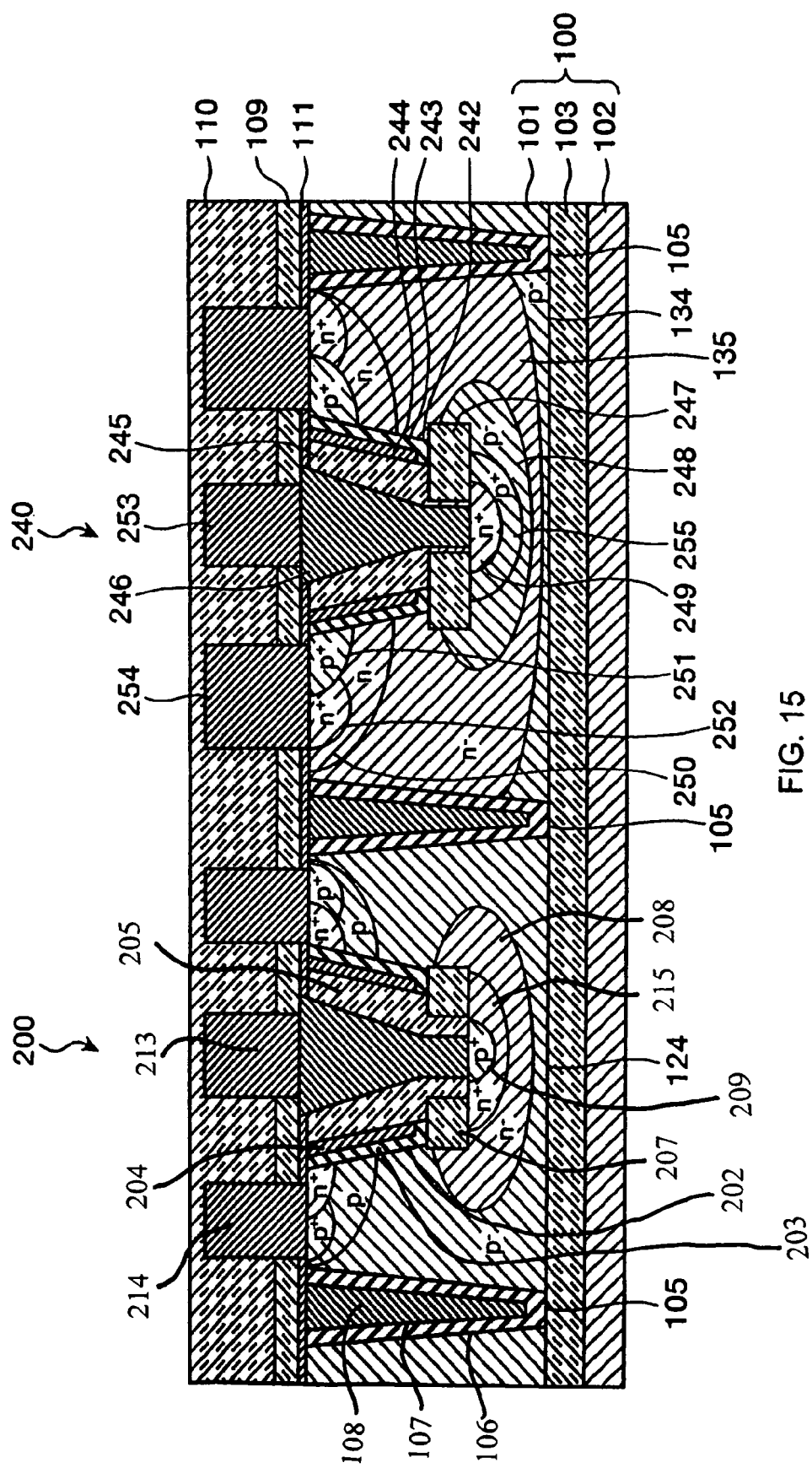
FIG. 15 is a cross-sectional view showing an arrangement of a semiconductor device according to a third mode for carrying out the invention.

FIG. 15 is a cross-sectional view showing an arrangement of a semiconductor device according to the third mode for carrying out the invention. The semiconductor device of the third mode is a device in which an n-channel TL-IGBT/C provided with a collector contact at the bottom of a trench (hereinafter referred to as an n-TL-IGBT/C) and a p-channel TL-IGBT/C provided with a collector contact at the bottom of a trench (hereinafter referred to as a p-TL-IGBT/C), are integrated together on an SOI substrate.

As shown in FIG. 15, the SOI substrate 100, similar to that in the first mode, including a supporting substrate 102, an oxide film 103 and a $p^-$-semiconductor layer 101, is divided into a plurality of island-like element-forming regions. The element-forming regions include a first element-forming region 124 and a second element-forming region 134, which are divided by a trench isolation region 105 similar to that in the first mode, including an isolation trench 106, an insulator film 107 and polysilicon 108. In the first element-forming region 124, the n-TL-IGBT/C 200 of the first mode, for example, is formed.

In the second element-forming region 134, a p-TL-IGBT/C 240 with an arrangement similar to that of the TL-IGBT/C 200 of the first mode, for example, is formed. In the second element-forming region 134, an $n^-$-well region 135 is formed in the $p^-$-semiconductor layer 101. In the example shown in the figure, the p-TL-IGBT/C 240 is formed in the $n^-$-well region 135.

The p-TL-IGBT/C 240 is provided with a trench 242 formed in the $n^-$-well region 135, a gate insulator film 243, a gate electrode 244, a first interlayer insulator film 245, a buried electrode 246 and a second interlayer insulator film 247. The p-TL-IGBT/C 240 also is provided with a $p^-$-drift region 248, a $p^+$-buffer region 255, an $n^+$-collector region 249, an n-base region 250, a $p^+$-emitter region 251, an $n^+$-plug region 252, a collector electrode 253, an emitter electrode 254, a third interlayer insulator film 109 and a passivation film 110.

The arrangement of the p-TL-IGBT/C 240 is similar to that of TL-IGBT/C 200 of the first mode, provided above, except that the constituents in the explanation of the TL-IGBT/C 200 of the first mode are changed, as follows. Namely, the trench 202, the gate insulator film 203, the gate electrode 204, the first interlayer insulator film 205, the buried electrode 206, the second interlayer insulator film 207, the $n^-$-drift region 208, the $n^+$-buffer region 215, the $p^+$-collector region 209, the p-base region 210, the $n^+$-emitter region 211, the $p^+$-plug region 212, the collector electrode 213 and the emitter electrode 214 are replaced by the trench 242, the gate insulator film 243, the gate electrode 244, the first interlayer insulator film 245, the buried electrode 246, the second interlayer insulator film 247, the $p^-$-drift region 248, the $p^+$-buffer region 255, the $n^+$-collector region 249, the n-base region 250, the $p^+$-emitter region 251, the $n^+$-plug region 252, the collector electrode 253 and the emitter electrode 254, respectively. Moreover, the $p^-$-semiconductor layer 101 is to be replaced by the $n^-$-well region 135.

The arrangement of the n-TL-IGBT/C 200 is as was explained for the first mode. Thus, the explanation thereof will be omitted here. The oxide film 111 on the substrate surface, the third interlayer insulator film 109 and the passivation film 110 are common to the p-TL-IGBT/C 240 and the n-TL-IGBT/C 200.

Next, an explanation is provided of the manufacturing process of the semiconductor device in which the n-TL-IGBT/C 200 and the p-TL-IGBT/C 240 with the above-explained arrangements are integrated together. First, in a similar way to that in the first mode, a trench isolation region 105 is formed in the SOI substrate 100 to provide a plurality of element-forming regions, the first element-forming region 124 and the second element-forming region 134. Following this, the $n^-$-well region 135 is formed in the second element-forming region 134. The reason for providing the $n^-$-well region 135 is to protect against the occurrence of punch-through in the p-TL-IGBT/C 240.

Thereafter, in the first element-forming region 124, the n-TL-IGBT/C 200 is formed. The process of forming the n-TL-IGBT/C 200 is as was explained in the above description of the first mode. Thus, an explanation thereof is omitted here. In the second element-forming region 134, the p-TL-IGBT/C 240 is formed according to a process similar to that of forming the n-TL-IGBT/C 200 of the first mode. The difference is that in the process of manufacturing the p-TL-IGBT/C 240, the conductivity types are reversed. That is, the constituent elements of conductivity type n in the process of forming the n-TL-IGBT/C 200 of the first mode are changed to p type for the process of manufacturing the p-TL-IGBT/C 240, and the constituent elements of conductivity type p in the process of forming the n-TL-IGBT/C 200 of the first mode are changed to n type for the process of manufacturing the p-TL-IGBT/C 240.

In manufacturing the n-TL-IGBT/C 200 and the p-TL-IGBT/C 240, the gate insulator films 203 and 243 of the respective IGBTs can be formed at the same time. Moreover, the second interlayer insulator films 207 and 247 of the respective IGBTs also can be formed at the same time. Furthermore, the gate electrodes 204 and 244 of the respective IGBTs can be formed at the same time. In addition, the first interlayer insulator films 205 and 245 of the respective IGBTs also can be formed at the same time.

According to the above-explained third mode, the n-TL-IGBT/C 200 has the gate electrode 204 in the trench 202 to provide a current path on the sidewall or near the bottom of the trench 202. Moreover, the p-TL-IGBT/C 240 has the gate electrode 244 in the trench 242 to provide a current path on the sidewall or near the bottom of the trench 242. This allows the semiconductor device to be highly integrated and, along with this, to have on-resistance made lower than those of a TLPM and a planar lateral IGBT. Furthermore, according to the third mode, since the n-TL-IGBT/C 200 and the p-TL-IGBT/C 240 are formed on the SOI substrate 100, a substrate current is eliminated to enable realization of reduction in switching losses and a high operation speed. In addition, according to the third mode, since the n-TL-IGBT/C 200 and the p-TL-IGBT/C 240 are isolated from each other by dielectric isolation with the trench isolation region 105, latchup due to interaction between the two IGBTs can be prevented.

Furthermore, an arrangement can be presented in which no $n^-$-well region 135 is provided in the element-forming region 134 in the p-TL-IGBT/C 240. In this case, by optimizing the impurity concentration of the n-base region 250, punch-through can be prevented. Moreover, an arrangement can be presented in which none of the $n^+$-buffer region 215 and the $p^+$-buffer region 255 are provided at the bottoms of the trenches 202 and 242, respectively. Also, no $n^+$-buffer region 215 is provided at the bottom of the trench 202, or no $p^+$-buffer region 255 is provided at the bottom of the trench 242. In this case, not only can the manufacturing process be simplified, but also high carrier injection efficiency can be obtained by optimizing the impurity concentration of the $n^-$-drift region 208 or the $p^-$-drift region 248 in the element without buffer region. Therefore, high breakdown voltage and low on-resistance characteristics can be obtained.

Fourth Mode

Figure 16:
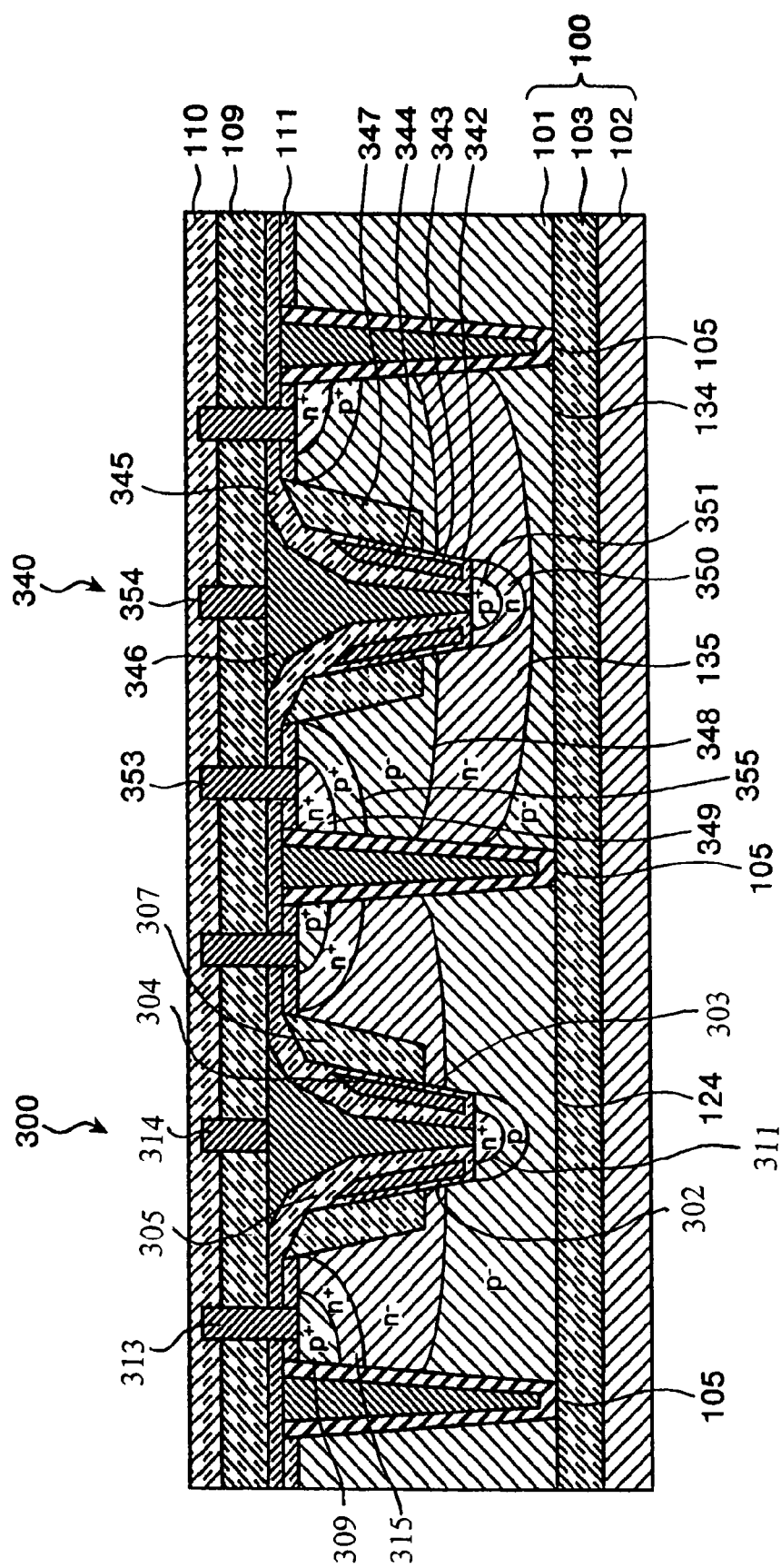
FIG. 16 is a cross-sectional view showing an arrangement of a semiconductor device according to a fourth mode for carrying out the invention in a first cross section.
Figure 17:
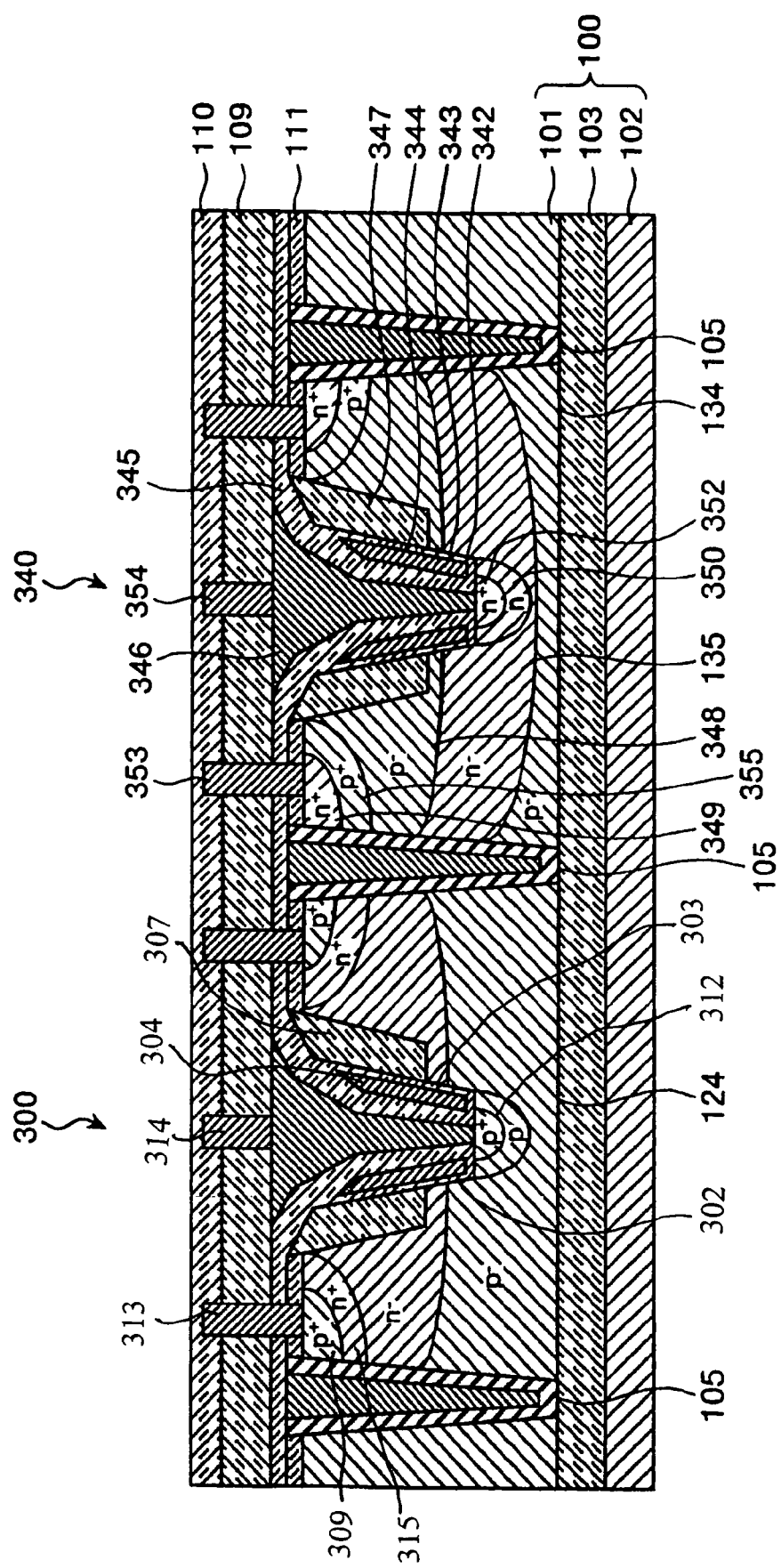
FIG. 17 is a cross-sectional view showing an arrangement of the semiconductor device according to the fourth mode in a second cross section.

FIGS. 16 and 17 are cross-sectional views showing arrangements of a semiconductor device according to the fourth mode for carrying out the invention. FIGS. 16 and 17 show arrangements in first and second cross sections, respectively, positioned in longitudinal trench regions that are different from each other. The semiconductor device of the fourth mode is a device in which an n-channel TL-IGBT/E provided with an emitter contact at the bottom of a trench (hereinafter referred to as an n-TL-IGBT/E) and a p-channel TL-IGBT/E provided with an emitter contact at the bottom of a trench (hereinafter referred to as a p-TL-IGBT/E) are integrated together on an SOI substrate.

As shown in FIGS. 16 and 17, the SOI substrate 100 is divided into a plurality of island-like element-forming regions, that is, a first element-forming region 124 and a second element-forming region 134, by a trench isolation region 105. This is similar to the third mode. In the fourth mode, in the first element-forming region 124, the TL-IGBT/E (n-TL-IGBT/E) 300 of the second mode, for example, is formed. In the second element-forming region 134, an $n^-$-well region 135 is formed in a $p^-$-semiconductor layer 101. In the $n^-$-well region 135, for example a p-TL-IGBT/E 340 with an arrangement similar to that of the n-TL-IGBT/E 300 of the second mode, is formed.

The p-TL-IGBT/E 340 is provided with a trench 342 formed in the $n^-$-well region 135, a gate insulator film 343, a gate electrode 344, a first interlayer insulator film 345, a buried electrode 346, a second interlayer insulator film 347, a $p^-$-drift region 348, a $p^+$-buffer region 355. The p-TL-IGBT/E 340 also is provided with an $n^+$-collector region 349, an n-base region 350, a $p^+$-emitter region 351, an $n^+$-plug region 352, a collector electrode 353, an emitter electrode 354, a third interlayer insulator film 109 and a passivation film 110.

The arrangement of the p-TL-IGBT/E 340 may be explained as a substitution of constituents relative to those of the TL-IGBT/E 300 of the second mode, as follows. Namely, the trench 302, the gate insulator film 303, the gate electrode 304, the first interlayer insulator film 305, the buried electrode 306, the second interlayer insulator film 307, the $n^-$-drift region 308, the $n^+$-buffer region 315, the $p^+$-collector region 309, the p-base region 310, the $n^+$-emitter region 311, the $p^+$-plug region 312, the collector electrode 313 and the emitter electrode 314 are to be changed to the trench 342, the gate insulator film 343, the gate electrode 344, the first interlayer insulator film 345, the buried electrode 346, the second interlayer insulator film 347, the $p^-$-drift region 348, the $p^+$-buffer region 355, the $n^+$-collector region 349, the n-base region 350, the $p^+$-emitter region 351, the $n^+$-plug region 352, the collector electrode 353 and the emitter electrode 354, respectively. Moreover, the $p^-$-semiconductor layer 101 is to be changed to the $n^-$-well region 135.

The arrangement of the n-TL-IGBT/E 300 is as was explained above in regard to the second mode. Thus, an explanation thereof will be omitted here. The oxide film 111 on the substrate surface, the third interlayer insulator film 109 and the passivation film 110 are common to the p-TL-IGBT/E 340 and the n-TL-IGBT/E 300.

Next, an explanation will be provided of the manufacturing process of the semiconductor device in which the n-TL-IGBT/E 300 and the p-TL-IGBT/E 340 with the above-explained arrangements are integrated together. First, the trench isolation region 105 is formed in the SOI substrate 100 to provide a plurality of element-forming regions, including the first element-forming region 124 and the second element-forming region 134. Then, the $n^-$-well region 135 is formed in the second element-forming region 134. This is the same as in the third mode. The reason for providing the $n^-$-well region 135 is to protect against the occurrence of punch-through in the p-TL-IGBT/E 340.

Thereafter, in the first element-forming region 124, the n-TL-IGBT/E 300 is formed. The process of forming the n-TL-IGBT/E 300 is as was explained above in regard to the second mode. Thus, an explanation thereof is omitted here. In the second element-forming region 134, the p-TL-IGBT/E 340 is formed according to a process similar to that of forming the n-TL-IGBT/E 300 of the second mode. The difference is that in the process of manufacturing the p-TL-IGBT/E 340, the conductivity types are reversed. That is, the constituent elements of conductivity type n in the process of forming the n-TL-IGBT/E 300 of the second mode are changed to p type for the process of manufacturing the p-TL-IGBT/E 340, and the constituent elements of conductivity type p in the process of forming the n-TL-IGBT/E 300 of the second mode are changed to n type for the process of manufacturing the p-TL-IGBT/E 340.

In manufacturing the n-TL-IGBT/E 300 and the p-TL-IGBT/E 340, the gate insulator films 303 and 343 of the respective IGBTs can be formed at the same time. Moreover, the second interlayer insulator films 307 and 347 of the respective IGBTs can be formed at the same time. Furthermore, the gate electrodes 304 and 344 of the respective IGBTs also can be formed at the same time. In addition, the first interlayer insulator films 305 and 345 of the respective IGBTs can be formed at the same time.

According to the above-explanation of the fourth mode, the n-TL-IGBT/E 300 has the gate electrode 304 in the trench 302 to provide a current path on the sidewall or near the bottom of the trench 302. Moreover, the p-TL-IGBT/E 340 has the gate electrode 344 in the trench 342 to provide a current path on the sidewall or near the bottom of the trench 342. This allows the semiconductor device to be highly integrated and, along with this, to have on-resistance made lower than those of a TLPM and a planar lateral IGBT. Moreover, according to the fourth mode, since the n-TL-IGBT/E 300 and the p-TL-IGBT/E 340 are formed on the SOI substrate 100, a substrate current is eliminated to enable a realization of both a reduction in switching losses and a high operation speed.

Furthermore, according to the fourth mode, since the n-TL-IGBT/E 300 and the p-TL-IGBT/E 340 are isolated from each other by dielectric isolation with the trench isolation region 105, latchup due to interaction between the two IGBTs can be prevented. Furthermore, according to the fourth mode, parasitic capacitance between the gate and the collector is smaller than that of the semiconductor device according to the second mode. This latter feature allows improved switching characteristics to be obtained.

Furthermore, an arrangement can be presented in which no $n^-$-well region 135 is provided in the element-forming region 134 of the p-TL-IGBT/E 340. In this case, by optimizing the impurity concentration of the n-base region 350, punch-through can be prevented. Moreover, any one of three arrangements can be presented:

1. neither the $n^+$-buffer region 315 nor the $p^+$-buffer region 355 are provided on the outside of the trench 302 and on the outside of the trench 342, respectively,
2. no $n^+$-buffer region 315 is provided on the outside of the trench 302, or
3. no $p^+$-buffer region 355 is provided on the outside of the trench 342.

In any of these arrangements, not only can the manufacturing process be simplified, but also high carrier injection efficiency can be obtained by optimizing the impurity concentration of the $n^-$-drift region 308 or the $p^-$-drift region 348 in the element without a buffer region. Therefore, the characteristics of high breakdown voltage and low on-resistance can be obtained.

Fifth Mode

Figure 18:
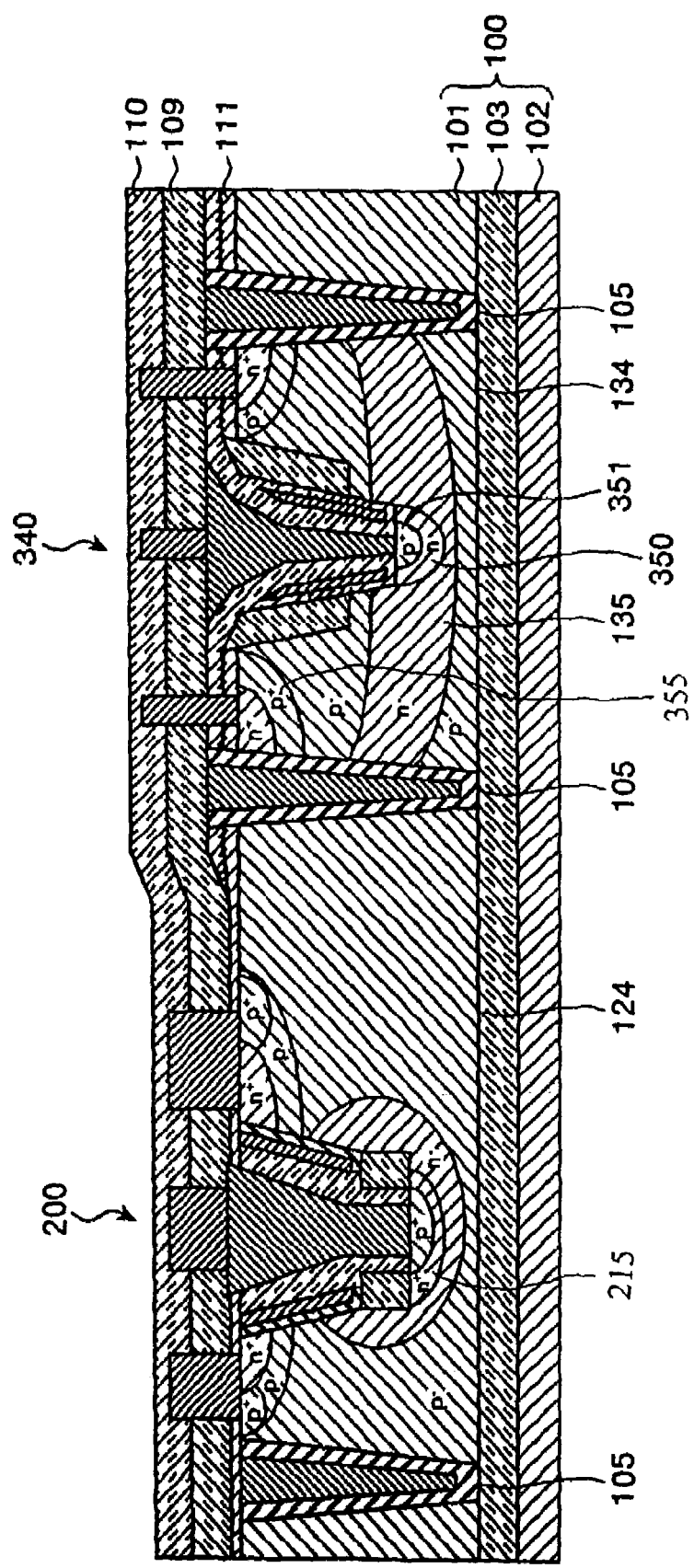
FIG. 18 is a cross-sectional view showing an arrangement of a semiconductor device according to a fifth mode for carrying out the invention in a first cross section.
Figure 19:
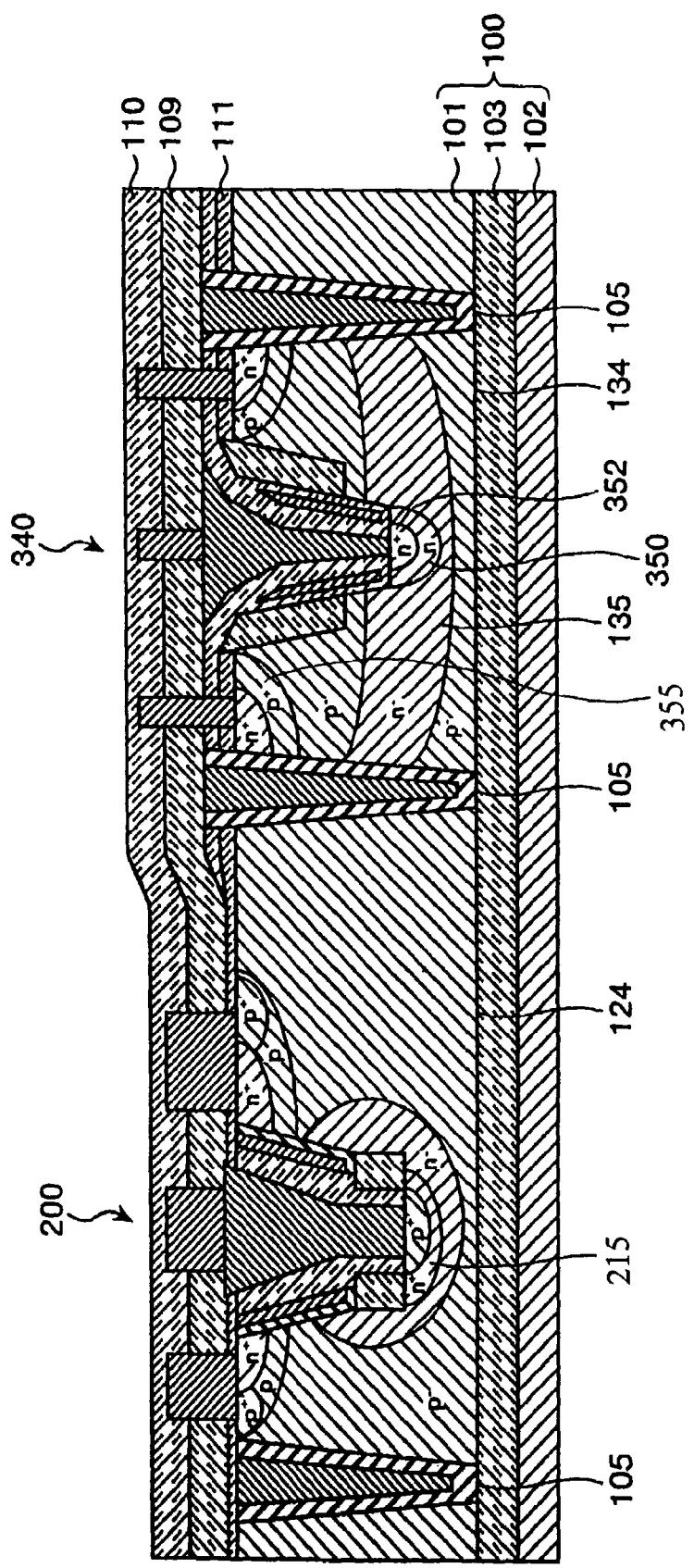
FIG. 19 is a cross-sectional view showing an arrangement of the semiconductor device according to the fifth mode in a second cross section.

FIGS. 18 and 19 are cross-sectional views showing arrangements of a semiconductor device according to a fifth mode for carrying out the invention. FIGS. 18 and 19 show arrangements in first and second cross sections, respectively, positioned at different longitudinal regions of a trench. The semiconductor device of the fifth mode is a device in which an n-TL-IGBT/C provided with a collector contact at the bottom of a trench and a p-channel TL-IGBT/E provided with an emitter contact at the bottom of a trench, are integrated together on an SOI substrate.

As shown in FIGS. 18 and 19, the SOI substrate 100 is divided into a plurality of island-like element-forming regions, including a first element-forming region 124 and a second element-forming region 134, by a trench isolation region 105. This is similar to the third mode. In the fifth mode, in the first element-forming region 124, the TL-IGBT/C (n-TL-IGBT/C) 200 of the first mode, for example, is formed. In the second element-forming region 134, the p-TL-IGBT/E 340 of the fourth mode, for example, is formed in an $n^-$-well region 135 provided in a $p^-$-semiconductor layer 101. An oxide film 111 on the substrate surface, a third interlayer insulator film 109 and a passivation film 110 are common to the n-TL-IGBT/C 200 and the p-TL-IGBT/E 340.

The arrangement and the manufacturing process of the n-TL-IGBT/C 200 are as were explained above with regard to the first mode. Thus, an explanation thereof is omitted here. Moreover, the arrangement and the manufacturing process of the p-TL-IGBT/E 340 are as those for which the constituents in the explanation above regarding the p-TL-IGBT/E 300 of the second mode are changed, as was explained above with regard to the fourth mode. Thus, an explanation thereof is omitted here.

According to the above-explained fifth mode, each of the n-TL-IGBT/C 200 and the p-TL-IGBT/E 340 has a gate electrode in the trench to provide a current path on the sidewall or near the bottom of the trench. This allows the semiconductor device to be highly integrated and, along with this, to have on-resistance lower than those of a TLPM and a planar lateral IGBT. Moreover, according to the fifth mode, since the n-TL-IGBT/C 200 and the p-TL-IGBT/C 340 are formed on the SOI substrate 100, a substrate current is eliminated to enable realization of reduction in switching losses and a high operation speed.

Furthermore, according to the fifth mode, since the n-TL-IGBT/C 200 and the p-TL-IGBT/E 340 are isolated from each other by dielectric isolation with the trench isolation region 105, latchup due to interaction between the two IGBTs can be prevented. Furthermore, according to the fifth mode, the n-TL-IGBT/C 200 with a relatively low speed switching characteristic and the p-TL-IGBT/E 340 with a relatively high speed switching characteristic, are integrated together. Thus, a power IC suited for both low speed and high speed applications can be manufactured without carrying out wire bonding. Therefore, the number of components can be reduced to enhance the reliability of the device.

Furthermore, an arrangement can be presented in which no $n^-$-well region 135 is provided in the element-forming region 134 in the p-TL-IGBT/E 340. In this case, by optimizing the impurity concentration of the n-base region 350, punch-through can be prevented. Moreover, an arrangement can be presented in which only one or neither of the $n^+$-buffer region 215 and the $p^+$-buffer region 355 is provided. In this case, not only can the manufacturing process be simplified, but also a high carrier injection efficiency can be obtained by optimizing the impurity concentration of the $n^-$-drift region or the $p^-$-drift region in the element without a buffer region. Therefore, high breakdown voltage and low on-resistance characteristics can be obtained.

Further, a p-TL-IGBT/C and an n-TL-IGBT/E can be integrated together. Moreover, an n-TL-IGBT/C and a p-TL-IGBT/E, or a p-TL-IGBT/C and a p-TL-IGBT/E can be integrated together.

Sixth Mode

Figure 20:
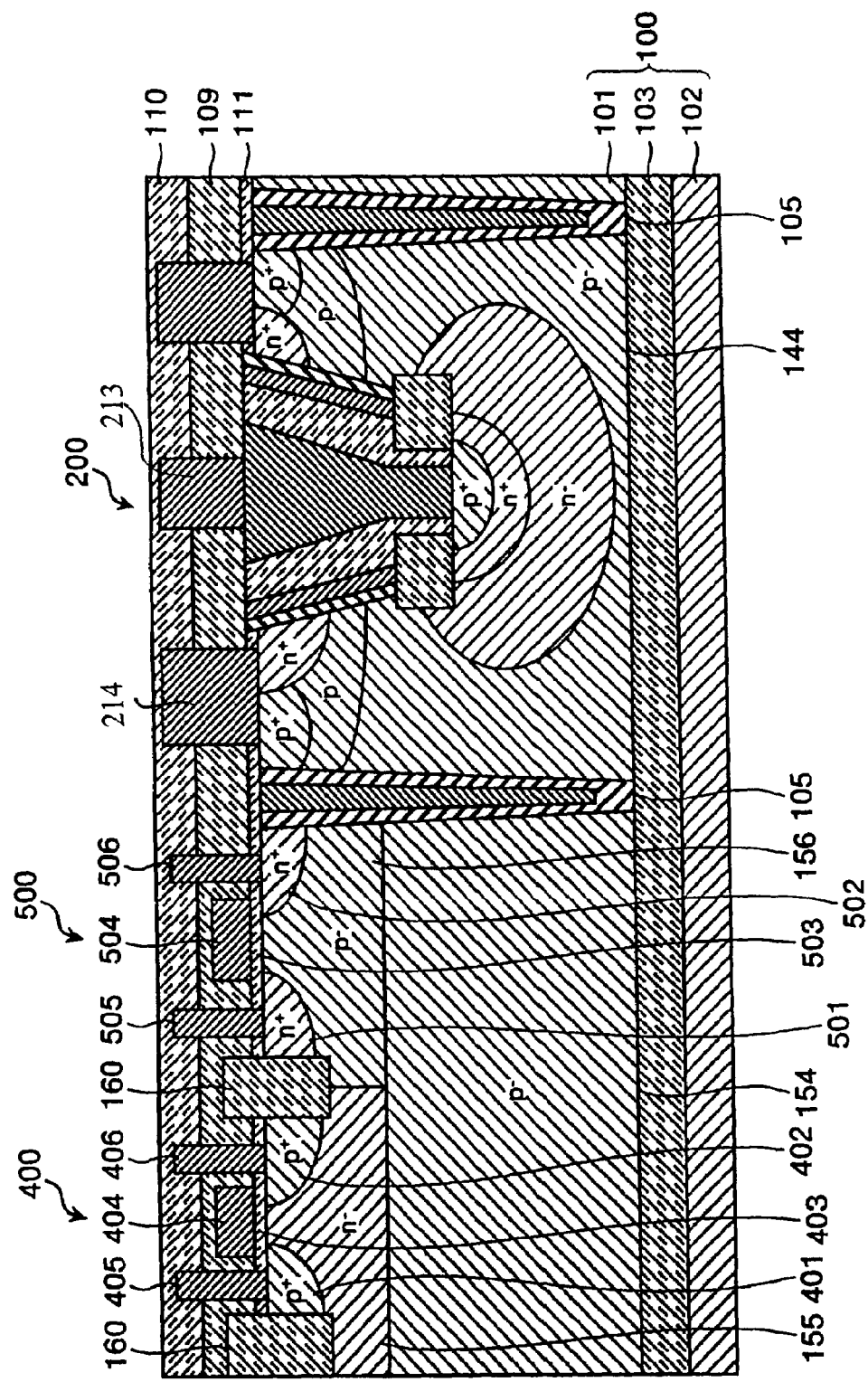
FIG. 20 is a cross-sectional view showing an arrangement of a semiconductor device according to a sixth mode for carrying out the invention.

FIG. 20 is a cross-sectional view showing an arrangement of a semiconductor device according to a sixth mode for carrying out the invention. The semiconductor device of the sixth mode is a device in which a TL-IGBT/C provided with a collector contact at the bottom of a trench and a CMOS device for controlling the TL-IGBT/C, are integrated together on an SOI substrate.

As shown in FIG. 20, the SOI substrate 100 is divided into a plurality of island-like element-forming regions, including a first element-forming region 144 and a second element-forming region 154, by a trench isolation region 105. This is similar to the third mode. In the sixth mode, in the first element-forming region 144, the n-TL-IGBT/C 200 of the first mode, for example, is formed. In the second element-forming region 154, as a CMOS device, a p-channel MOS- FET (hereinafter referred to as a PMOS) 400 and an n-channel MOSFET (hereinafter referred to as an NMOS) 500 are formed.

An oxide film 111 on the substrate surface, a third interlayer insulator film 109 and a passivation film 110 are common to the TL-IGBT/C 200, the PMOS 400 and the NMOS 500. In the second element-forming region 154, the PMOS 400 and the NMOS 500 are isolated from each other by a selectively oxidized film 160 provided by LOCOS (local oxidation of silicon).

The PMOS 400 is formed in an $n^-$-well region 155 provided in a $p^-$-semiconductor layer 101. In the surface layer of the $n^-$-well region 155, a $p^+$-source region 401 and a $p^+$-drain region 402 are formed away from each other, separated by a channel region of the $n^-$-well region 155.

A gate electrode 404 is formed over the channel region, with a gate insulator film 403 separating them. A source electrode 405 penetrates through the third interlayer insulator film 109 and the oxide film 111 so as to be electrically connected to the $p^+$-source region 401. A drain electrode 406 also penetrates through the third interlayer insulator film 109 and the oxide film 111 so as to be electrically connected to the $p^+$-drain region 402.

The NMOS 500 is formed in a $p^-$-well region 156 provided in the $p^-$-semiconductor layer 101. An $n^+$-source region 501 and an $n^+$-drain region 502 are formed in the surface layer of the $p^-$-well region 156, separated from each other by a channel region of the $p^-$-well region 156.

A gate electrode 504 is formed over the latter channel region, with a gate insulator film 503 between them. A source electrode 505 penetrates through the third interlayer insulator film 109 and the oxide film 111 so as to be electrically connected to the $n^+$-source region 501. A drain electrode 506 penetrates through the third interlayer insulator film 109 and the oxide film 111 electrically connected to the $n^+$-drain region 502. The arrangement of the TL-IGBT/C 200 has been explained above with regard to the first mode. Thus, an explanation thereof is omitted here.

Figure 21:
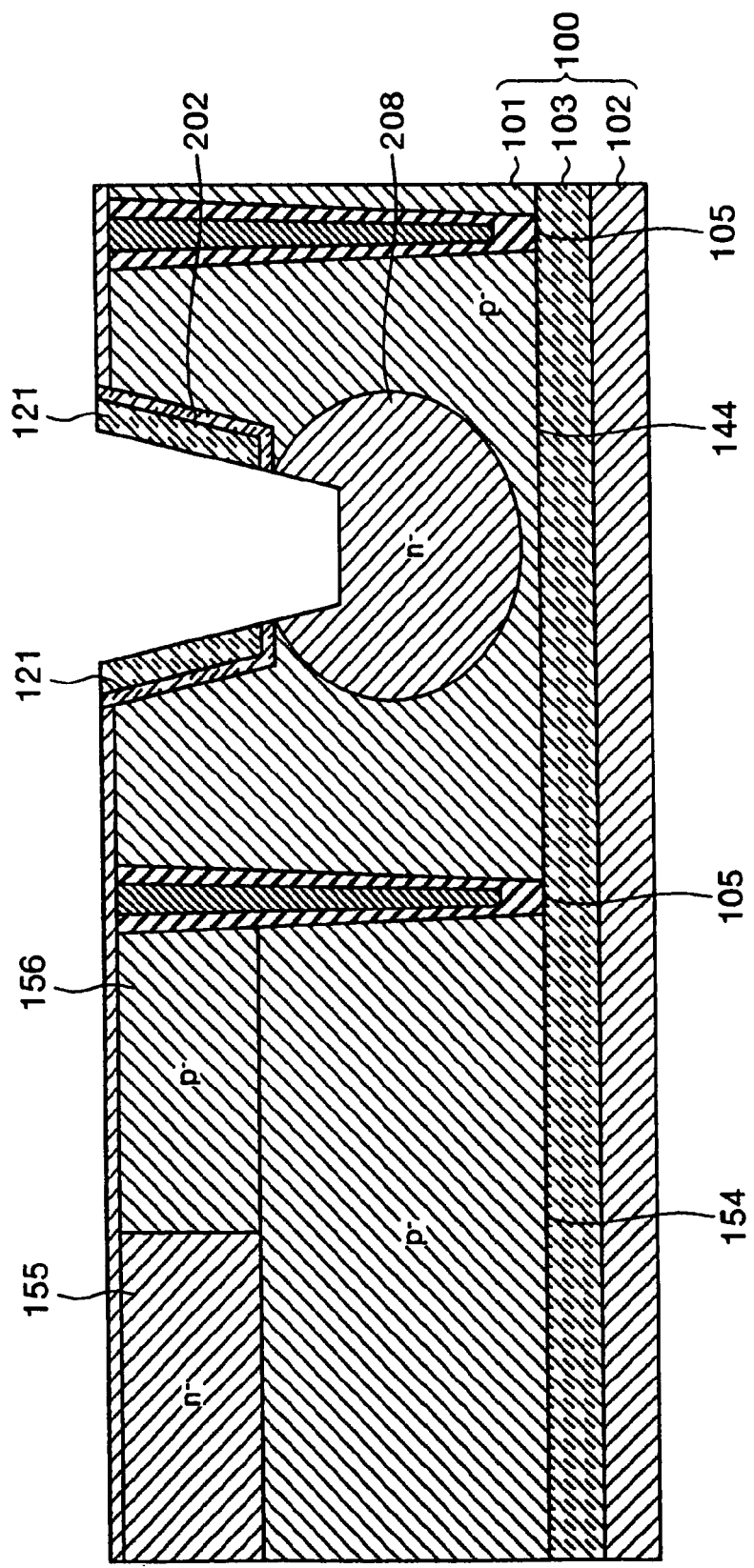
FIG. 21 is a cross-sectional view showing a state of the semiconductor device according to the sixth mode in a process step in the course of manufacturing.

Next, the process of manufacturing the semiconductor device, in which the above-described TL-IGBT/C 200, PMOS 400 and NMOS 500 are integrated, is explained. FIGS. 21 to 24 are cross-sectional views showing states of the semiconductor device during the course of its manufacture. First, as shown in FIG. 21, a trench isolation region 105 is formed in the SOI substrate 100 to provide a plurality of element-forming regions, including the first element-forming region 144 and the second element-forming region 154. Following this, the $n^-$-well region 155 and the $p^-$-well region 156 are formed in the second element-forming region 154.

Following this, like in the first mode, in the first element-forming region 144, formation of a first step trench, formation of a mask for etching a second step trench with a nitride film 121, formation of a trench 202 by forming a second step trench, formation of an $n^-$-drift region 208 and removal of an oxide film on the inner wall of the second step trench, are carried out in the stated order. The state upon completion of these procedures is shown in FIG. 21.

Figure 22:
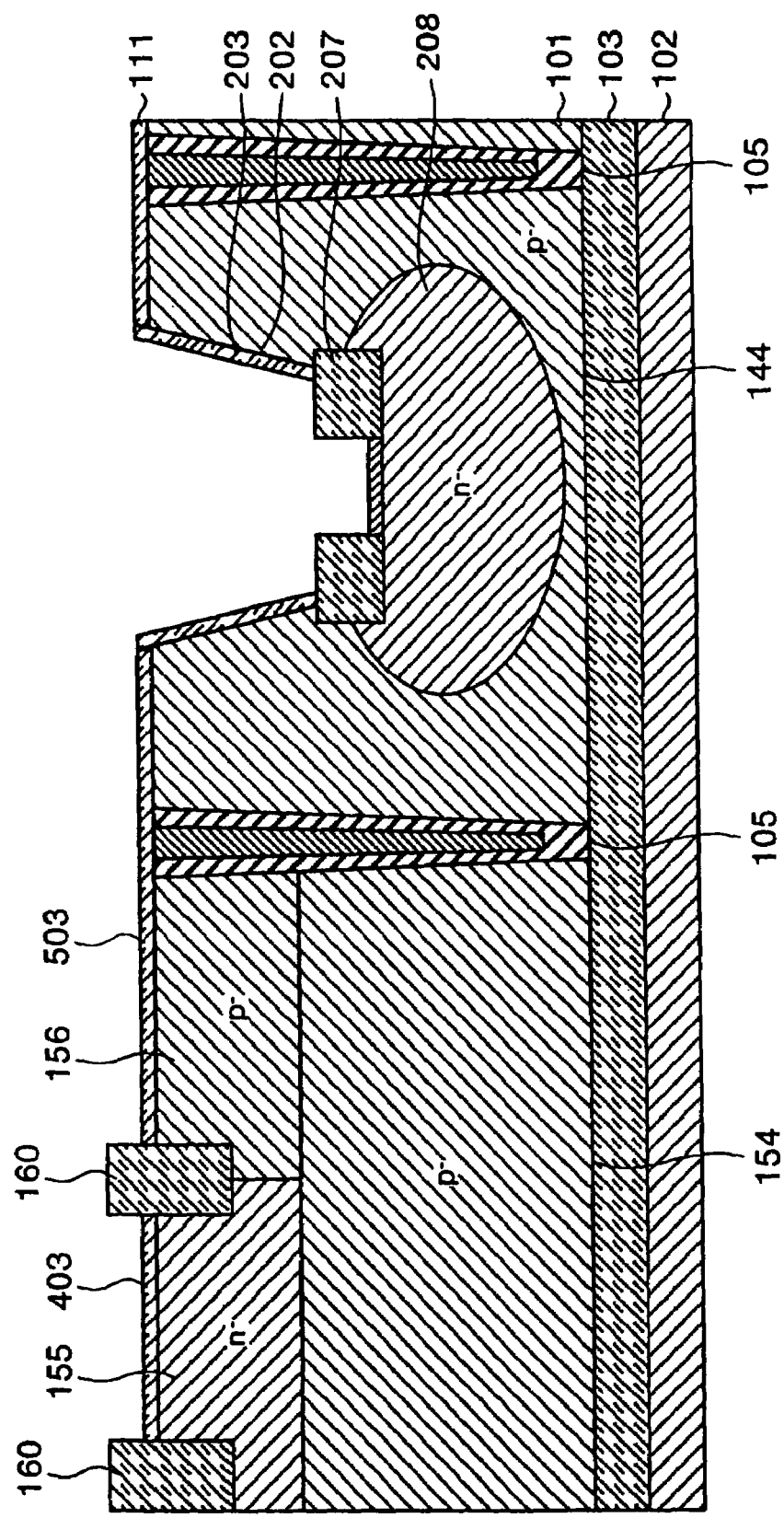
FIG. 22 is a cross-sectional view showing a state of the semiconductor device according to the sixth mode in the process step subsequent to the step of the state shown in FIG. 21 in the course of manufacturing.

Subsequent to this, as shown in FIG. 22, a second interlayer insulator 207 is formed in the lower half section of the trench 202, and the selectively oxidized film 160 is formed in the second element-forming region 154. Then, the nitride film 121 and a thin oxide film on the sidewall of the trench 202 are removed before gate oxidation is carried out. This forms the gate insulator film 203 of the TL-IGBT/C 200, the gate insulator film 403 of the PMOS 400 and the gate insulator film 503 of the NMOS 500. The state of the device up to this point of its manufacture is shown in FIG. 22.

Figure 23:
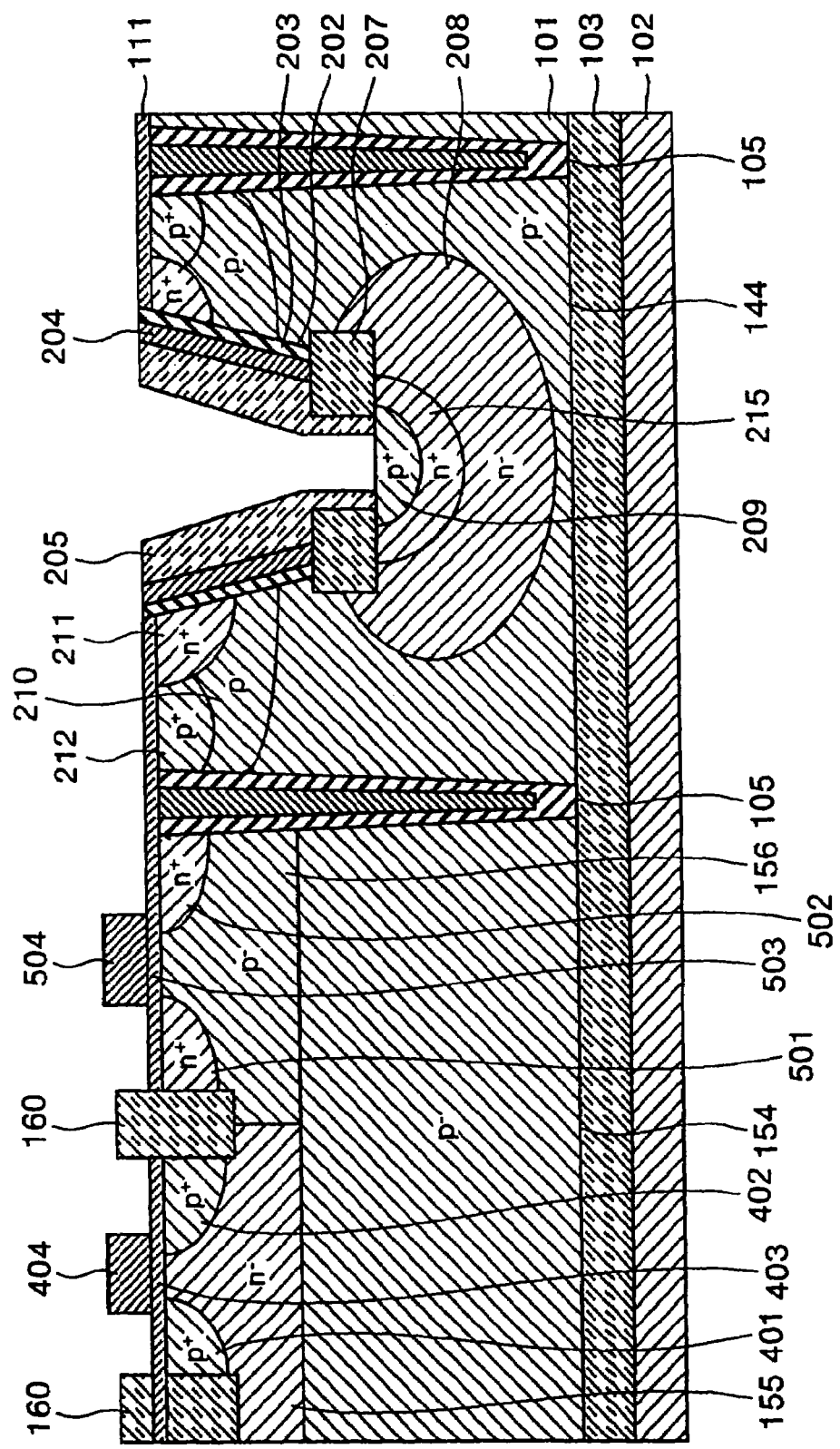
FIG. 23 is a cross-sectional view showing a state of the semiconductor device according to the sixth mode in the process step subsequent to the step of the state shown in FIG. 22 in the course of manufacturing.

Next, as shown in FIG. 23, the gate electrode 204 of the TL-IGBT/C 200, the gate electrode 404 of the PMOS 400 and the gate electrode 504 of the NMOS 500 are formed. Then, the p-base region 210, the $n^+$-emitter region 211 and the $p^+$-plug region 212 of the TL-IGBT/C 200 are formed. Thereafter, inside the trench 202, a first interlayer insulator film 205 is formed.

Following this, on the underside of the bottom of the trench 202, an $n^+$-buffer region 215 and a $p^+$-collector region 209 are formed. Moreover, the $p^+$-source region 401 and the $p^+$-drain region 402 of the PMOS 400 are formed, and the $n^-$-source region 501 and the $n^+$-drain region 502 of the NMOS 500 are formed. The state of the manufacture up to this point is shown in FIG. 23.

Figure 24:
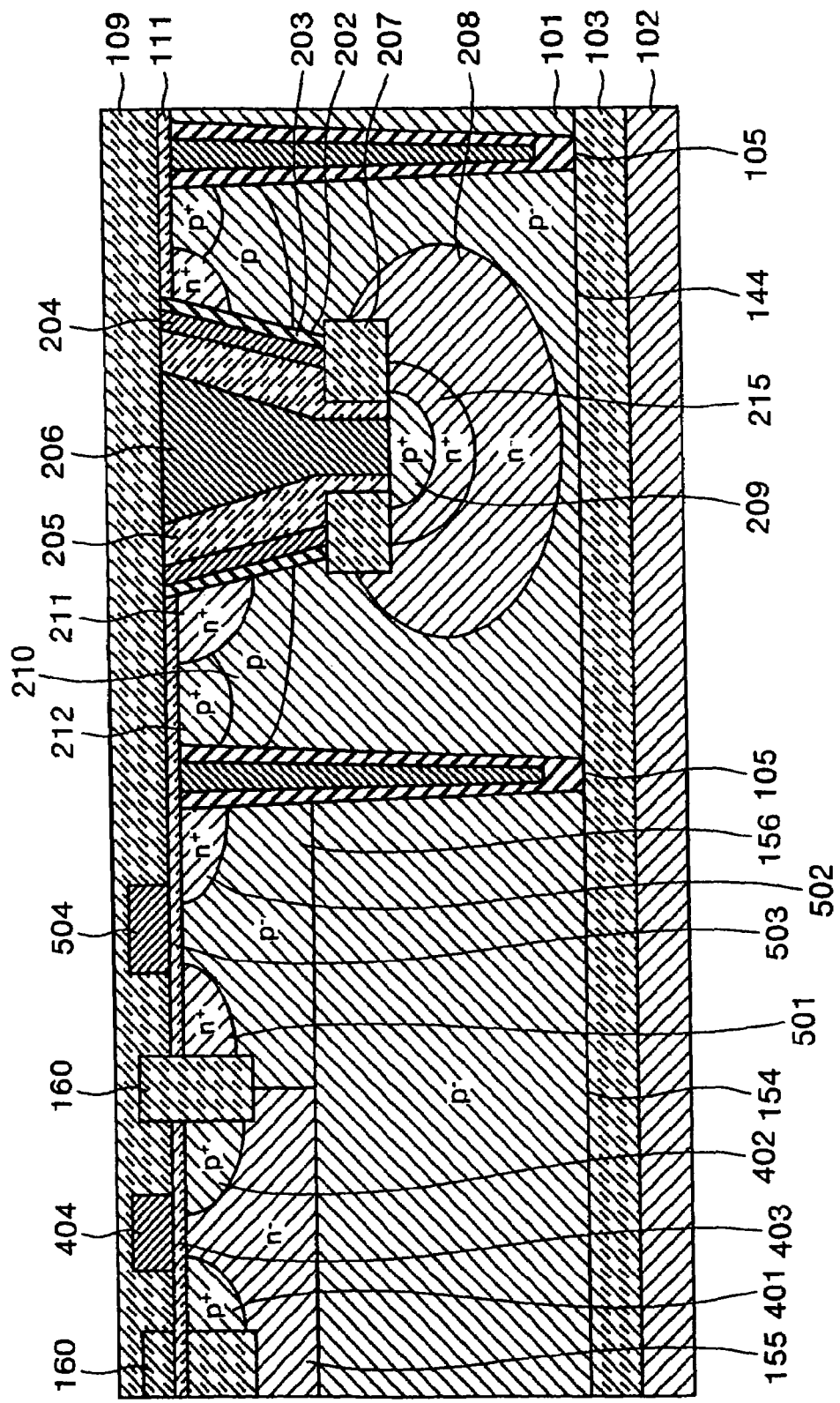
FIG. 24 is a cross-sectional view showing a state of the semiconductor device according to the sixth mode in the process step subsequent to the step of the state shown in FIG. 23 in the course of manufacturing.

Subsequently, as shown in FIG. 24, the trench 202 is filled with a buried electrode 206 and etch back is carried out to smooth the surface of the SOI substrate 100. Then, the third interlayer insulator film 109 is deposited. The state up to this point of the device being manufactured is shown in FIG. 24.

Following this, in the last stages of the manufacture of the device shown in FIG. 20, contact holes are opened in the third interlayer insulator film 109. Then, the collector electrode 213 and the emitter electrode 214 of the TL-IGBT/C 200, the source electrode 405 and the drain electrode 406 of the PMOS 400, and the source electrode 505 and the drain electrode 506 of the NMOS 500, are formed in the contact holes. Finally, the passivation film 110 is deposited to thereby complete the TL-IGBT/C 200 with the arrangement shown in FIG. 20.

According to the above-explained sixth mode, the TL-IGBT/C 200 has the gate electrode 204 in the trench 202 to provide a current path on the sidewall or near the bottom of the trench 202. This allows the TL-IGBT/C 200 to be highly integrated and, along with this, to have an on-resistance lower than those of a TLPM and a planar lateral IGBT. Moreover, according to the sixth mode, since the TL-IGBT/C 200 is formed on the SOI substrate 100, a substrate current is eliminated to enable realization of a reduction in switching losses and a high operation speed. Furthermore, according to the sixth mode, since the TL-IGBT/C 200 and the CMOS device are isolated from each other by dielectric isolation with the trench isolation region 105, latchup due to interaction between the TL-IGBT/C 200 and the CMOS device can be prevented.

Figure 25:
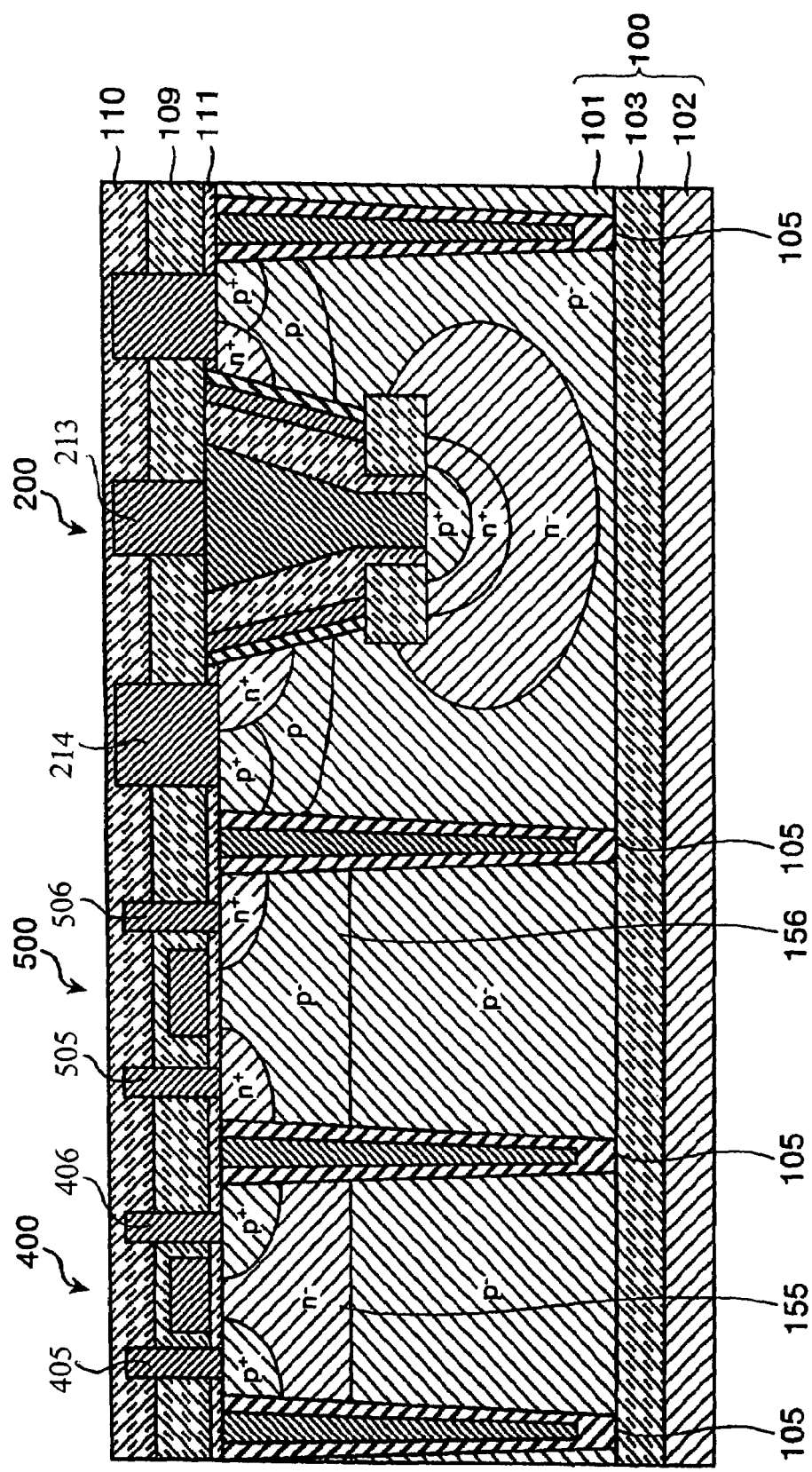
FIG. 25 is a cross-sectional view showing another arrangement of the semiconductor device according to the sixth mode.

Furthermore, like the above-explained other modes, an arrangement can be presented in which no $n^+$-buffer region 215 is provided in the TL-IGBT/C 200. Moreover, referring to FIG. 25, an arrangement can be provided as the semiconductor device in which the PMOS 400 and the NMOS 500 are not isolated by junction isolation but rather are isolated by dielectric isolation with the trench isolation region 105. This makes it possible to prevent latchup due to a parasitic thyristor.

In addition, the p-TL-IGBT/C, the n-TL-IGBT/E or the p-TL-IGBT/E can be integrated with the CMOS device. Moreover, two or more devices of the n-TL-IGBT/C, the p-TL-IGBT/C, the n-TL-IGBT/E and the p-TL-IGBT/E can be integrated with the CMOS device. Furthermore, these IGBT devices can be integrated with only the PMOS or with only the NMOS, without any limitation to the CMOS device.

Seventh Mode

Figure 26:
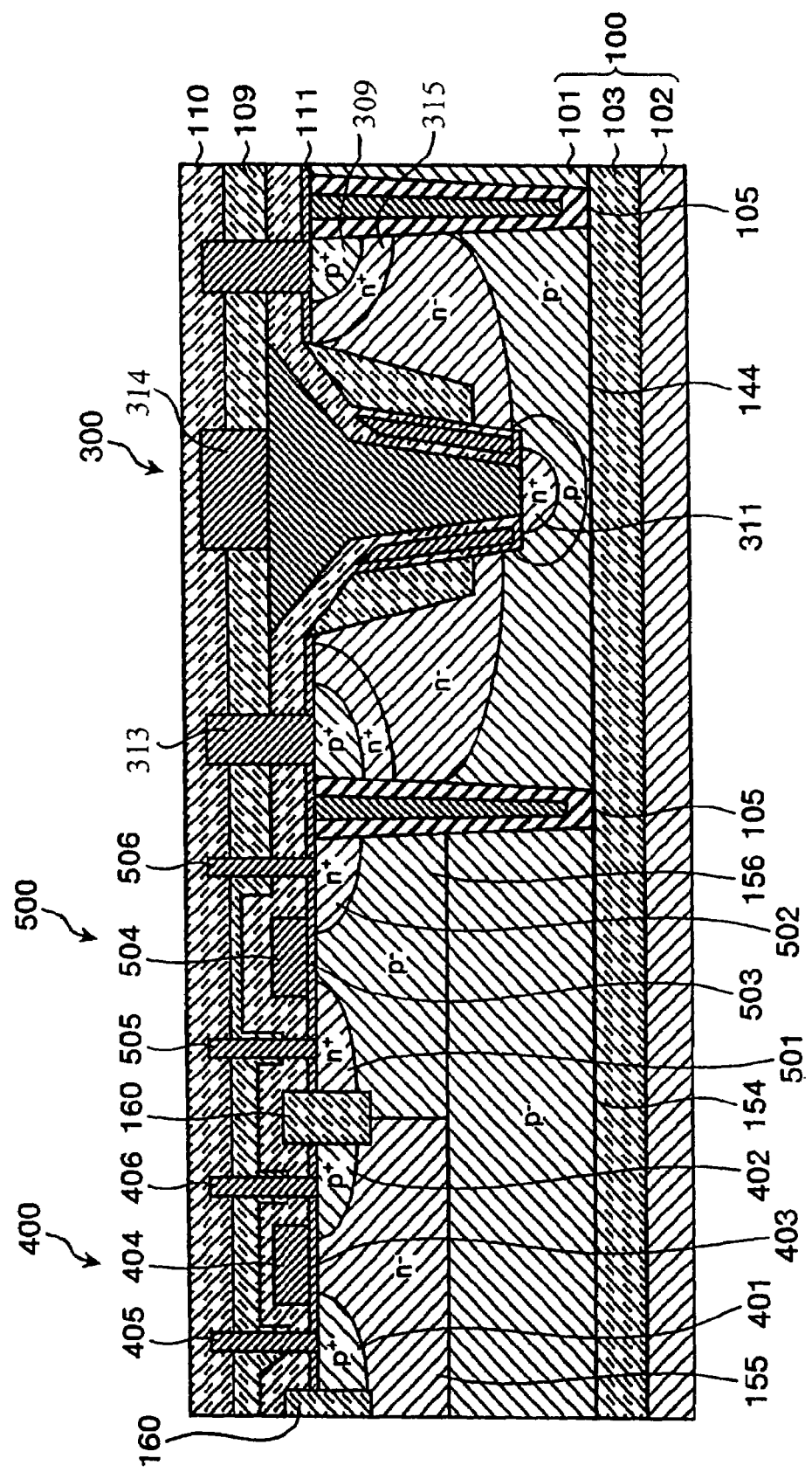
FIG. 26 is a cross-sectional view showing an arrangement of a semiconductor device according to a seventh mode for carrying out the invention, in a first cross section.
Figure 27:
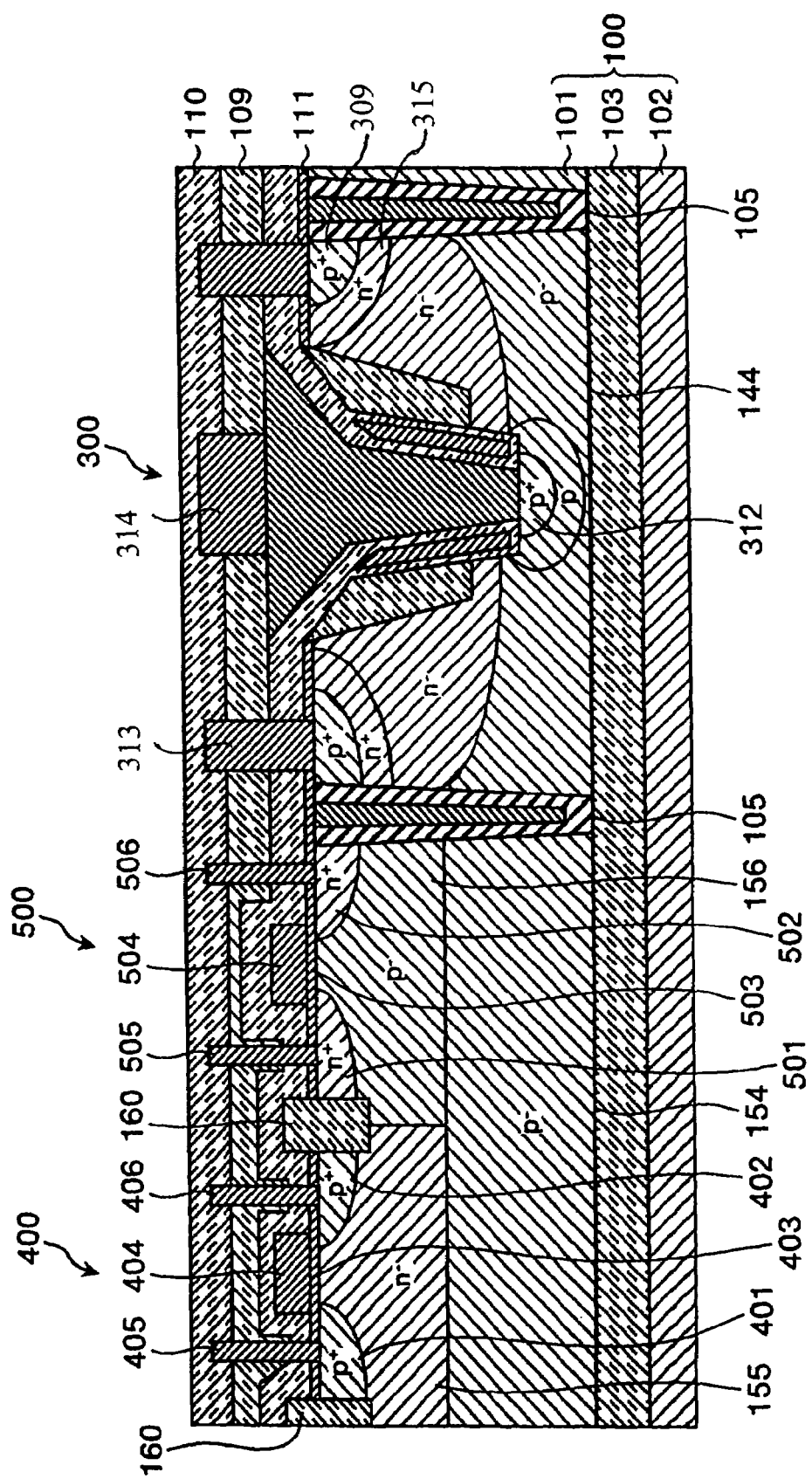
FIG. 27 is a cross-sectional view showing an arrangement of the semiconductor device according to the seventh mode, in a second cross section.

FIGS. 26 and 27 are cross-sectional views showing arrangements of a semiconductor device according to a seventh mode for carrying out the invention. FIGS. 26 and 27 show arrangements in first and second cross sections, respectively, positioned in different longitudinal regions of a trench. The semiconductor device of the seventh mode is a device in which a TL-IGBT/E provided with an emitter contact at the bottom of a trench and a CMOS device for controlling the TL-IGBT/E are integrated together on an SOI substrate.

As shown in FIG. 26 and FIG. 27, the SOI substrate 100 is divided into a plurality of island-like element-forming regions, a first element-forming region 144 and a second element-forming region 154, by a trench isolation region 105. This is similar to the third mode. In the seventh mode, in the first element-forming region 144, the TL-IGBT/E 300 of the second mode, for example, is formed. In the second element-forming region 154, as a CMOS device, there are formed a PMOS 400 and an NMOS 500.

An oxide film 111 on the substrate surface, a third interlayer insulator film 109 and a passivation film 110 are common to the TL-IGBT/E 300, the PMOS 400 and the NMOS 500. In the second element-forming region 154, the PMOS 400 and the NMOS 500 are isolated from each other by a selectively oxidized film 160.

The arrangement of the TL-IGBT/E 300 is as was explained above with regard to the second mode. Moreover, the arrangements of the PMOS 400 and the NMOS 500 areas were explained above with regard to the sixth mode. Therefore, explanations thereof are omitted here.

Figure 30:
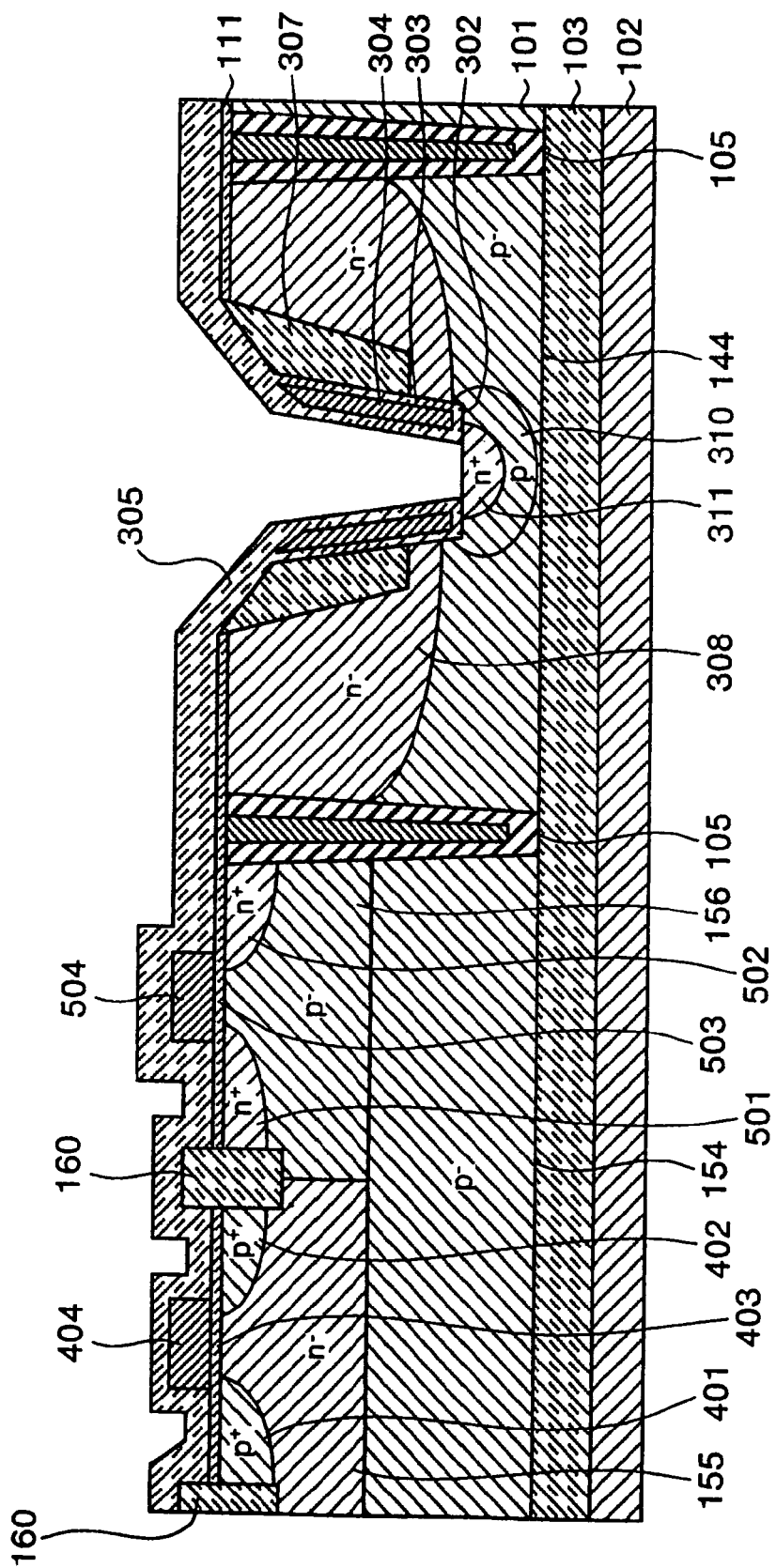
FIG. 30 is a cross-sectional view showing a state of the semiconductor device according to the seventh mode in the process step subsequent to the step of the state shown in FIG. 29, in the course of manufacturing in the first cross section.
Figure 31:
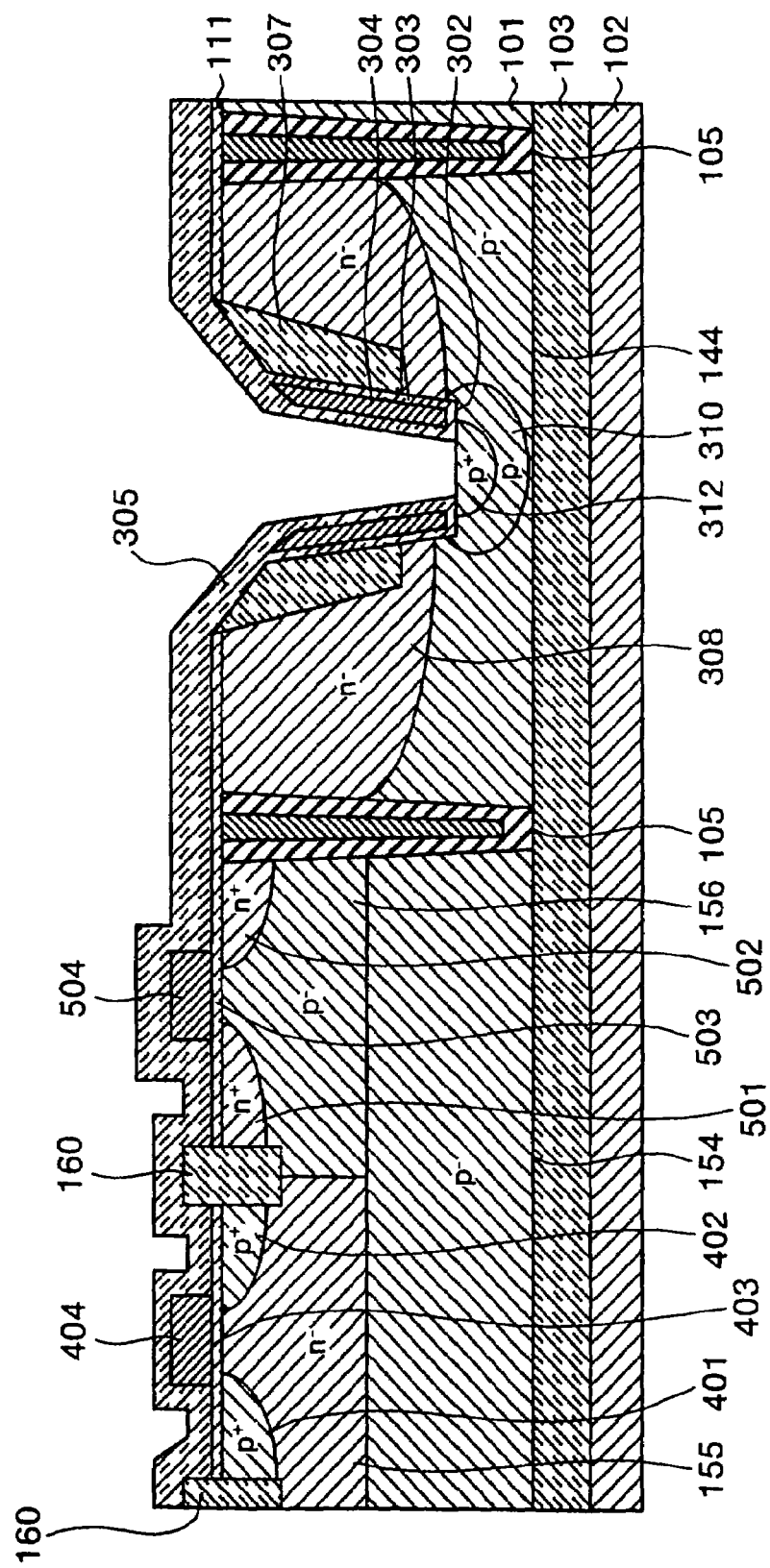
FIG. 31 is a cross-sectional view showing a state of the semiconductor device according to the seventh mode in the process step subsequent to the step of the state shown in FIG. 29, in the course of manufacturing in the second cross section.
Figure 32:
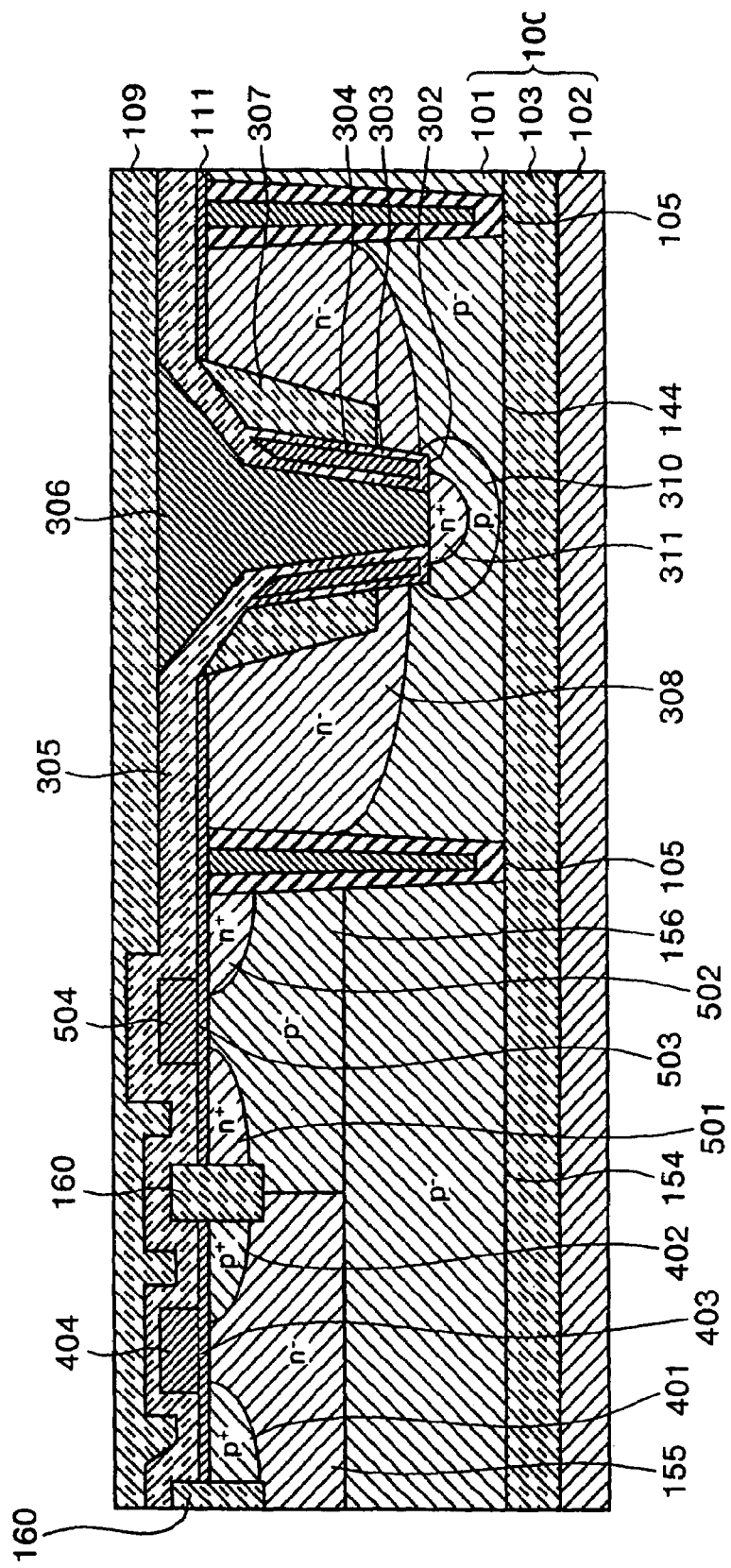
FIG. 32 is a cross-sectional view showing a state of the semiconductor device according to the seventh mode in the process step subsequent to the step of the state shown in FIG. 30, in the course of manufacturing in the first cross section.
Figure 33:
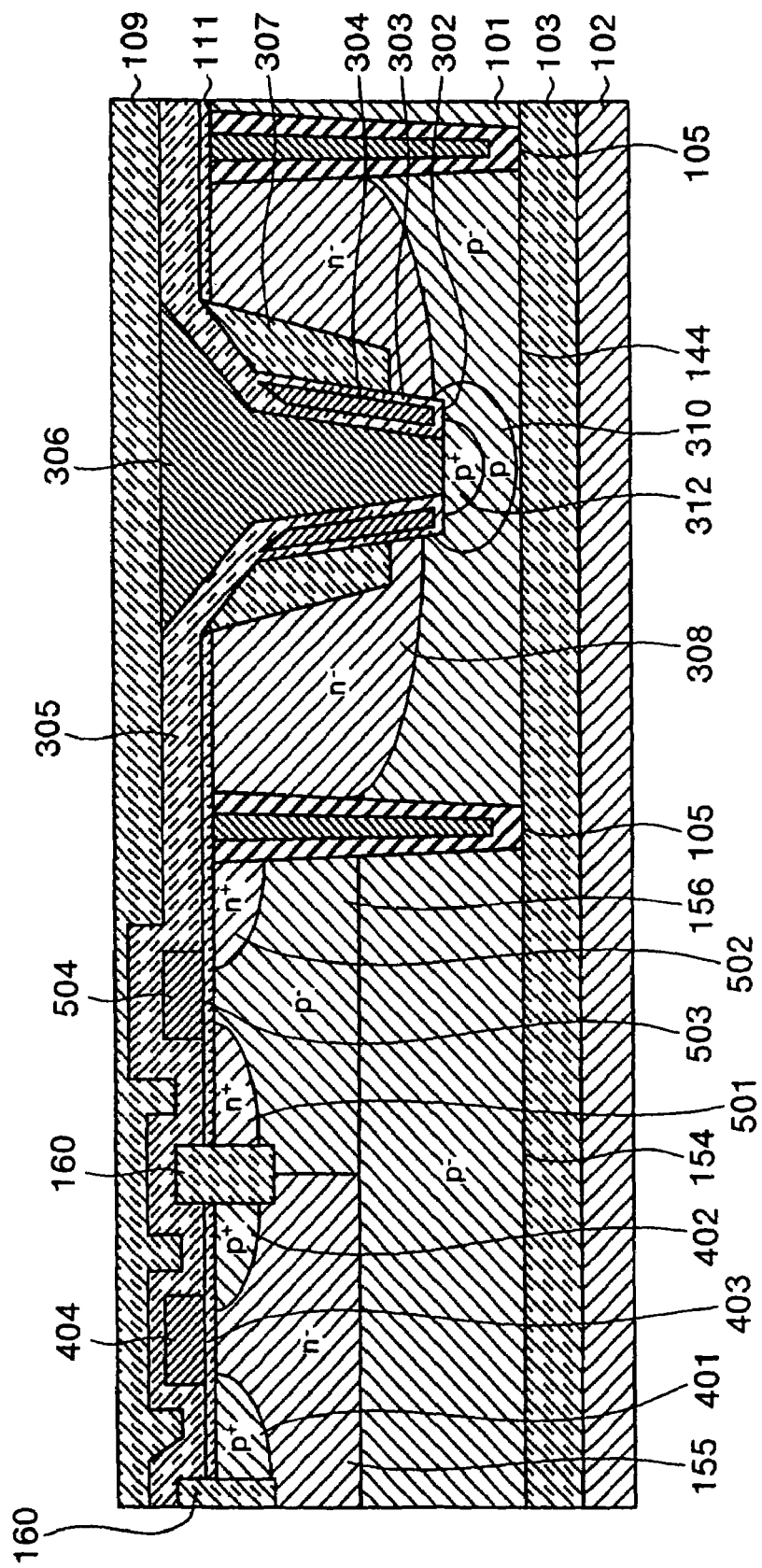
FIG. 33 is a cross-sectional view showing a state of the semiconductor device according to the seventh mode in the process step subsequent to the step of the state shown in FIG. 31 in the course of manufacturing in the second cross section.

Next, the process of manufacturing the semiconductor device, in which the TL-IGBT/E 300, the PMOS 400 and the NMOS 500 with the above-described arrangements are integrated together, is explained. FIGS. 28 to 33 are cross-sectional views showing states of the semiconductor device during the course of its manufacture. Here, in the process step in which the cross-sectional arrangement is in the state as shown in each of FIG. 28 and FIG. 29, the state of the arrangement appears the same in the first and second cross sections. Moreover, FIGS. 30 and 31 show states of cross-sectional arrangements in the same process step. FIG. 30 shows the arrangement in the first cross section and FIG. 31 shows the arrangement in the second cross section. The same is true of the arrangements shown in FIGS. 32 and 33, where FIG. 32 shows the arrangement in the first cross section and FIG. 33 shows the arrangement in the second cross section.

Figure 28:
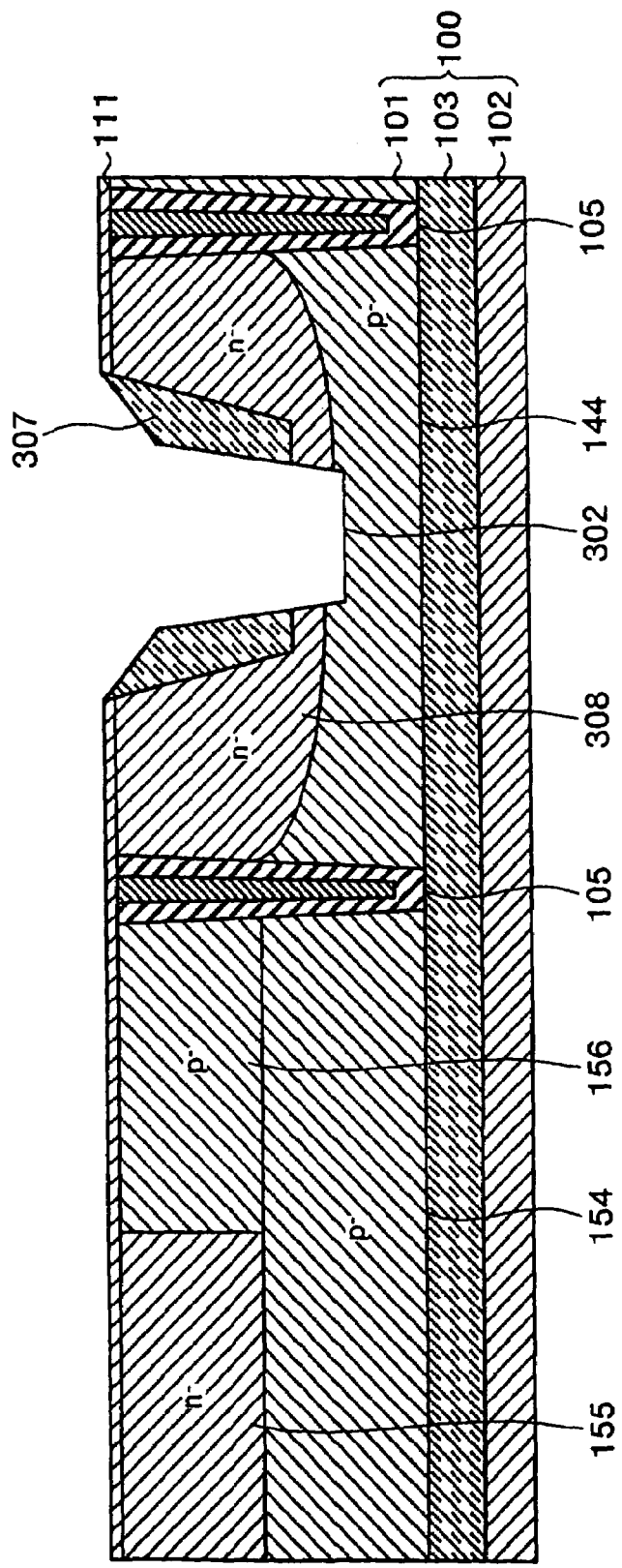
FIG. 28 is a cross-sectional view showing a state of the semiconductor device according to the seventh mode in a process step in the course of manufacturing, in each of the first and second cross sections.

First, as shown in FIG. 28, the trench isolation region 105 is formed in the SOI substrate 100 to provide a plurality of element-forming regions, including the first element-forming region 144 and the second element-forming region 154. Following this, an n⁻-well region 155 and a p⁻-well region 156 are formed in the second element-forming region 154. Then, as in the second mode, formation of a first step trench, formation of an n⁻-drift region 308, formation of a second interlayer insulator film 307, formation of a trench 302 by forming a second step trench, and removal of an oxide film on the inner wall of the second step trench, are carried out in the first element-forming region 144, in the stated order. The state up to this point of the manufacturing process is shown in FIG. 28.

Figure 29:
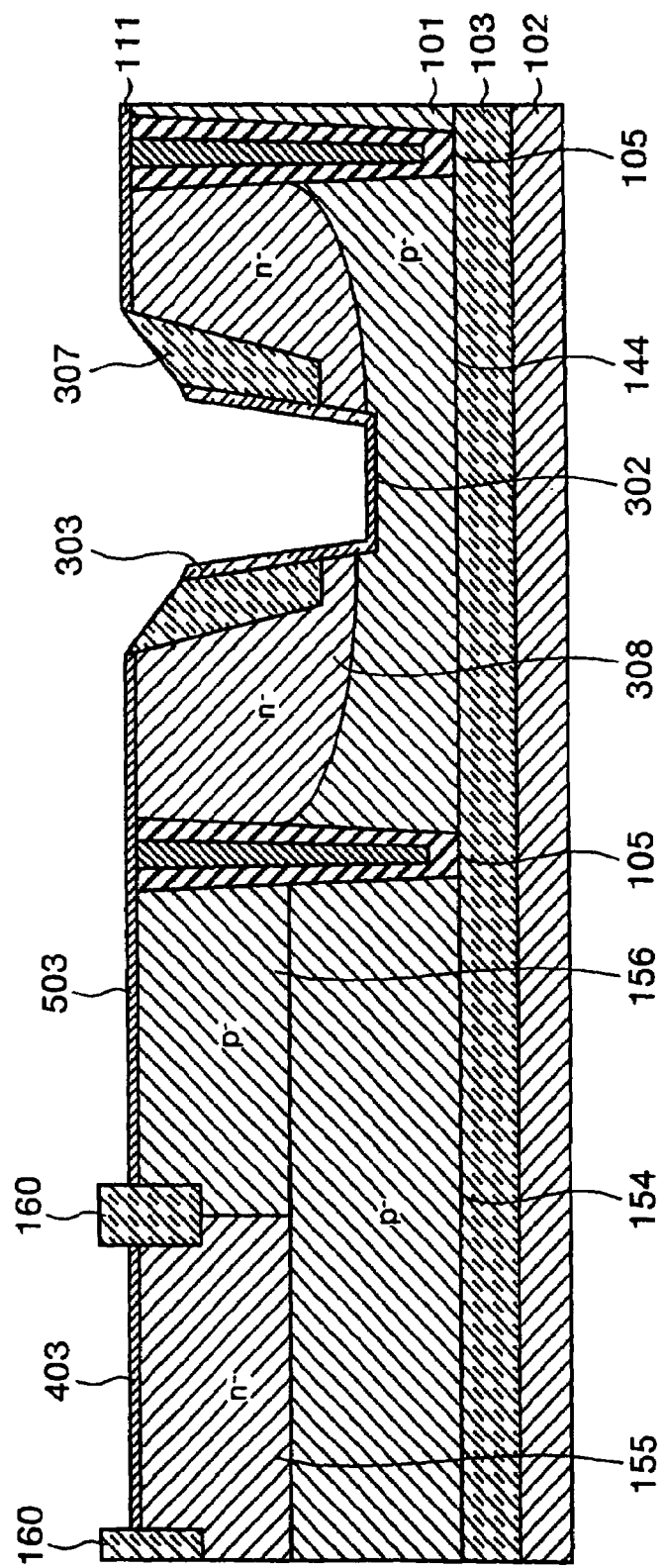
FIG. 29 is a cross-sectional view showing a state of the semiconductor device according to the seventh mode in the process step subsequent to the step of the state shown in FIG. 28 in the course of manufacturing, in each of the first and second cross sections.

Subsequent to this, as shown in FIG. 29, the selectively oxidized film 160 is formed in the second element-forming region 154. Then, gate oxidation is carried out to form the gate insulator film 303 of the TL-IGBT/E 300, the gate insulator film 403 of the PMOS 400 and the gate insulator film 503 of the NMOS 500. The state up to this point of the manufacturing process is shown in FIG. 29. Next, as shown in FIGS. 30 and 31, the gate electrode 304 of the TL-IGBT/E 300, the gate electrode 404 of the PMOS 400 and the gate electrode 504 of the NMOS 500 are formed.

Then, the p-base region 310, the n⁺-emitter region 311 and the p⁺-plug region 312 of the TL-IGBT/E 300 are formed. Thereafter, inside the trench 302, a first interlayer insulator film 305 is formed. Following this, the p⁺-source region 401 and the p⁺-drain region 402 of the PMOS 400 are formed, and the n⁺-source region 501 and the n⁺-drain region 502 of the NMOS 500 are formed. The state up to this point in the manufacturing process is shown in FIG. 31.

Subsequent to this, as shown in FIGS. 32 and 33, the trench 302 is filled with a buried electrode 306 and etch back is carried out to smooth the surface of the SOI substrate 100. Then, the third interlayer insulator film 109 is deposited. The states up to this of the manufacturing process are shown in FIGS. 32 and 33. Following this, contact holes are opened in the third interlayer insulator film 109. Then, the n⁺-buffer region 315 and the p⁺-collector region 309 of the TL-IGBT/E 300 are formed in the order.

Thereafter, the collector electrode 313 and the emitter electrode 314 of the TL-IGBT/E 300, the source electrode 405 and the drain electrode 406 of the PMOS 400, and the source electrode 505 and the drain electrode 506 of the NMOS 500 are formed. Finally, the passivation film 110 is deposited to thereby complete the semiconductor device with the arrangements shown in FIG. 26 and FIG. 27.

According to the above-explained seventh mode, the TL-IGBT/E 300 has the gate electrode 304 in the trench 302 to provide a current path on the sidewall or near the bottom of the trench 302. This allows the TL-IGBT/E 300 to be highly integrated and, along with this, to have an on-resistance lower than those of a TLPM and a planar lateral IGBT. Moreover, according to the seventh mode, since the TL-IGBT/E 300 is formed on the SOI substrate 100, a substrate current is eliminated to enable realization of a reduction in switching losses and a high operation speed. Furthermore, according to the seventh mode, since the TL-IGBT/E 300 and the CMOS device are isolated from each other by dielectric isolation with the trench isolation region 105, latchup due to interaction between the TL-IGBT/E 300 and the CMOS device can be prevented.

Figure 34:
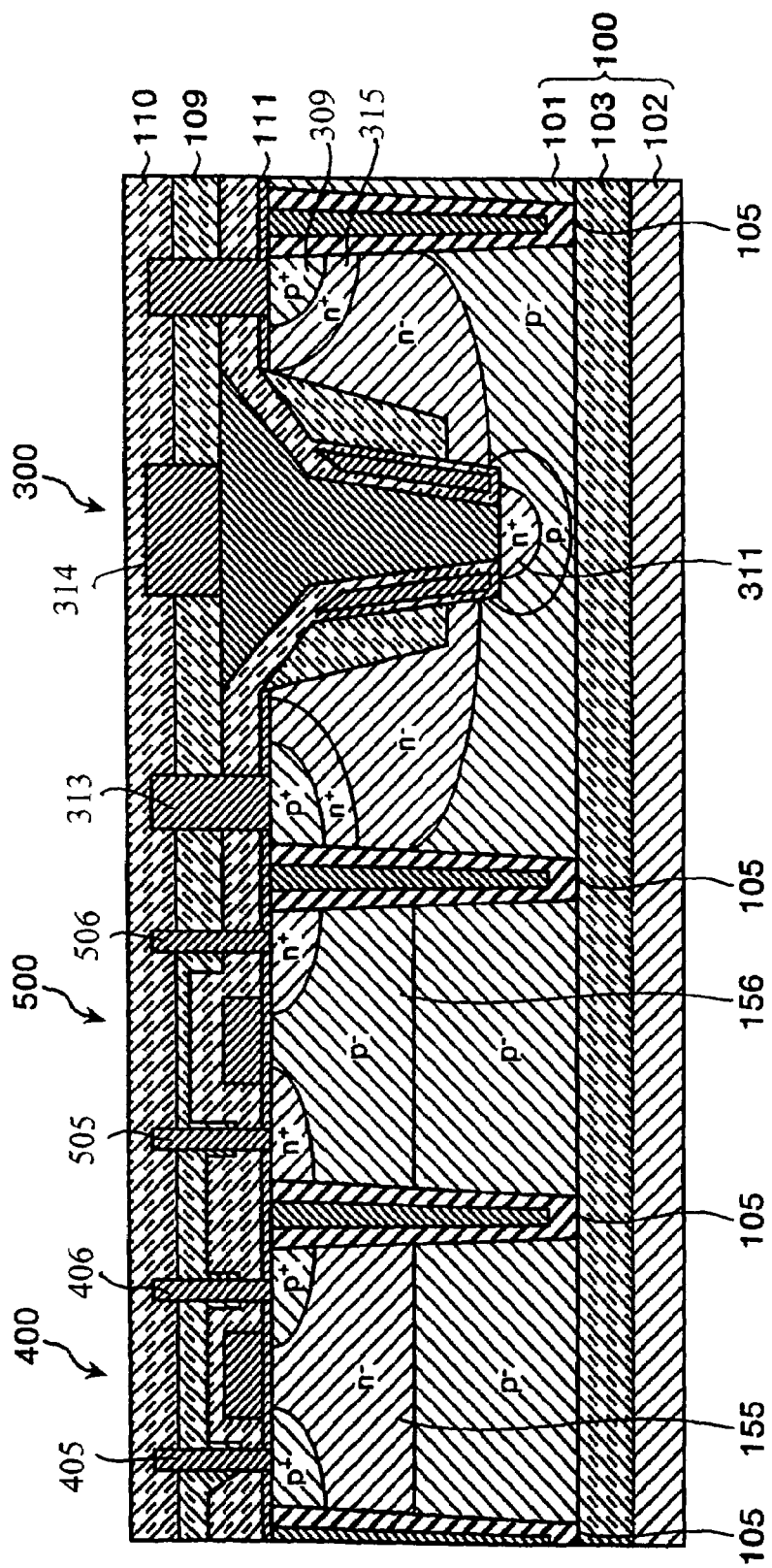
FIG. 34 is a cross-sectional view showing another arrangement of a semiconductor device according to the seventh mode in a cross section corresponding to the first cross section.
Figure 35:
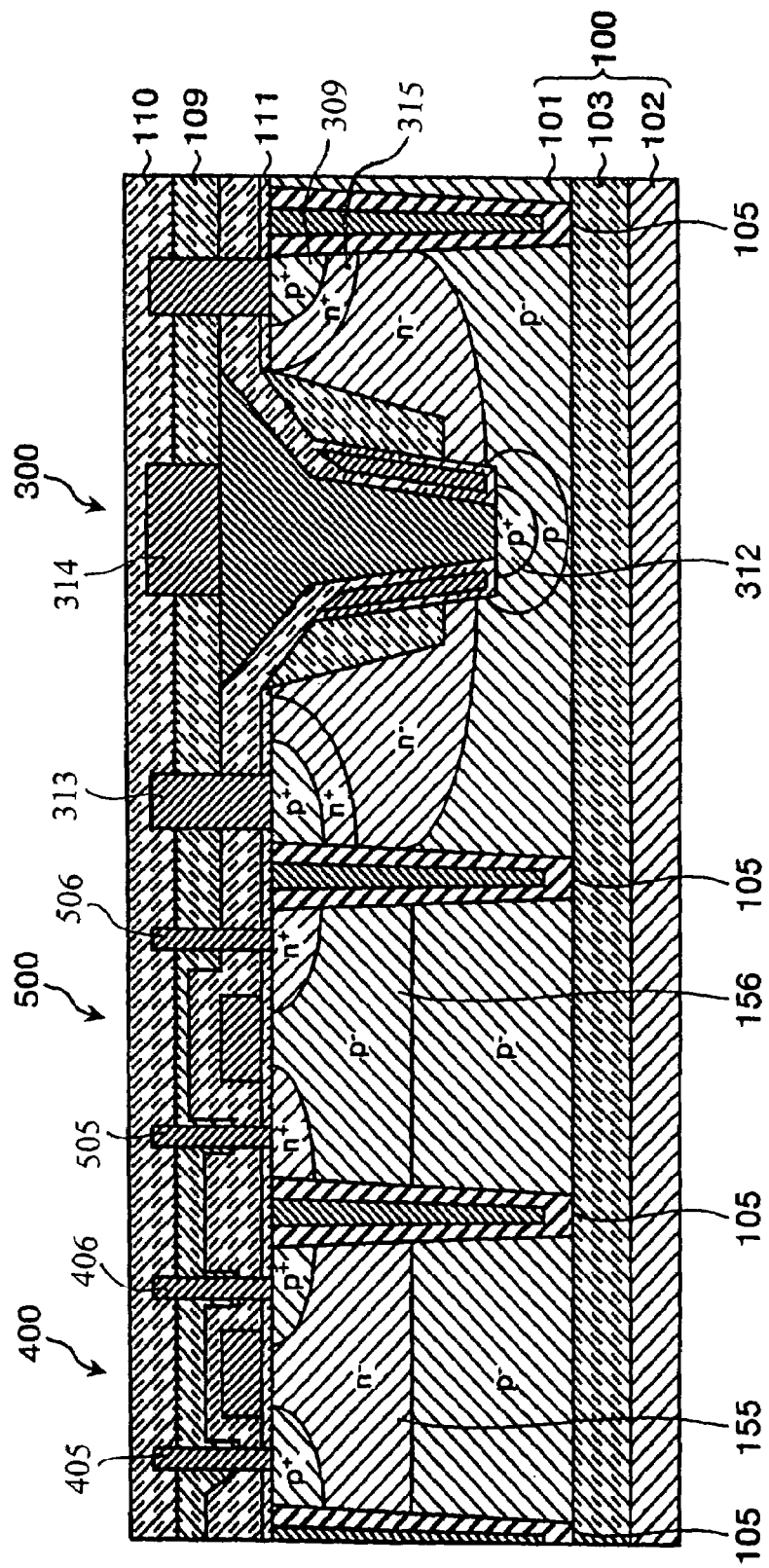
FIG. 35 is a cross-sectional view showing another arrangement of a semiconductor device according to the seventh mode in a cross section corresponding to the second cross section.
Figure 36:
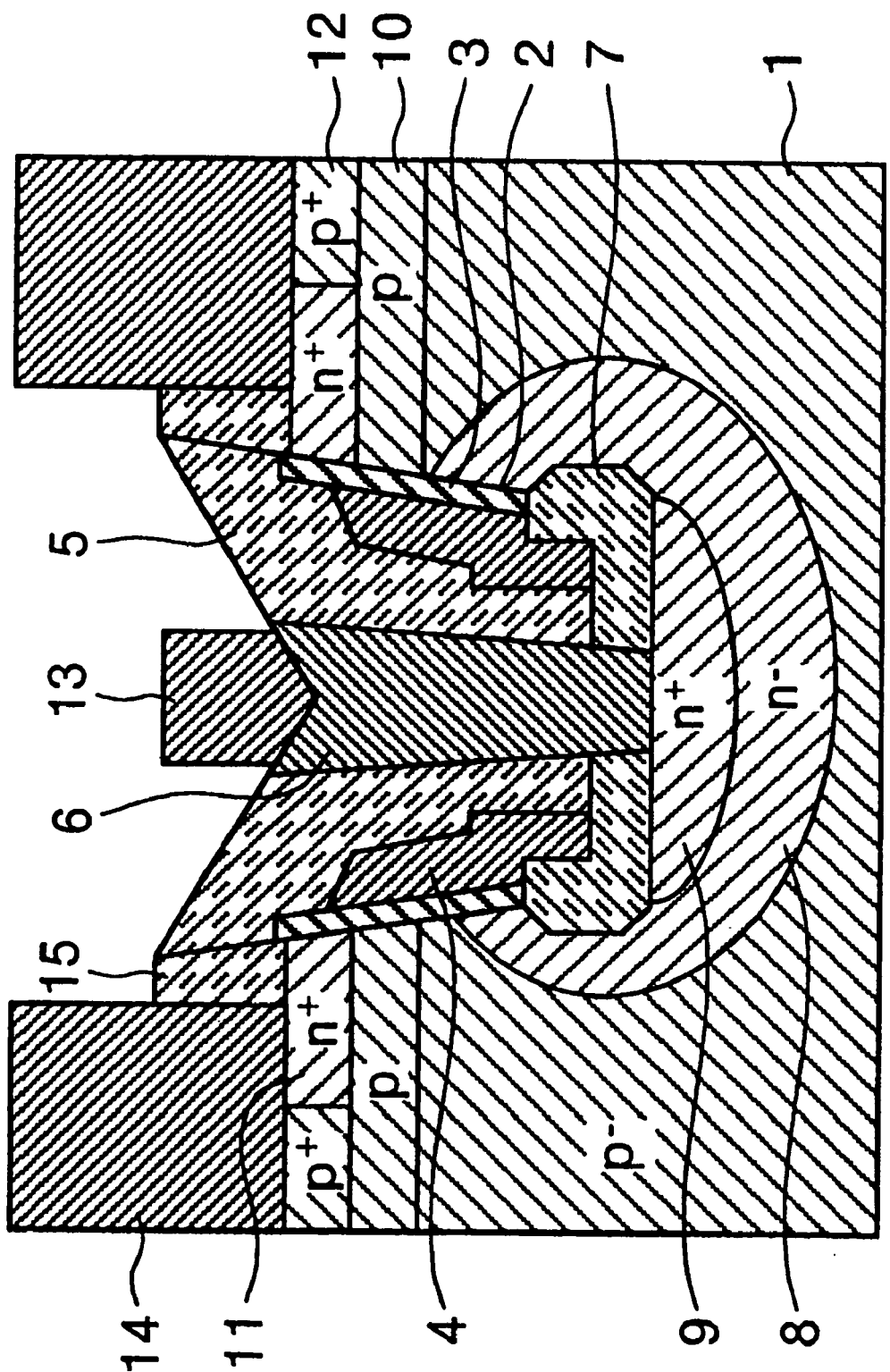
FIG. 36 is a cross-sectional view showing an arrangement of a previous TLPM/D.
Figure 37:
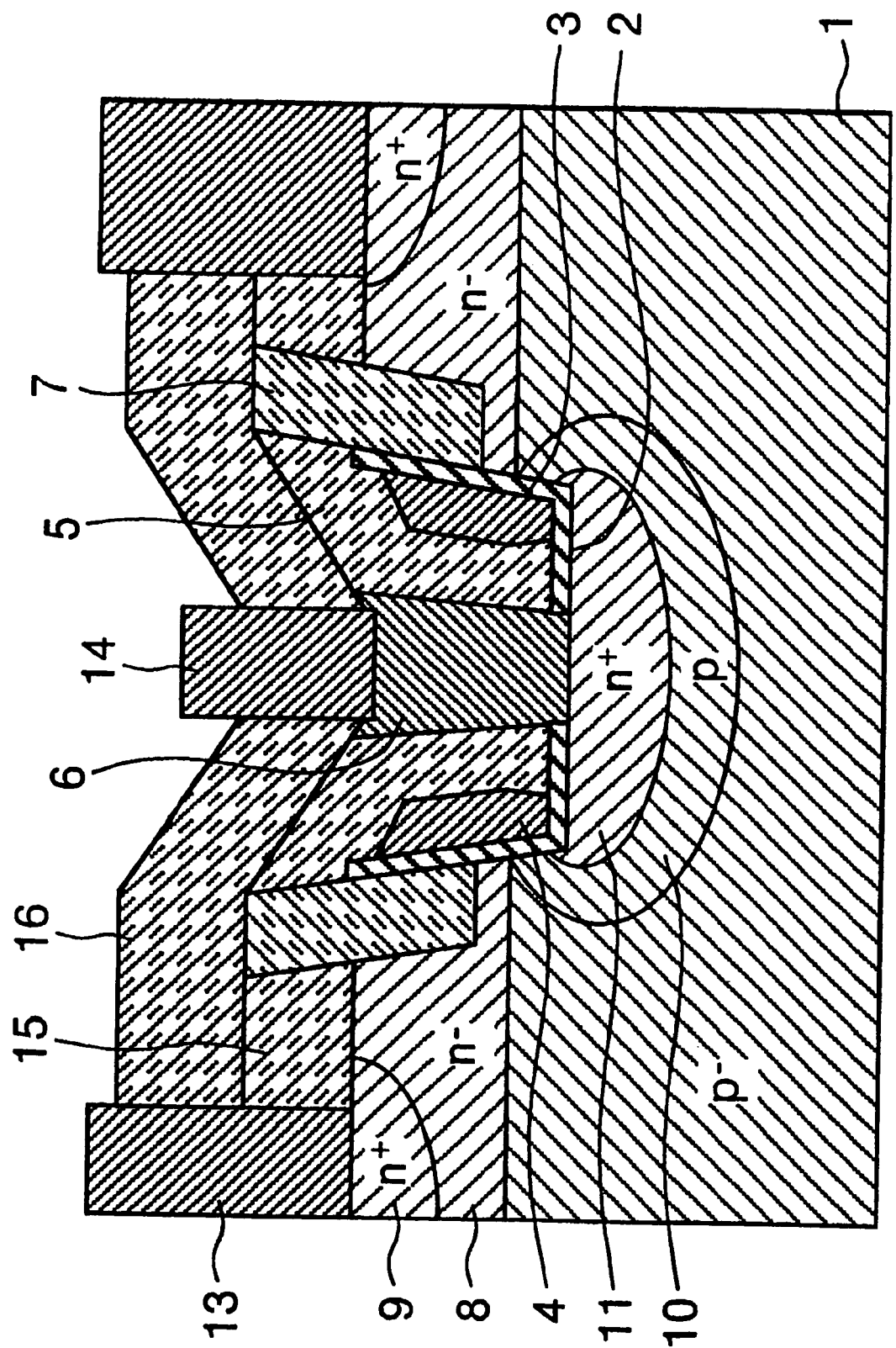
FIG. 37 is a cross-sectional view showing an arrangement of a previous TLPM/S.
Figure 38:
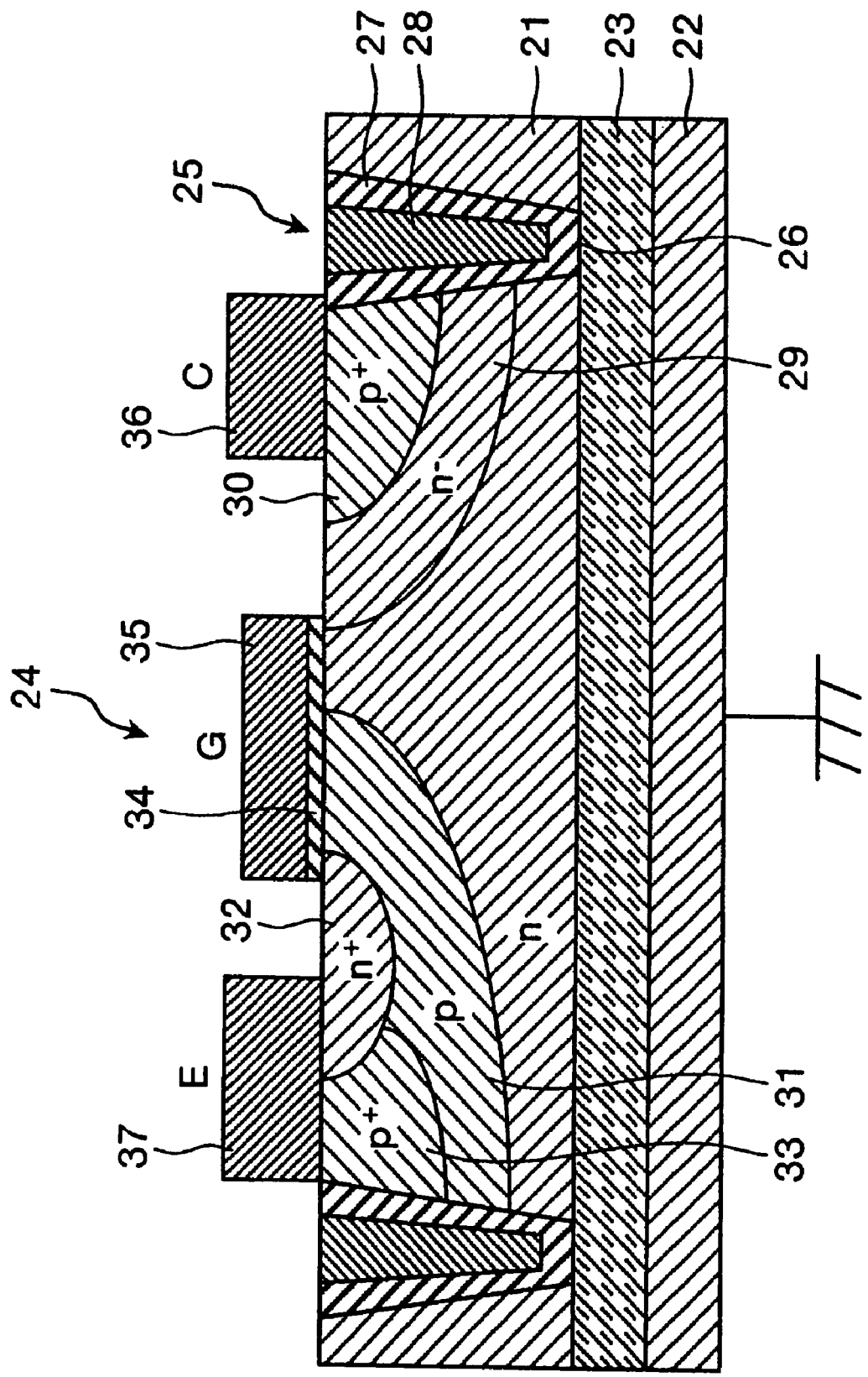
FIG. 38 is a cross-sectional view showing an arrangement of a previous planar lateral IGBT.

Furthermore, like the above-explained other modes, an arrangement can be presented in which no n⁺-buffer region 315 is provided in the TL-IGBT/E 300. Moreover, as the semiconductor device shown in FIG. 34 and FIG. 35, an arrangement can be provided in which the PMOS 400 and the NMOS 500 are not isolated by junction isolation, but rather are isolated by dielectric isolation with the trench isolation region 105. This makes it possible to prevent latchup due to a parasitic thyristor. Here, the arrangement shown in FIG. 34 is that in the cross section corresponding to the first cross section, and the arrangement shown in FIG. 35 is that in the cross section corresponding to the second cross section.

In the foregoing, the invention is not limited to the above-explained embodiments but can be variously modified. For example, in the above-explained embodiments, the first conductivity type was taken as the p-type and the second conductivity type was taken as the n type. However, the invention is valid even with the conductivity types being the reverse of the above.

According to the invention, a semiconductor device provided with the TL-IGBT having the gate electrode in the trench formed in the semiconductor substrate, and having a current path near the sidewall or the bottom of the trench, is obtained. This allows the semiconductor device to be highly integrated and, along with this, to have an on-resistance lower than those of a TLPM and a planar lateral IGBT.

Moreover, by forming the TL-IGBT on the SOI substrate, a substrate current of the TL-IGBT is eliminated to enable realization of a reduction in switching losses and a high operation speed. Furthermore, the TL-IGBTs are isolated from each other by a dielectric isolation technique, by which latchup can be prevented. In addition, the TL-IGBT and the CMOS devices are isolated from each other by the dielectric isolation technique, by which malfunctions due to interaction between transistors can be prevented.

The specification incorporates herein by reference the entire disclosure of Japanese patent application no. 2003-209751, filed Aug. 29, 2003.

The invention claimed is:

1. A semiconductor structure, comprising
a semiconductor layer having a device trench formed therein and a surface;
a semiconductor device formed in the semiconductor layer, including
a collector region of a first conductivity type on an underside of a bottom of the device trench,
an emitter region of a second conductivity type, outside the trench in the surface layer of the semiconductor layer, the second conductivity type being different than the first conductivity type;
a base region of the first conductivity type between the emitter region and the collector region;
a drift region of the second conductivity type between the base region and the collector region;
a gate insulator film inside the device trench;
a gate electrode inside the gate insulator film;
an interlayer insulator film inside the gate electrode;
a buried electrode inside the interlayer insulator film and electrically connected to the collector region at the bottom of the device trench;
a collector electrode electrically connected to the buried electrode; and
an emitter electrode electrically connected to both the emitter region and the base region.

2. The semiconductor structure claimed in claim 1, wherein the semiconductor device further comprises an insulator film, thicker than the gate insulator film, in a lower half section of the device trench.

3. The semiconductor structure claimed in claim 1, further comprising a buffer region of the second conductivity type surrounding the collector region.

4. A semiconductor structure according to claim 1, including an element-forming region and a trench isolation region, the element forming region including the semiconductor device, the trench isolation region isolating the element-forming region from surroundings, the trench isolation region including
an isolation trench penetrating through the semiconductor layer, and
an insulator film formed on an inner wall of the isolation trench.

5. The semiconductor structure claimed in claim 1, further comprising an insulation layer, the semiconductor layer being layered on the insulation layer and formed of a silicon semiconductor material.

6. A semiconductor structure according to claim 1, further comprising:
an insulation layer, the silicon semiconductor layer layered on the insulation layer; and
a trench isolation region dividing the silicon semiconductor layer into a plurality of element-forming regions, including first and second element-forming regions, the trench isolation region including an isolation trench penetrating through the semiconductor layer and an insulator film formed on an inner wall of the isolation trench so as to isolate the element-forming regions from each other by dielectric isolation;
wherein the device trench is a first device trench formed in the first element-forming region, the semiconductor device is a first semiconductor device, the collector region is a first collector region, the emitter region is a first collector region, the base region is a first base region, the drift region is a first drift region, the gate insulator film is a first gate insulator film, the gate electrode is a first gate electrode, the interlayer insulator film is a first interlayer insulator film, the buried electrode is a first buried electrode, the collector electrode is a first collector electrode, and the emitter electrode is a first emitter electrode,
the semiconductor structure further comprising
a second device trench in the second element-forming region; and
a second semiconductor device in the second element-forming region, including
a second collector region of the second conductivity type on an underside of a bottom of the second device trench,
a second emitter region of the first conductivity type, outside the second device trench in the surface layer of the semiconductor layer,
a second base region of the second conductivity type between the second emitter region and the second collector region,
a second drift region of the first conductivity type between the second base region and the second collector region,
a second gate insulator film inside the second device trench,
a second gate electrode inside the second gate insulator film,
a second interlayer insulator film inside the second gate electrode,
a second buried electrode inside the second interlayer insulator film and electrically connected to the second collector region at the bottom of the second device trench,
a second collector electrode electrically connected to the second buried electrode, and
a second emitter electrode electrically connected to both the second emitter region and the second base region.

7. A semiconductor structure according to claim 1, further comprising:
an insulation layer, the silicon semiconductor layer layered on the insulation layer; and
a trench isolation region dividing the silicon semiconductor layer into a plurality of element-forming regions, including first and second element-forming regions, the trench isolation region including an isolation trench penetrating through the semiconductor layer and an insulator film formed on an inner wall of the isolation trench so as to isolate the element-forming regions from each other by dielectric isolation;
wherein the device trench is a first device trench formed in the first element-forming region, the semiconductor device is a first semiconductor device, the collector region is a first collector region, the emitter region is a first collector region, the base region is a first base region, the drift region is a first drift region, the gate insulator film is a first gate insulator film, the gate electrode is a first gate electrode, the interlayer insulator film is a first interlayer insulator film, the buried electrode is a first buried electrode, the collector electrode is a first collector electrode, and the emitter electrode is a first emitter electrode, the semiconductor structure further comprising a second device trench in the second element-forming region;

a second semiconductor device in the second element-forming region, including a second emitter region of the second conductivity type provided on the underside of a bottom of the second device trench, a second collector region of the first conductivity type provided on an outside of the second device trench in the surface layer of the semiconductor layer, a second base region of the first conductivity type provided between the second emitter region and the second collector region, a second drift region of the second conductivity type provided between the second base region and the second collector region, a second gate insulator film provided inside the second device trench, a second gate electrode provided inside the second gate insulator film, a second interlayer insulator film provided inside the second gate electrode, a second buried electrode provided inside the second interlayer insulator film and electrically connected to the second emitter region at the bottom of the second device trench, a second emitter electrode electrically connected to the second buried electrode, and a second collector electrode electrically connected to the second collector region.

8. A semiconductor structure according to claim 1, further comprising:

an insulation layer, the silicon semiconductor layer layered on the insulation layer; and a trench isolation region dividing the silicon semiconductor layer into a plurality of element-forming regions, including first and second element-forming regions, the trench isolation region including an isolation trench penetrating through the semiconductor layer and an insulator film formed on an inner wall of the isolation trench so as to isolate the element-forming regions from each other by dielectric isolation;

wherein the device trench is a first device trench formed in the first element-forming region, the semiconductor device is a first semiconductor device, the collector region is a first collector region, the emitter region is a first collector region, the base region is a first base region, the drift region is a first drift region, the gate insulator film is a first gate insulator film, the gate electrode is a first gate electrode, the interlayer insulator film is a first interlayer insulator film, the buried electrode is a first buried electrode, the collector electrode is a first collector electrode, and the emitter electrode is a first emitter electrode, the semiconductor structure further comprising a second device trench in the second element-forming region;

a second semiconductor device in the second element-forming region, including a second emitter region of the first conductivity type provided on the underside of a bottom of the second device trench, a second collector region of a second conductivity type provided on an outside of the second device trench in the surface layer of the semiconductor layer, a second base region of the second conductivity type provided between the second emitter region and the second collector region, a second drift region of the first conductivity type provided between the second base region and the second collector region, a second gate insulator film provided inside the second device trench, a second gate electrode provided inside the second gate insulator film, a second interlayer insulator film provided inside the second gate electrode, a second buried electrode provided inside the second interlayer insulator film and electrically connected to the second emitter region at the bottom of the second device trench, a second emitter electrode electrically connected to the second buried electrode, and a second collector electrode electrically connected to the second collector region.

9. A semiconductor structure according to claim 1, further comprising:

an insulation layer, the silicon semiconductor layer layered on the insulation layer; and a trench isolation region dividing the silicon semiconductor layer into a plurality of element-forming regions, including first and second element-forming regions, the trench isolation region including an isolation trench penetrating through the semiconductor layer and an insulator film formed on an inner wall of the isolation trench so as to isolate the element-forming regions from each other by dielectric isolation;

wherein the device trench is a first device trench formed in the first element-forming region, the semiconductor device is a first semiconductor device, the collector region is a first collector region, the emitter region is a first collector region, the base region is a first base region, the drift region is a first drift region, the gate insulator film is a first gate insulator film, the gate electrode is a first gate electrode, the interlayer insulator film is a first interlayer insulator film, the buried electrode is a first buried electrode, the collector electrode is a first collector electrode, and the emitter electrode is a first emitter electrode, the semiconductor structure further comprising one of a planar p-channel MOSFET and a planar n-channel MOSFET, formed in the second element-forming region, for controlling the first semiconductor device formed in the first element-forming region.

10. A semiconductor structure according to claim 1, further comprising:

an insulation layer, the silicon semiconductor layer layered on the insulation layer; and a trench isolation region dividing the silicon semiconductor layer into a plurality of element-forming regions, including first and second element-forming regions, the trench isolation region including an isolation trench penetrating through the semiconductor layer and an insulator film formed on an inner wall of the isolation trench so as to isolate the element-forming regions from each other by dielectric isolation;

wherein the device trench is a first device trench formed in the first element-forming region, the semiconductor device is a first semiconductor device, the collector region is a first collector region, the emitter region is a first collector region, the base region is a first base region, the drift region is a first drift region, the gate insulator film is a first gate insulator film, the gate electrode is a first gate electrode, the interlayer insulator film is a first interlayer insulator film, the buried electrode is a first buried electrode, the collector electrode is a first collector electrode, and the emitter electrode is a first emitter electrode, the semiconductor structure further comprising both a planar p-channel MOSFET and a planar n-channel MOSFET, formed in the second element-forming region, for controlling the first semiconductor device formed in the first element-forming region.

11. A semiconductor structure according to claim 1, further comprising:

an insulation layer, the silicon semiconductor layer layered on the insulation layer; and a trench isolation region dividing the silicon semiconductor layer into a plurality of element-forming regions, including first and second element-forming regions, the trench isolation region including an isolation trench penetrating through the semiconductor layer and an insulator film formed on an inner wall of the isolation trench so as to isolate the element-forming regions from each other by dielectric isolation;

wherein the device trench is a first device trench formed in the first element-forming region, the semiconductor device is a first semiconductor device, the collector region is a first collector region, the emitter region is a first collector region, the base region is a first base region, the drift region is a first drift region, the gate insulator film is a first gate insulator film, the gate electrode is a first gate electrode, the interlayer insulator film is a first interlayer insulator film, the buried electrode is a first buried electrode, the collector electrode is a first collector electrode, and the emitter electrode is a first emitter electrode, the semiconductor structure further comprising a planar p-channel MOSFET, formed in the second element-forming region, for controlling the semiconductor device formed in the first element-forming region; and a planar n-channel MOSFET, formed in the third element-forming region, for controlling the semiconductor device formed in the first element-forming region.

12. A semiconductor structure according to claim 1, further comprising:

an insulation layer, the silicon semiconductor layer layered on the insulation layer; and a trench isolation region dividing the silicon semiconductor layer into a plurality of element-forming regions, including first and second element-forming regions, the trench isolation region including an isolation trench penetrating through the semiconductor layer and an insulator film formed on an inner wall of the isolation trench so as to isolate the element-forming regions from each other by dielectric isolation;

wherein the device trench is a first device trench formed in the first element-forming region, the semiconductor device is a first semiconductor device, the collector region is a first collector region, the emitter region is a first collector region, the base region is a first base region, the drift region is a first drift region, the gate insulator film is a first gate insulator film, the gate electrode is a first gate electrode, the interlayer insulator film is a first interlayer insulator film, the buried electrode is a first buried electrode, the collector electrode is a first collector electrode, and the emitter electrode is a first emitter electrode, the semiconductor structure further comprising a planar p-channel MOSFET, formed in the second element-forming region, for controlling the semiconductor device formed in the first element-forming region; and a planar n-channel MOSFET, formed in the third element-forming region, for controlling the semiconductor device formed in the first element-forming region.

13. A semiconductor structure, comprising:

a semiconductor layer having a trench formed therein and having a surface;

a semiconductor device formed in the semiconductor layer, including an emitter region of a second conductivity type provided on the underside of a bottom of the trench;

a collector region of a first conductivity type provided on an outside of the trench in the surface layer of the semiconductor layer, the first conductivity type being different than the second conductivity type;

a base region of the first conductivity type provided between the emitter region and the collector region;

a drift region of the second conductivity type provided between the base region and the collector region;

a gate insulator film provided inside the trench;

a gate electrode provided inside the gate insulator film;

an interlayer insulator film provided inside the gate electrode;

a buried electrode provided inside the interlayer insulator film and electrically connected to the emitter region at the bottom of the trench;

an emitter electrode electrically connected to the buried electrode; and a collector electrode electrically connected to the collector region.

14. The semiconductor structure as claimed in claim 13, wherein the semiconductor layer is made of a silicon semiconductor layered on an insulation layer.

15. The semiconductor structure as claimed in claim 13, wherein the semiconductor device is formed in an element-forming region of the semiconductor layer, further comprising a trench isolation region in the semiconductor layer isolating the semiconductor device from surroundings, including an isolation trench and an insulator film formed on an inner wall thereof, the isolation trench penetrating through the semiconductor layer.

16. The semiconductor structure as claimed in claim 13, wherein the semiconductor device further comprises a buffer region of the second conductivity type surrounding the collector region.

17. A semiconductor structure as claimed in claim 13, further comprising an insulator film in an upper half section of the device trench, the insulator film thicker than the gate insulator film.

18. A semiconductor structure according to claim 13, further comprising:

an insulation layer, the silicon semiconductor layer layered on the insulation layer; and a trench isolation region dividing the silicon semiconductor layer into a plurality of element-forming regions, including first and second element-forming regions, the trench isolation region including an isolation trench penetrating through the semiconductor layer and an insulator film formed on an inner wall of the isolation trench so as to isolate the element-forming regions from each other by dielectric isolation;

wherein the device trench is a first device trench formed in the first element-forming region, the semiconductor device is a first semiconductor device formed in the first element-forming region, the collector region is a first collector region, the emitter region is a first collector region, the base region is a first base region, the drift region is a first drift region, the gate insulator film is a first gate insulator film, the gate electrode is a first gate electrode, the interlayer insulator film is a first interlayer insulator film, the buried electrode is a first buried electrode, the collector electrode is a first collector electrode, and the emitter electrode is a first emitter electrode, the semiconductor structure further comprising a second device trench in the second element-forming region; and a second semiconductor device in the second element-forming region, including
- a second emitter region of the first conductivity type provided on the underside of a bottom of the second device trench,
- a second collector region of a second conductivity type provided on an outside of the second device trench in the surface layer of the semiconductor layer,
- a second base region of the second conductivity type provided between the second emitter region and the second collector region,
- a second drift region of the first conductivity type provided between the second base region and the second collector region,
- a second gate insulator film provided inside the second device trench,
- a second gate electrode provided inside the second gate insulator film,
- a second interlayer insulator film provided inside the second gate electrode,
- a second buried electrode provided inside the second interlayer insulator film and electrically connected to the second emitter region at the bottom of the second device trench,
- a second emitter electrode electrically connected to the second buried electrode, and
- a second collector electrode electrically connected to the second collector region.

19. A semiconductor structure according to claim 13, further comprising:

an insulation layer, the silicon semiconductor layer layered on the insulation layer; and a trench isolation region dividing the silicon semiconductor layer into a plurality of element-forming regions, including first and second element-forming regions, the trench isolation region including an isolation trench penetrating through the semiconductor layer and an insulator film formed on an inner wall of the isolation trench so as to isolate the element-forming regions from each other by dielectric isolation;

wherein the device trench is a first device trench formed in the first element-forming region, the semiconductor device is a first semiconductor device, the collector region is a first collector region, the emitter region is a first collector region, the base region is a first base region, the drift region is a first drift region, the gate insulator film is a first gate insulator film, the gate electrode is a first gate electrode, the interlayer insulator film is a first interlayer insulator film, the buried electrode is a first buried electrode, the collector electrode is a first collector electrode, and the emitter electrode is a first emitter electrode, the semiconductor structure further comprising one of a planar p-channel MOSFET and a planar n-channel MOSFET, formed in the second element-forming region, for controlling the first semiconductor device formed in the first element-forming region.

20. A semiconductor structure according to claim 13, further comprising:

an insulation layer, the silicon semiconductor layer layered on the insulation layer; and a trench isolation region dividing the silicon semiconductor layer into a plurality of element-forming regions, including first and second element-forming regions, the trench isolation region including an isolation trench penetrating through the semiconductor layer and an insulator film formed on an inner wall of the isolation trench so as to isolate the element-forming regions from each other by dielectric isolation;

wherein the device trench is a first device trench formed in the first element-forming region, the semiconductor device is a first semiconductor device, the collector region is a first collector region, the emitter region is a first collector region, the base region is a first base region, the drift region is a first drift region, the gate insulator film is a first gate insulator film, the gate electrode is a first gate electrode, the interlayer insulator film is a first interlayer insulator film, the buried electrode is a first buried electrode, the collector electrode is a first collector electrode, and the emitter electrode is a first emitter electrode, the semiconductor structure further comprising both a planar p-channel MOSFET and a planar n-channel MOSFET, formed in the second element-forming region, for controlling the first semiconductor device formed in the first element-forming region.

* * * * *

UNITED STATES PATENT AND TRADEMARK OFFICE
CERTIFICATE OF CORRECTION

| | | |
|---|---|---|
| PATENT NO. | : 7,109,551 B2 | |
| APPLICATION NO. | : 10/927434 | |
| DATED | : September 19, 2006 | |
| INVENTOR(S) | : Akio Sugi et al. | |

It is certified that error appears in the above-identified patent and that said Letters Patent is hereby corrected as shown below:

IN THE CLAIMS:

Claim 6, column 24, lines 12-13, change "the emitter region is a first collector region," to -- the emitter region is a first emitter region, --;

Claim 7, column 24, line 65 to column 25, line 1, change "the emitter region is a first collector region," to -- the emitter region is a first emitter region, --;

Claim 8, column 25, lines 56-57, change "the emitter region is a first collector region," to -- the emitter region is a first emitter region, --;

Claim 9, column 26, lines 44-45, change "the emitter region is a first collector region," to -- the emitter region is a first emitter region, --;

Claim 10, column 27, lines 6-7, change "the emitter region is a first collector region," to -- the emitter region is a first emitter region, --;

Claim 11, column 27, line 20, change "claim 1," to -- claim 13, --;

Claim 11, column 27, lines 35-36, change "the emitter region is a first collector region," to -- the emitter region is a first emitter region, --;

Claim 12, column 28, lines 1-2, change "the emitter region is a first collector region," to -- the emitter region is a first emitter region, --;

Claim 18, column 29, lines 13-14, change "the emitter region is a first collector region," to -- the emitter region is a first emitter region, --;

UNITED STATES PATENT AND TRADEMARK OFFICE
CERTIFICATE OF CORRECTION

PATENT NO. : 7,109,551 B2
APPLICATION NO. : 10/927434
DATED : September 19, 2006
INVENTOR(S) : Akio Sugi et al.

It is certified that error appears in the above-identified patent and that said Letters Patent is hereby corrected as shown below:

Claim 19, column 30, lines 12-13, change "the emitter region is a first collector region," to -- the emitter region is a first emitter region, --;

Claim 20, column 30, lines 41-42, change "the emitter region is a first collector region," to -- the emitter region is a first emitter region, --.

Signed and Sealed this

Twenty-fifth Day of March, 2008

JON W. DUDAS
*Director of the United States Patent and Trademark Office*